US012720919B2

(12) United States Patent
Basrur et al.

(10) Patent No.: US 12,720,919 B2
(45) Date of Patent: Aug. 25, 2026

(54) DISPLAY DEVICE

(71) Applicant: Samsung Display Co., LTD., Yongin-si (KR)

(72) Inventors: Veidhes Basrur, Yongin-si (KR); Hyun Wook Lee, Suwon-si (KR); Hee Keun Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 864 days.

(21) Appl. No.: 17/979,888

(22) Filed: Nov. 3, 2022

(65) Prior Publication Data

US 2023/0145007 A1 May 11, 2023

(30) Foreign Application Priority Data

Nov. 11, 2021 (KR) ........................ 10-2021-0154706

(51) Int. Cl.

| | |
|---|---|
| ***H10H 20/831*** | (2025.01) |
| ***H10H 20/857*** | (2025.01) |
| ***H10W 90/00*** | (2026.01) |

(52) U.S. Cl.

CPC .... *H10H 20/8312* (2025.01); *H10H 20/8316* (2025.01); *H10H 20/857* (2025.01); *H10W 90/00* (2026.01)

(58) Field of Classification Search

CPC ............. H10H 20/8316; H10H 20/857; H10H 29/857; H10H 29/49; H10H 29/922; H10H 29/942; H10H 20/8312; H01L 25/0753; H20W 90/10; H10W 90/15; H10W 90/155; H10W 90/00

See application file for complete search history.

(56) References Cited

U.S. PATENT DOCUMENTS

| | | | | |
|---|---|---|---|---|
| 11,670,737 | B2 | 6/2023 | Yang et al. | |
| 11,870,024 | B2 | 1/2024 | Li et al. | |
| 12,033,993 | B2 | 7/2024 | Yang et al. | |
| 2022/0231080 | A1 * | 7/2022 | Li | H10H 20/831 |

(Continued)

FOREIGN PATENT DOCUMENTS

| | | |
|---|---|---|
| KR | 10-2020-0017013 | 2/2020 |
| KR | 10-2020-0034896 | 4/2020 |
| KR | 10-2020-0066438 | 6/2020 |

(Continued)

*Primary Examiner* — Latanya N Crawford Eason

(74) *Attorney, Agent, or Firm* — Womble Bond Dickinson (US) LLP

(57) ABSTRACT

A display device includes first electrodes comprising a first sub-electrode and a second sub-electrode, a first insulating layer comprising openings partially exposing upper surfaces of the first electrodes, second electrodes disposed on the first insulating layer and overlapping the first electrodes in a plan view, light emitting elements disposed on the first electrodes and comprising first light emitting elements and second light emitting elements, first connection electrodes to contact first ends of the light emitting elements and the first electrodes, a second insulating layer to surround the light emitting elements, and second connection electrodes. The first connection electrodes include a first electrode part and a second electrode part. The second connection electrodes include a third electrode part and a fourth electrode part.

20 Claims, 28 Drawing Sheets

ED: ED1, ED2

(56) References Cited

U.S. PATENT DOCUMENTS

| | | | |
|---|---|---|---|
| 2022/0406759 | A1 | 12/2022 | Kim |
| 2023/0155059 | A1 | 5/2023 | Lee et al. |

FOREIGN PATENT DOCUMENTS

| | | | |
|---|---|---|---|
| KR | 10-2020-0124799 | | 11/2020 |
| KR | 10-2021-0008252 | | 1/2021 |
| KR | 10-2021-0022799 | | 3/2021 |
| KR | 10-2021-0055829 | | 5/2021 |
| KR | 10-2021-0104392 | A | 8/2021 |
| KR | 10-2021-0132278 | | 11/2021 |

* cited by examiner

BNL
CN5
E2
ED2
OP1
PAS2
ED1
CN4
E2
BNL
IP2(PAS1)
IP1(PAS1)
VIA
CTS
E1(SE2)
CN2
CTE
CN1
E1(SE1)
CTD
PV1
IL1
GI
BL
SUB
N1'
N1
VL2
D2
ACT2
G2
S2
T2
VL1
D1
ACT1
G1
S1
T1
BML
CDP1
ED: ED1, ED2

VIA
PV1
IL1
GI
BL
SUB
VL2
BNL
CTS
IP2(PAS1)
E1(SE2)
E2
ED
D2
ACT2
G2
S2
T2
VL1
D1
ACT1
G1
S1
T1
BML
IP1(PAS1)
E1(SE1)
CTD
CDP1

VIA
PV1
IL1
GI
BL
SUB
VL2
BNL
CTS
D2
ACT2
G2
S2
T2
IP2(PAS1)
E2
E1(SE2)
ED
CN2
CTE
PAS2
VL1
D1
ACT1
G1
S1
T1
CN1
BML
IP1(PAS1)
E1(SE1)
CDP1
CTD

EMG
EMG1
EMG2
PX
OP2
E1
ED1
CTD
E2
OP1
E1
ED2
E2
OP3
N3
BNL
EMA
N3'
CNE1
CNE2
CNE1
CTE
CNE1
CNE2
CTS
CNE1

ED: ED1, ED2
OP: OP1, OP2, OP3
CNE: CNE1, CNE2

ED: ED1, ED2
OP: OP1, OP2, OP3
CNE: CNE1, CNE2
CNE1: CN1, CN2, CN3_1
CNE2: CN4, CN5

VIA
PV1
IL1
GI
BL
SUB
N4'
VL2
BNL
CN5
E2
IP2(PAS1)
SE2(E1)
CTS
D2
ACT2
G2
S2
T2
ED2
OP1
CN2
CTE
PAS2
VL1
ED1
CN1
D1
ACT1
G1
S1
T1
BML
CN4
E2
IP1(PAS1)
SE1(E1)
CDP1
ED1
OP2_1
CN3_1
PAS2
BNL
PAS1
CTD
N4
DR3

ED: ED1, ED2
OP: OP1, OP2_1, OP3
CNE1: CN1, CN2, CN3_1
CNE2: CN4, CN5

EMG: EMG1, EMG2, EMG3, EMG4
CNE1: CN1, CN2, CN3
CNE2: CN4, CN5
CNE3: CN6, CN7, CN8
CNE4: CN9, CN10

EMG: EMG1, EMG2, EMG3, EMG4
CNE1: CN1, CN2, CN3
CNE2: CN4, CN5
CNE3: CN6, CN7, CN8
CNE4: CN9, CN10

CNE1: CN1, CN2
CNE2: CN4, CN5

DISPLAY DEVICE

CROSS REFERENCE TO RELATED APPLICATION(S)

This application claims priority to and benefits of Korean Patent Application No. 10-2021-0154706 under 35 U.S.C. § 119, filed on Nov. 11, 2021, in the Korean Intellectual Property Office (KIPO), the disclosure of which is incorporated by reference herein in its entirety.

BACKGROUND

1. Technical Field

The disclosure relates to a display device.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material as a light emitting element or an inorganic light emitting display using an inorganic material as a light emitting material.

SUMMARY

Aspects of the disclosure provide a display device which includes an increased number of light emitting elements per unit area by disposing the light emitting elements in a direction not parallel to a substrate.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include a plurality of first electrodes comprising a first sub-electrode and a second sub-electrode spaced apart from each other on a substrate, a first insulating layer disposed on the substrate and comprising openings partially exposing upper surfaces of the plurality of first electrodes, a plurality of second electrodes disposed on the first insulating layer and overlapping the plurality of first electrodes in a plan view, a plurality of light emitting elements disposed on the plurality of first electrodes in the openings, and comprising first light emitting elements and second light emitting elements, a plurality of first connection electrodes disposed in the openings to contact first ends of the plurality of light emitting elements and the plurality of first electrodes, a second insulating layer disposed in the openings to surround the plurality of light emitting elements, and a plurality of second connection electrodes disposed on the plurality of second electrodes and the second insulating layer to contact the plurality of second electrodes and second ends of the plurality of light emitting elements. The plurality of first connection electrodes may include a first electrode part contacting the first light emitting elements disposed on the first sub-electrode and a second electrode part contacting the second light emitting elements disposed on the second sub-electrode, and the plurality of second connection electrodes may include a third electrode part contacting the first light emitting elements and the second electrode part through a first contact hole penetrating the second insulating layer and a fourth electrode part contacting the second light emitting elements.

The openings may include a first opening partially overlapping the first sub-electrode and the second sub-electrode in a plan view, and the first contact hole may be disposed in the first opening.

The openings may further include a second opening spaced apart from the first opening and partially overlapping the first sub-electrode in a plan view, and a third opening spaced apart from the first opening and partially overlapping the second sub-electrode in a plan view. Part of the first light emitting elements may be disposed in the first opening and other part of the first light emitting elements may be disposed in the second opening, and part of the second light emitting elements may be disposed in the first opening and other part of the second light emitting elements may be disposed in the third opening.

The plurality of first connection electrodes may further include a plurality of fifth electrode parts. Part of the plurality of fifth electrode parts may be disposed in the second opening and other part of the plurality of fifth electrode parts may be disposed in the third opening to contact the first ends of the plurality of light emitting elements.

The first electrode part may be disposed on the first sub-electrode in the first opening. The second electrode part may be disposed on the second sub-electrode in the first opening. A width of the second electrode part may be a greater than a width of the first electrode part, and a part of the second electrode part may be disposed in an area between the first sub-electrode and the second sub-electrode.

The plurality of first electrode part and the plurality of second electrode may be spaced apart from each other under the second insulating layer, and the third electrode part and the fourth electrode part may be spaced part from each other on the second insulating layer.

The first insulating layer may be located between the first opening and the second opening and between the first opening and the third opening. The first insulating layer may include a plurality of insulating pattern parts. The plurality of insulating pattern parts may be disposed between the plurality of first electrodes and the plurality of second electrodes.

The plurality of light emitting elements may extend in one direction, and side surfaces of the plurality of light emitting elements may be in contact with side surfaces of the plurality of insulating pattern parts.

Each of the plurality of light emitting elements may include a first semiconductor layer, a second semiconductor layer disposed on the first semiconductor layer, a light emitting layer disposed between the first semiconductor layer and the second semiconductor layer, and an insulating film surrounding an outer surface of at least the light emitting layer. A length of each of the plurality of light emitting elements may be greater than a length of the insulating film.

A length of each of the plurality of light emitting elements may be smaller than a thickness of the first insulating layer, and the length of each of the plurality of light emitting elements may be greater than a thickness of the second insulating layer.

The display device may further include a via layer disposed between the substrate and the plurality of first electrodes, a conductive pattern, and a voltage line. The conductive pattern and the voltage line may be disposed between the via layer and the substrate. The first sub-electrode may contact the conductive pattern through a second contact hole penetrating the via layer, and the fourth electrode part may contact the voltage line through a third contact hole penetrating the via layer.

The display device may further include a bank layer disposed on the first insulating layer and surrounding the plurality of light emitting elements. The second contact hole and the third contact hole may be disposed outside of the bank layer.

A part of the fourth electrode part may be disposed on the bank layer.

According to an embodiment of the disclosure, a display device may include a plurality of pixels arranged in a first direction and a second direction intersecting the first direction, a plurality of first electrodes comprising a plurality of sub-electrodes spaced apart from each other in each of the plurality of pixels, a first insulating layer comprising a plurality of openings partially overlapping the plurality of first electrodes in a plan view, a plurality of second electrodes disposed on the first insulating layer to overlap the plurality of first electrodes in a plan view, a plurality of light emitting elements disposed in the plurality of openings and disposed along at least one side of each of the plurality of second electrodes, and including first light emitting elements and second light emitting elements, a plurality of first connection electrodes, each of the plurality of first connection electrodes being partially disposed on each of the plurality of first electrodes in each of the plurality of openings and contacting each of the plurality of light emitting elements, and a plurality of second connection electrodes disposed on the plurality of second electrodes and covering some of the plurality of light emitting elements The plurality of openings may include a first opening partially overlapping the plurality of first electrodes in a plan view. The plurality of first connection electrodes may include a first electrode part disposed on a first sub-electrode in the first opening and a second electrode part disposed on a second sub-electrode in the first opening The second connection electrodes may include a third electrode part covering the plurality of second electrode disposed on the first sub-electrode and the first light emitting elements and a fourth electrode part covering the plurality of second electrode disposed on the second sub-electrode and the second light emitting elements The third electrode part and the second electrode part may contact each other in the first opening.

The plurality of openings may further include a second opening spaced apart from the first opening, the plurality of second electrode being disposed between the first opening and the second opening, and a third opening spaced apart from the first opening, the plurality of second electrode being disposed between the first opening and the third opening. The first light emitting elements may be disposed in the first opening and the second opening, and the second light emitting elements may be disposed in the first opening and the third opening.

The first opening, the second opening, and the third opening may extend in the first direction. A width of the first opening measured in the second direction may be greater than a width of the second opening in the second direction and a width of the third opening in the second direction. The first light emitting elements may be disposed adjacent to a side of the plurality of second electrode. The second light emitting elements may be disposed adjacent to another side of the plurality of second electrodes.

A distance between the plurality of first electrodes may be smaller than a distance between the plurality of second electrodes.

Each of the plurality of first electrodes and plurality of second electrodes may extend in a diagonal direction between the first direction and the second direction, and the plurality of light emitting elements may be arranged in the diagonal direction.

Each of the plurality of first electrodes and the plurality of second electrodes may protrude from a center to both sides in the first direction and to both sides in the second direction. The plurality of openings may include main holes surrounding the plurality of second electrodes and hole connection parts connecting the main holes. The third electrode part and the second electrode part may partially overlap each other in a plan view in the hole connection parts.

Each of the plurality of first electrodes and the plurality of second electrodes may include sides extending in the first direction and the second direction. The plurality of openings may surround the plurality of second electrodes. The plurality of light emitting elements may surround the sides of each of the plurality of second electrodes.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Hereinafter, embodiments will be described with reference to the attached drawings.

Figure 1:
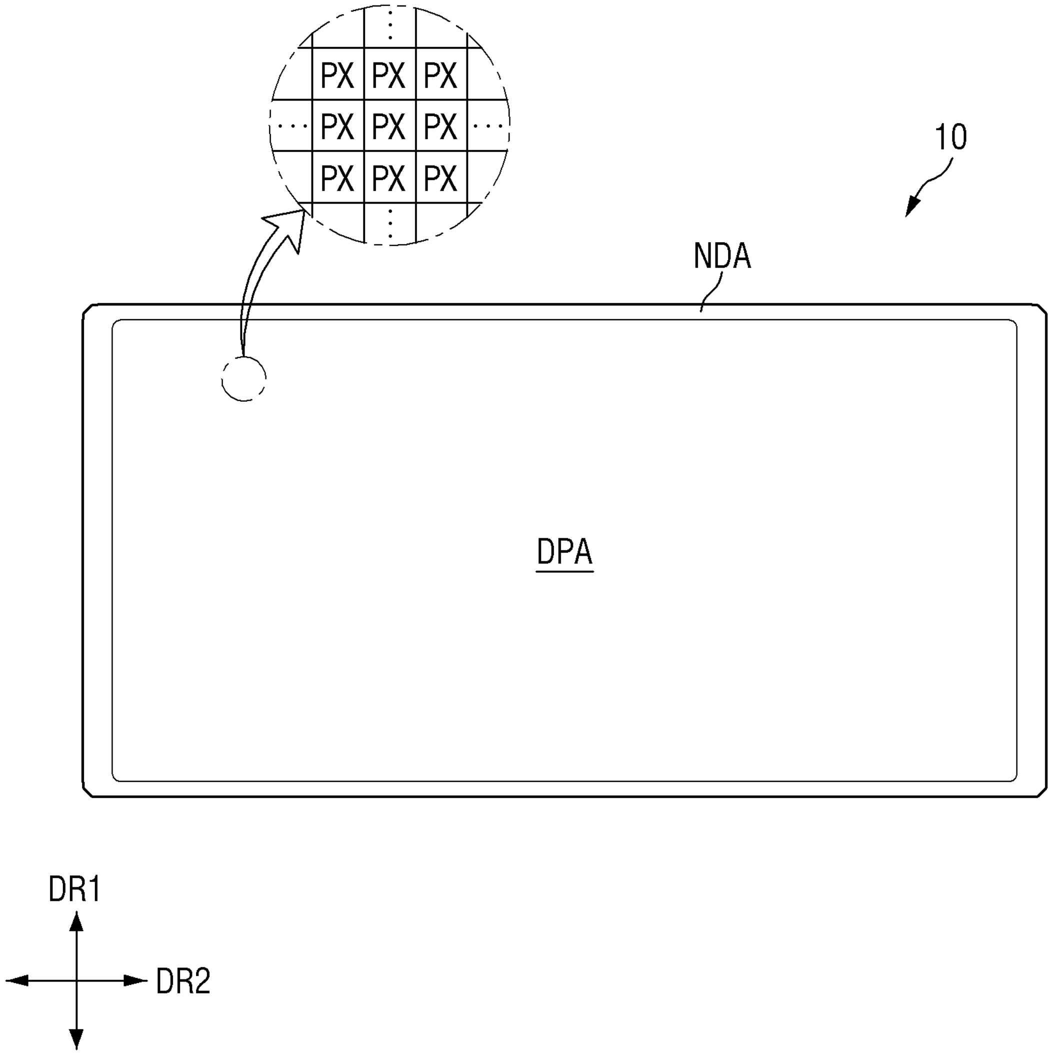
FIG. 1 is a schematic plan view of a display device according to an embodiment.

FIG. 1 is a schematic plan view of a display device 10 according to an embodiment.

Referring to FIG. 1, the display device 10 may display moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head-mounted displays, mobile communication terminals, electronic notebooks, electronic books, portable multimedia players (PMPs), navigation devices, game machines, digital cameras and camcorders, all of which provides a display screen.

The display device 10 may include a display panel that provides a display screen. Examples of the display panel may include inorganic light emitting diode display panels, organic light emitting display panels, quantum dot light emitting display panels, plasma display panels, and field emission display panels. It will be described where an inorganic light emitting diode display panel is applied as an example of the display panel, but the disclosure is not limited to this case, and other display panels may also be applied as long as the same technical spirit is applicable.

The shape of the display device 10 may be variously modified. For example, the display device 10 may have various shapes such as a horizontally long rectangle, a vertically long rectangle, a square, a quadrangle with rounded corners (vertices), other polygons, and a circle. The shape of a display area DPA of the display device 10 may also be similar to the overall shape of the display device 10. In FIG. 1, the display device 10 with a rectangular shape that is long in a second direction DR2 is illustrated.

The display device 10 may include a display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DPA may generally occupy the center of the display device 10.

The display area DPA may include multiple pixels PX. The pixels PX may be arranged in matrix. Each of the pixels PX may be rectangular or square in a plan view. However, the disclosure is not limited thereto, and each of the pixels PX may also have a rhombus shape having each side inclined with respect to a direction. The pixels PX may be arranged in a stripe type or an island type. Each of the pixels PX may display a specific color by including one or more light emitting elements which emit light of a specific wavelength band.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers electrically connected to the display device 10 may be disposed, or external devices may be mounted.

Figure 2:
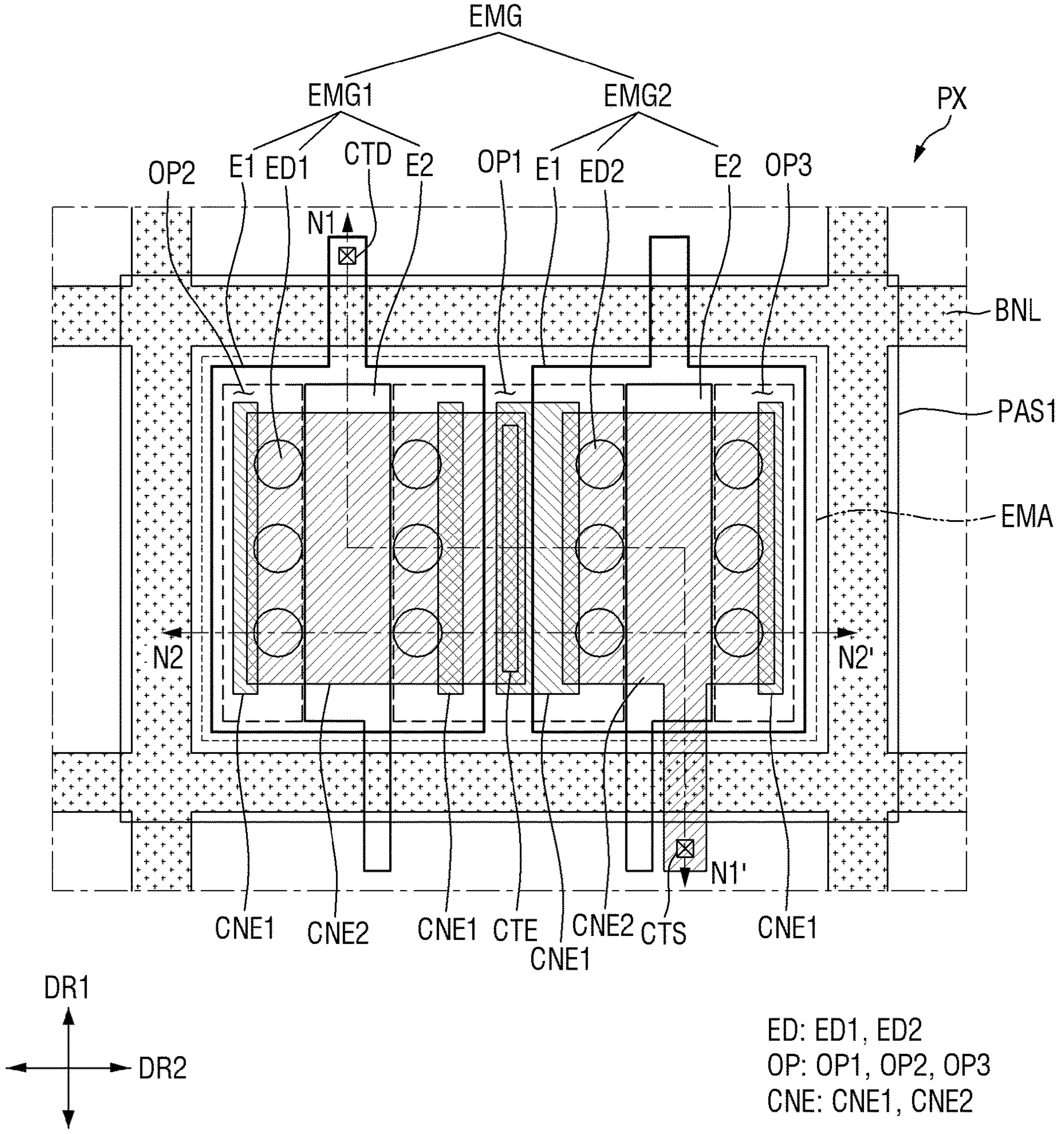
FIG. 2 is a plan view of a pixel of the display device according to an embodiment.

FIG. 2 is a plan view of a pixel PX of the display device 10 according to an embodiment.

Referring to FIG. 2, each of the pixels PX of the display device 10 may include multiple light emitting elements ED to emit light of a specific color. Although only one pixel PX is illustrated in the drawing, the disclosure is not limited thereto. In the display device 10, multiple pixels PX may constitute a group to be repeatedly disposed. For example, in the display device 10, a group of two to four pixels PX may be repeatedly disposed, and the two to four pixels PX may emit light of different colors or the same color. For example, each of the pixels PX may emit blue light, but the disclosure is not limited thereto. Multiple pixels PX forming one group may emit light of the same color or may emit light of different colors.

Each pixel PX of the display device 10 may include an emission area EMA and a non-emission area. The emission area EMA may be an area in which the light emitting elements ED are disposed to emit light of a specific wavelength band. The non-emission area may be an area in which the light emitting elements ED are not disposed and from which no light is output because light emitted from the light emitting elements ED does not reach this area. The emission area EMA may include an area in which the light emitting elements ED are disposed and an area which is adjacent to the light emitting elements ED and from which light emitted from the light emitting elements ED is output. However, the disclosure is not limited thereto, and the emission area EMA may also include an area from which light emitted from the light emitting elements ED is output after being reflected or refracted by other members.

The display device 10 according to the embodiment may include multiple electrodes E1 and E2, light emitting elements ED, and connection electrodes CNE1 through CNE4 disposed in each pixel PX. The display device 10 may also include a first insulating layer PAS1 disposed in each pixel PX in the entire display area DPA, a second insulating layer PAS2 (see FIG. 6) disposed in openings OP1 through OP3 of the first insulating layer PAS1 in each pixel PX, and a bank layer BNL disposed between the pixels PX in the entire display area DPA.

The electrodes E1 and E2 may include electrodes (e.g., first electrodes E1) disposed under the first insulating layer PAS1 and electrodes (e.g., second electrodes E2) disposed on the first insulating layer PAS1. Electrodes disposed on the same layer with respect to the first insulating layer PAS1 may be spaced apart from each other in the second direction DR2. The electrodes disposed under the first insulating layer PAS1 and the electrodes disposed on the first insulating layer PAS1 may overlap each other in a thickness direction.

The light emitting elements ED (ED1 and ED2) may be disposed in the openings OP (OP1 through OP3) of the first insulating layer PAS1 and may be disposed adjacent to a pair of the electrodes E1 and E2 overlapping each other with the first insulating layer PAS1 interposed between them. A pair of the electrodes E1 and E2 overlapping each other with the first insulating layer PAS1 interposed between them and the light emitting elements ED disposed adjacent to the pair of the electrodes E1 and E2 may form one emission group EMG (EMG1 or EMG2), and multiple emission groups EMG may be disposed in each pixel PX. Each of the emission groups EMG may be electrically connected to a conductive layer thereunder or another emission group EMG through multiple connection electrodes CNE (CNE1 through CNE4).

The bank layer BNL may include a part extending in a first direction DR1 and the second direction DR2 in a plan view to form a grid pattern in the entire display area DPA. The bank layer BNL may be disposed at the boundary of each pixel PX to separate neighboring pixels PX and may surround the emission area EMA disposed in each pixel PX. The structure of each pixel PX of the display device 10 will now be described in more detail with further reference to other drawings.

Figure 3:
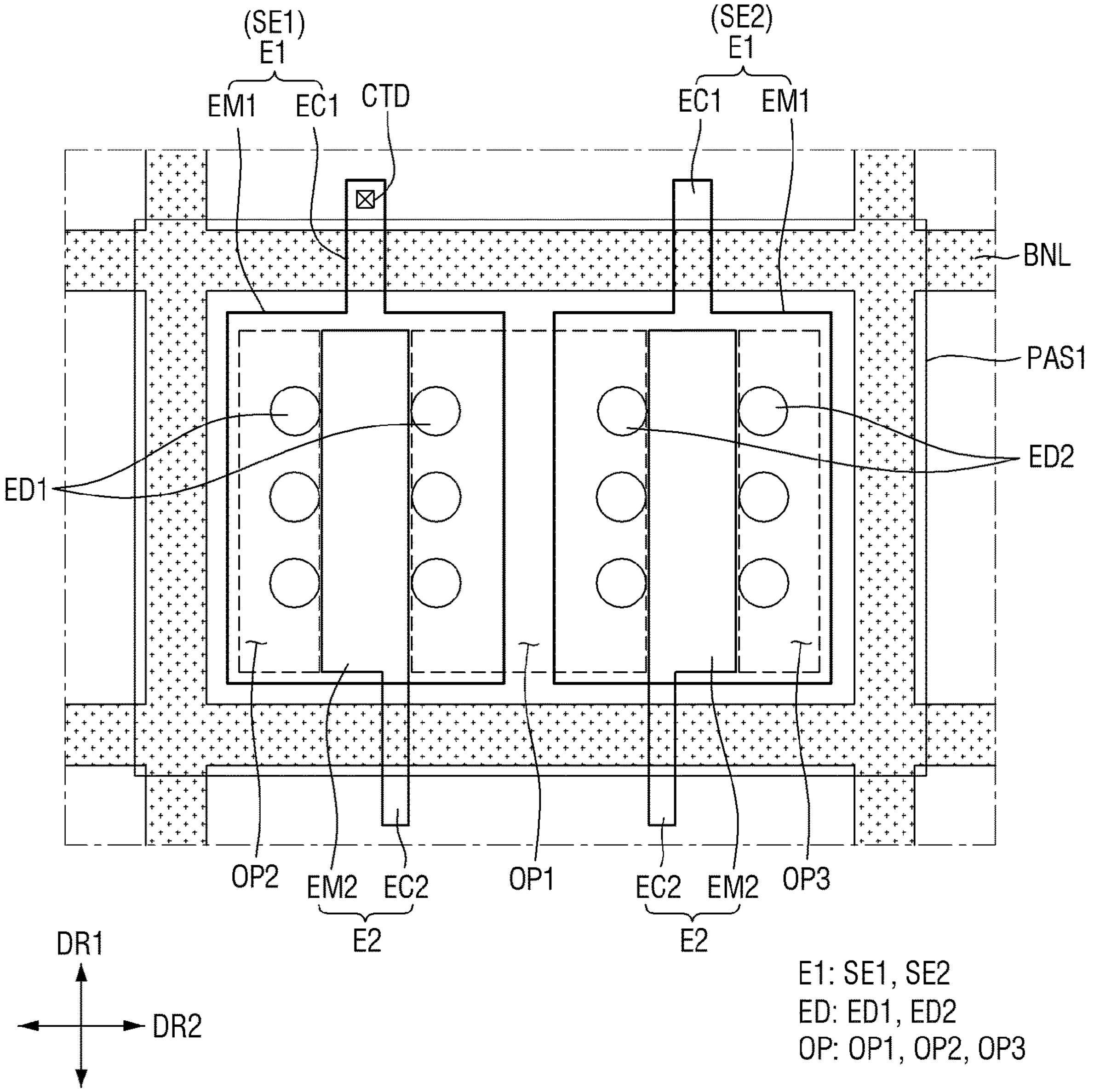
FIG. 3 is a plan view illustrating the relative arrangement of electrodes and light emitting elements in the pixel of FIG. 2.
Figure 4:
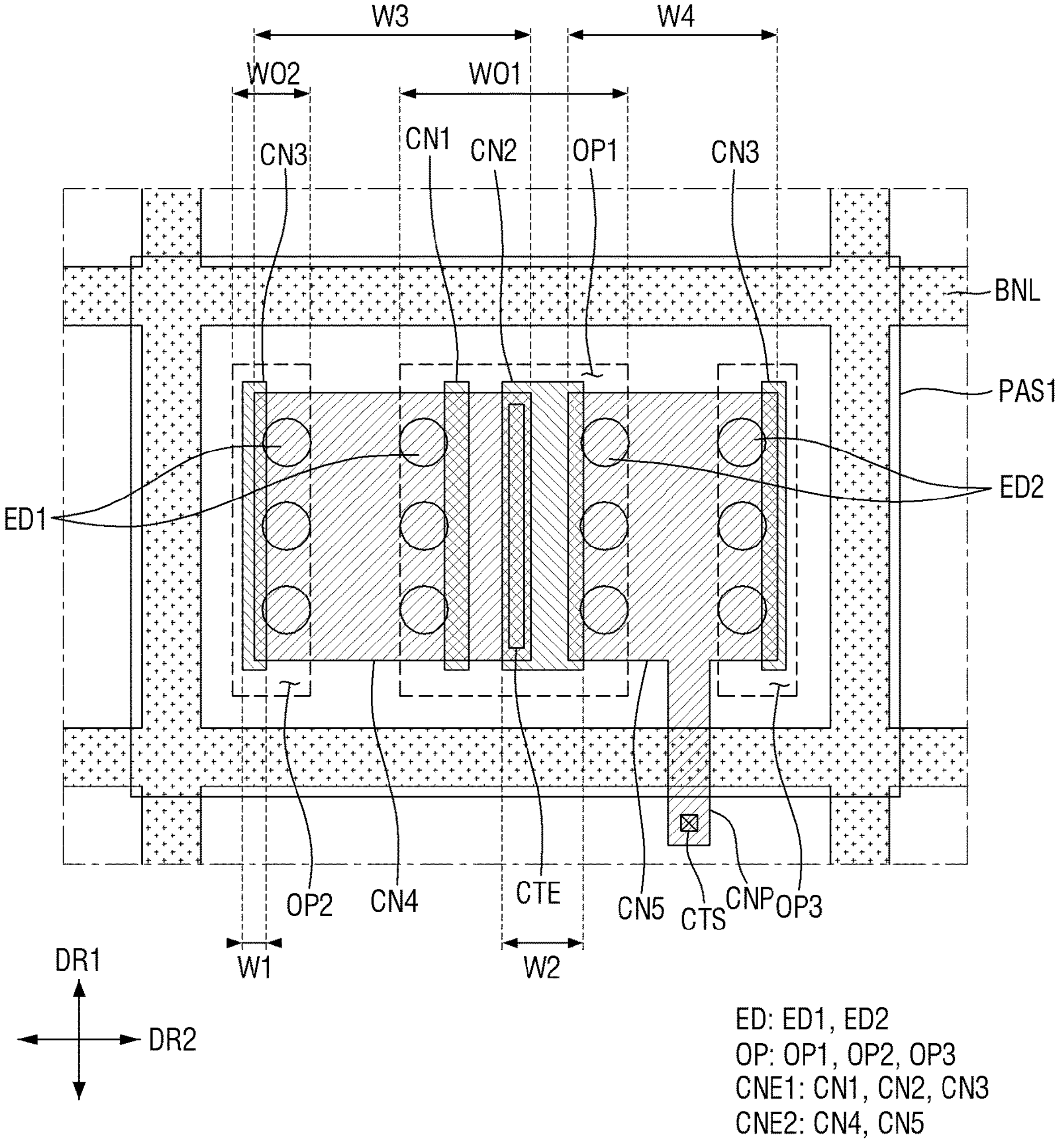
FIG. 4 is a plan view illustrating the relative arrangement of connection electrodes and the light emitting elements in the pixel of FIG. 2.
Figure 5:
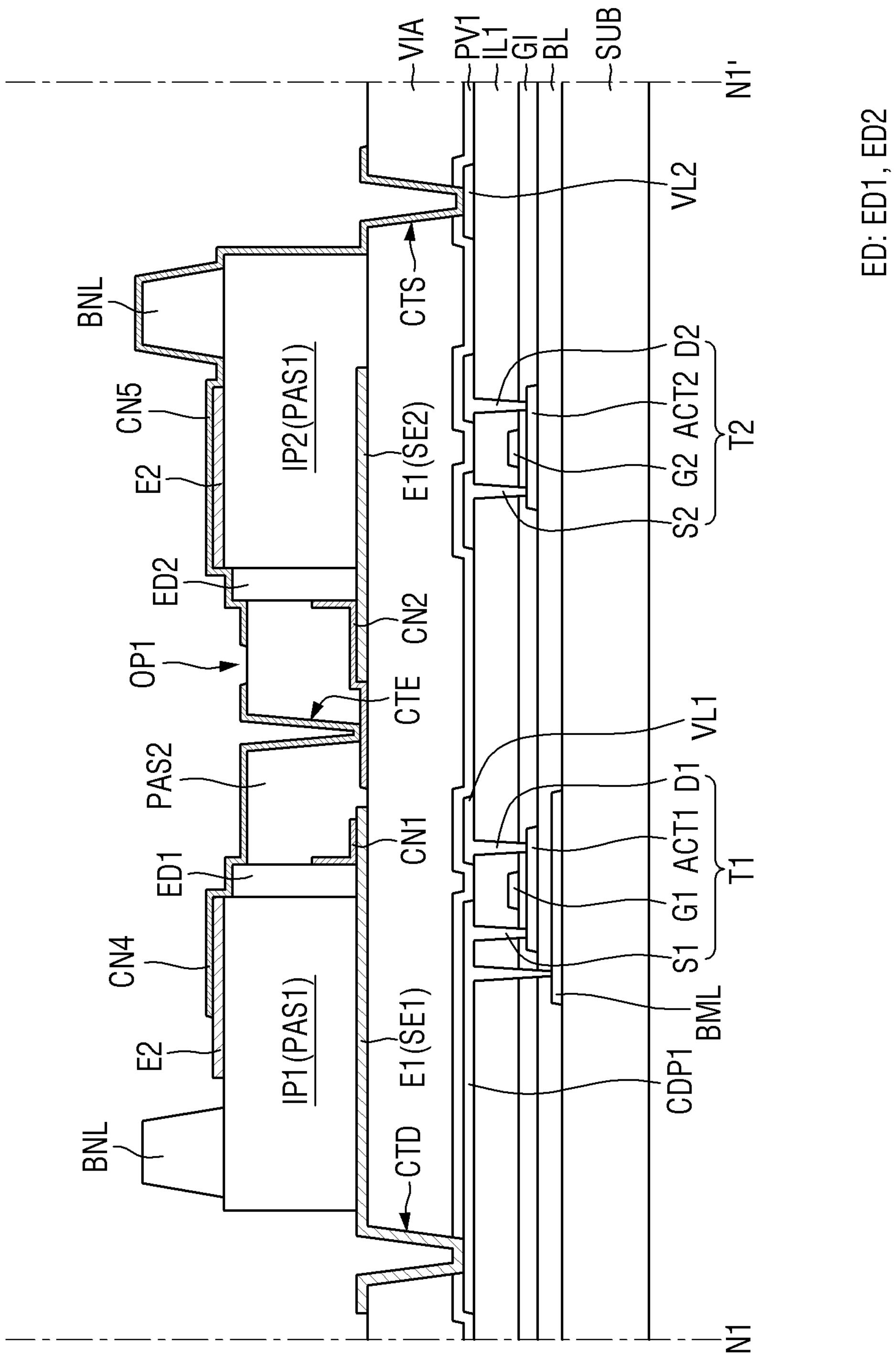
FIG. 5 is a schematic cross-sectional view taken along line N1-N1' of FIG. 2.
Figure 6:
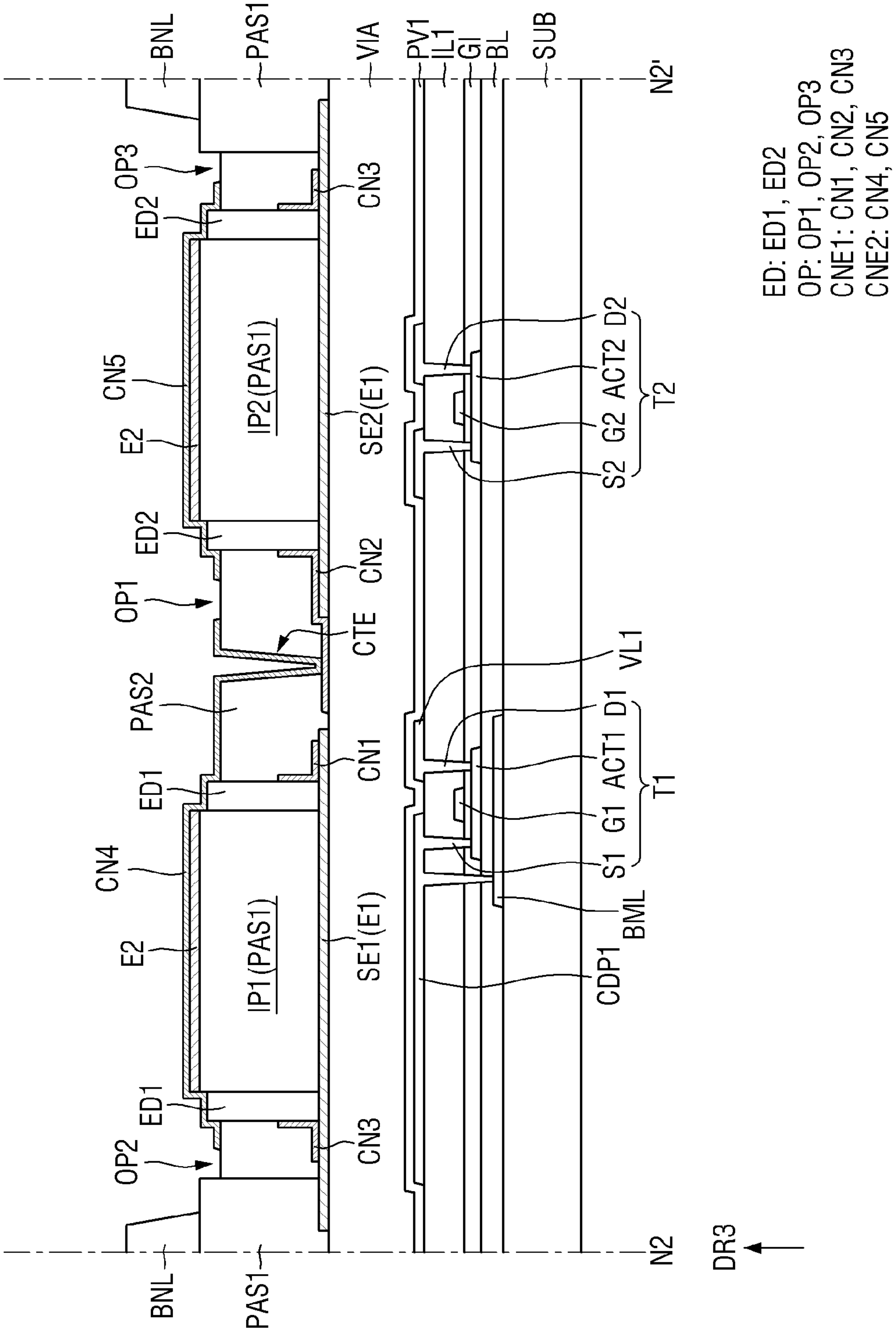
FIG. 6 is a schematic cross-sectional view taken along line N2-N2' of FIG. 2.

FIG. 3 is a plan view illustrating the relative arrangement of the electrodes E1 and E2 and the light emitting elements ED in the pixel PX of FIG. 2. FIG. 4 is a plan view illustrating the relative arrangement of the connection electrodes CNE and the light emitting elements ED in the pixel PX of FIG. 2. FIG. 5 is a schematic cross-sectional view taken along line N1-N1' of FIG. 2. FIG. 6 is a schematic cross-sectional view taken along line N2-N2' of FIG. 2. FIG. 5 illustrates a cross section across the light emitting elements ED included in different emission groups EMG as well as a first contact hole CTD and a third contact hole CTS. FIG. 6 illustrates a cross section taken across the light emitting elements ED and the electrodes E1 and E2 disposed in the pixel PX in the second direction DR2.

Referring to FIGS. 3 through 6 in conjunction with FIG. 2, the display device 10 may include a first substrate SUB and a semiconductor layer, multiple conductive layers and multiple insulating layers disposed on the first substrate SUB. The semiconductor layer, the conductive layers, and the insulating layers may constitute a circuit layer and a display element layer of the display device 10.

Specifically, the first substrate SUB may be an insulating substrate. The first substrate SUB may be made of an insulating material such as glass, quartz, or polymer resin. The first substrate SUB may be a rigid substrate, but may also be a flexible substrate that can be bent, folded, rolled, etc.

A first conductive layer may be disposed on the first substrate SUB. The first conductive layer may include a bottom metal layer BML, and the bottom metal layer BML may overlap a first active layer ACT1 of a first transistor T1. The bottom metal layer BML may prevent light from entering the first active layer ACT1 of the first transistor T1 or may be electrically connected to the first active layer ACT1 to stabilize electrical characteristics of the first transistor T1. However, the bottom metal layer BML may be omitted.

A buffer layer BL may be disposed on the bottom metal layer BML and the first substrate SUB. The buffer layer BL may be formed on the first substrate SUB to protect transistors of the pixel PX from moisture introduced through the first substrate SUB which is vulnerable to moisture penetration and may perform a surface planarization function.

The semiconductor layer may be disposed on the buffer layer BL. The semiconductor layer may include the first active layer ACT1 of the first transistor T1 and a second active layer ACT2 of a second transistor T2. The first active layer ACT1 and the second active layer ACT2 may respectively partially overlap a first gate electrode G1 and a second gate electrode G2 of a second conductive layer which will be described later.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 and one second transistor T2 are disposed in the pixel PX of the display device 10 in the drawings, the disclosure is not limited thereto, and the display device 10 may include more transistors.

A first gate insulating layer GI may be disposed on the semiconductor layer and the buffer layer BL. The first gate insulating layer GI may serve as a gate insulating film of each of the transistors T1 and T2.

The second conductive layer is disposed on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3 which is the thickness direction, and the second gate electrode G2 may overlap a channel region of the second active layer ACT2 in the third direction DR3. Although not illustrated in the drawings, the second conductive layer may also include an electrode of a storage capacitor.

A first interlayer insulating layer IL1 may be disposed on the second conductive layer. The first interlayer insulating layer IL1 may function as an insulating film between the second conductive layer and other layers disposed on the second conductive layer and may protect the second conductive layer.

A third conductive layer may be disposed on the first interlayer insulating layer IL1. The third conductive layer may include a first voltage line VL1 and a second voltage line VL2 disposed in the display area DPA, a first conductive pattern CDP1, and a source electrode S1 or S2 and a drain electrode D1 or D2 of each of the transistors T1 and T2. Although not illustrated in the drawings, the third conductive layer may also include another electrode of the storage capacitor.

A high potential voltage (or a first power supply voltage) may be applied to the first voltage line VL1, and a low potential voltage (or a second power supply voltage) may be applied to the second voltage line VL2. A part of the first voltage line VL1 may contact the first active layer ACT1 of the first transistor T1 through a contact hole penetrating the first interlayer insulating layer IL1 and the first gate insulating layer GI. The first voltage line VL1 may serve as a first drain electrode D1 of the first transistor T1. The second voltage line VL2 may be connected (e. g. directly connected) to a second connection electrode CNE2 to be described later.

The first conductive pattern CDP1 may contact the first active layer ACT1 of the first transistor T1 through a contact hole penetrating the first interlayer insulating layer IL1 and the first gate insulating layer GI. The first conductive pattern CDP1 may contact the bottom metal layer BML through another contact hole. The first conductive pattern CDP1 may serve as a first source electrode S1 of the first transistor T1. The first conductive pattern CDP1 may be electrically connected to a first electrode E1 to be described later, and the first transistor T1 may transmit a first power supply voltage received from the first voltage line VL1 to the first electrode E1.

Each of a second source electrode S2 and a second drain electrode D2 may contact the second active layer ACT2 of the second transistor T2 through a contact hole penetrating the first interlayer insulating layer IL1 and the first gate insulating layer GI.

Although the first conductive pattern CDP1, the first voltage line VL1, and the second voltage line VL2 are formed on the same layer in the drawings, the disclosure is not limited thereto. In some embodiments, the first voltage line VL1 and the second voltage line VL2 may be formed of a different conductive layer from the first conductive pattern CDP1, for example, may be formed of a fourth conductive layer disposed on the third conductive layer and some insulating layers interposed between them. The first voltage line VL1 may be electrically connected to the first drain electrode D1 of the first transistor T1 through another conductive pattern.

A first passivation layer PV1 may be disposed on the third conductive layer. The first passivation layer PV1 may function as an insulating film between the third conductive layer and other layers and may protect the third conductive layer.

Each of the buffer layer BL, the first gate insulating layer GI, the first interlayer insulating layer IL1, and the first passivation layer PV1 described above may be composed of multiple inorganic layers stacked alternately. For example, each of the buffer layer BL, the first gate insulating layer GI, the first interlayer insulating layer IL1, and the first passivation layer PV1 may be a double layer in which inorganic layers including at least any one of silicon oxide ($SiO_x$), silicon nitride ($SiN_x$) and silicon oxynitride ($SiO_xN_y$) are stacked or may be a multilayer in which the above layers are alternately stacked. However, the disclosure is not limited thereto, and each of the buffer layer BL, the first gate insulating layer GI, the first interlayer insulating layer IL1, and the first passivation layer PV1 may also be composed of one inorganic layer including any one of the above insulating materials. In some embodiments, the first interlayer insulating layer IL1 may be made of an organic insulating material such as polyimide (PI).

Each of the second conductive layer and the third conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

A via layer VIA may be disposed on the first passivation layer PV1 in the display area DPA. The via layer VIA may include an organic insulating material such as polyimide (PI) to perform a surface planarization function.

The electrodes E1 and E2, the insulating layers PAS1 and PAS2, the bank layer BNL, the light emitting elements ED, and the connection electrodes CNE (CNE1 through CNE4) may be disposed on the via layer VIA.

The first electrodes E1 among the electrodes E1 and E2 may be disposed on the via layer VIA. At least one first electrode E1 may be disposed in each pixel PX. Although two first electrodes E1 are disposed in one pixel PX in FIGS. 2 through 4, the disclosure is not limited thereto. In some embodiments, the number of the first electrodes E1 disposed in each pixel PX may vary based on the number of the emission groups EMG disposed in the pixel PX.

The first electrodes E1 disposed in each pixel PX may be spaced apart from each other. For example, in an embodiment in which two first electrodes E1 are disposed in one pixel PX, the two different first electrodes E1 may be spaced apart from each other in the second direction DR2. In an embodiment in which a greater number of the first electrodes E1 are disposed in one pixel PX, the first electrodes E1 may be spaced apart from each other in the first direction DR1 or the second direction DR2 or in a diagonal direction between the first direction DR1 and the second direction DR2.

The first electrodes E1 may include a first sub-electrode SE1 disposed on a left side, which is a first side in the second direction DR2, in the emission area EMA of each pixel PX and a second sub-electrode SE2 disposed on a right side, which is a second side in the second direction DR2, in the emission area EMA. The first sub-electrode SE1 and the second sub-electrode SE2 may belong to different emission groups EMG, respectively. The first sub-electrode SE1 and the second sub-electrode SE2 may be distinguished from each other based on whether they are connected to a conductive layer under the via layer VIA. For example, the first sub-electrode SE1 may be a first type electrode contacting (e. g. directly contact) the conductive layer through a contact hole penetrating the via layer VIA, and the second sub-electrode SE2 may be a second type electrode not directly contacting the conductive layer.

In an embodiment, in the display device 10, one of the first electrodes E1 disposed in each pixel PX may be a first type electrode, or all of the first electrodes E1 may be second type electrodes. For example, in an embodiment in which each pixel PX includes two first electrodes E1 as illustrated in FIGS. 2 through 4, each pixel PX may include one first sub-electrode SE1 as a first type electrode. In an embodiment in which each pixel PX includes two or more first electrodes E1, each pixel PX may include only one first type electrode, and all other first electrodes E1 may be second type electrodes. However, the disclosure is not limited thereto. In an embodiment in which the first electrodes E1 do not directly contact the conductive layer under the via layer VIA, all of the first electrodes E1 may be second type electrodes.

As shown in FIG. 3, each of the first electrodes E1 may include a first main electrode part EM1 disposed in the emission area EMA of each pixel PX and a first electrode connection part EC1 electrically connected to the first main electrode part EM1 and extending to outside of the emission area EMA beyond the bank layer BNL which will be described later. The first main electrode part EM1 may have a rectangular shape in a plan view by including sides extending in the first direction DR1 and the second direction DR2. The first electrode connection part EC1 may protrude in a direction from any one of the sides of the first main electrode part EM1. In an embodiment, the first electrode connection part EC1 may protrude in the first direction DR1 from the middle of an upper side among the sides of the first main electrode part EM1. However, the disclosure is not limited thereto, and the shape of each first electrode E1 in a plan view may be variously changed.

The first main electrode part EM1 may partially overlap the first insulating layer PAS1 and the openings OP1 through OP3 of the first insulating layer PAS1 in the emission area EMA. The first main electrode part EM1 may partially overlap a second electrode E2 to be described later in the thickness direction, and multiple light emitting elements ED and the second electrode E2 may be disposed on the first main electrode part EM1.

The first electrode connection part EC1 may extend from the first main electrode part EM1 to beyond the bank layer BNL. The first electrode connection part EC1 may be disposed outside of the emission area EMA of a corresponding pixel PX. Any one of the first electrodes E1 disposed in each pixel PX may be a first type electrode electrically connected to the conductive layer under the via layer VIA through the first contact hole CTD in the first electrode connection part EC1. For example, in the first sub-electrode SE1 disposed on the left side of the emission area EMA among the first electrodes E1, the first electrode connection part EC1 may contact the first conductive pattern CDP1 through the first contact hole CTD penetrating the via layer VIA. The first sub-electrode SE1 may be electrically connected to the first transistor T1 and may receive the first power supply voltage through the first voltage line VL1. On the other hand, although the second sub-electrode SE2 includes the first electrode connection part EC1, it may be a second type electrode that does not directly contact the conductive layer under the via layer VIA.

The first electrode connection part EC1 of each first electrode E1 may be separated from a conductive pattern (not illustrated) disposed outside of the emission area EMA. The conductive pattern may be electrically connected to a wiring disposed in the conductive layer under the via layer VIA. Each first electrode E1 may be formed to be electrically connected to the conductive pattern in the first electrode connection part EC1 and thus electrically connected to the wiring and then may be separated from the conductive pattern in a manufacturing process of the display device 10. In the manufacturing process of the display device 10, each first electrode E1 may receive an electrical signal for aligning the light emitting elements ED through the first electrode connection part EC1 and the wiring.

The first insulating layer PAS1 may be disposed on the via layer VIA and the first electrodes E1. The first insulating layer PAS1 may be disposed to correspond to the emission area EMA of each pixel PX and may have a larger area than the emission area EMA surrounded by the bank layer BNL. The first insulating layer PAS1 may include sides extending in the first direction DR1 and the second direction DR2 in a plan view and may be disposed to correspond to each pixel PX in the display area DPA. For example, the first insulating layer PAS1 may have an island-shaped pattern in the display area DPA and may be spaced apart from other first insulating layers PAS1 in the first direction DR1 and the second direction DR2. However, the disclosure is not limited thereto. The first insulating layer PAS1 may also be disposed over the entire display area DPA without being disposed to correspond to each pixel PX.

According to an embodiment, the first insulating layer PAS1 may include multiple openings OP (OP1 through OP3) disposed in the emission area EMA of each pixel PX. Each of the openings OP may expose a part of a first electrode E1 and a part of an upper surface of the via layer VIA. At least one light emitting element ED may be disposed in each of the openings OP. The light emitting elements ED may be disposed on the first electrodes E1 exposed by the openings OP.

The openings OP may include a first opening OP1 disposed over multiple first electrodes E1 spaced apart from each other and a second opening OP2 and a third opening OP3, each being spaced apart from the first opening OP1 and disposed on any one of the first electrodes E1. For example, the first opening OP1 may be disposed over the first sub-electrode SE1 and the second sub-electrode SE2 and may expose a part of each of the first sub-electrode SE1 and the second sub-electrode SE2 and a part of the upper surface of the via layer VIA between the first sub-electrode SE1 and the second sub-electrode SE2. The second opening OP2 may be spaced apart from the first opening OP1 in the second direction DR2 and may expose a part of the first sub-electrode SE1 and a part of the upper surface of the via layer VIA. The third opening OP3 may be spaced apart from the first opening OP1 in the second direction DR2 and may expose a part of the second sub-electrode SE2 and a part of the upper surface of the via layer VIA. Each of the openings OP may generally extend in the first direction DR1, but a width WO1 of the first opening OP1 measured in the second direction DR2 may be greater than a width WO2 of the second opening OP2 and the third opening OP3 measured in the second direction DR2. Among the openings OP, an opening (e.g., the first opening OP1) overlapping the first electrodes E1 arranged in different emission groups EMG may have a greater width than an opening (e.g., the second opening OP2 or the third opening OP3) overlapping any one first electrode E1. However, the number and the shapes of the openings OP may be variously changed according to the shapes and the arrangement of the first electrodes E1 and the second electrodes E2.

Like the via layer VIA, the first insulating layer PAS1 may include an organic insulating material such as polyimide (PI). However, the disclosure is not limited thereto, and the first insulating layer PAS1 may also have a single layer or multilayer structure including an inorganic insulating material.

Multiple second electrodes E2 may be disposed on the first insulating layer PAS1. Each of the second electrodes E2 disposed in each pixel PX may be directly disposed on the first insulating layer PAS1 and may overlap a first electrode E1 thereunder in the thickness direction. For example, in an embodiment in which two first electrodes E1 are disposed in one pixel PX, two second electrodes E2 may respectively overlap the first electrodes E1 in the thickness direction in one pixel PX. Different second electrodes E2 may belong to different emission groups EMG, respectively.

Each of the second electrodes E2 may be disposed between the openings OP of the first insulating layer PAS1. Two different second electrodes E2 may be spaced apart from each other in the second direction DR2 with the first opening OP1 interposed between them. One second electrode E2 may be disposed between the first opening OP1 and the second opening OP2 to overlap the first sub-electrode SE1 in the thickness direction, and the other second electrode E2 may be disposed between the first opening OP1 and the third opening OP3 to overlap the second sub-electrode SE2 in the thickness direction. However, the number and the arrangement of the second electrodes E2 may be variously changed according to the number and the arrangement of the first electrodes E1 disposed in each pixel PX.

Each of the second electrodes E2 may include a second main electrode part EM2 disposed in the emission area EMA of each pixel PX and a second electrode connection part EC2 electrically connected to the second main electrode part EM2 and extending to outside of the emission area EMA beyond the bank layer BNL. As in the first electrodes E1, in each of the second electrodes E2, the second main electrode part EM2 may have a rectangular shape in a plan view by including sides extending in the first direction DR1 and the second direction DR2, and the second electrode connection part EC2 may protrude in a direction from any one of the sides of the second main electrode part EM2. In an embodiment, the second electrode connection part EC2 may protrude in the first direction DR1 from a lower side among the sides of the second main electrode part EM2 but may extend from a left or right side among the sides of the second main electrode part EM2. For example, in the second electrode E2 disposed on the first sub-electrode SE1, the second electrode connection part EC2 may be aligned with the right side of the second main electrode part EM2. In the second electrode E2 disposed on the second sub-electrode SE2, the second electrode connection part EC2 may be aligned with the left side of the second main electrode part EM2. Different second electrodes E2 may be symmetrical to each other with respect to an extension line crossing a central part of the emission area EMA in the first direction DR1. However, the disclosure is not limited thereto, and the shape of the second electrodes E2 in a plan view may be variously changed according to the shape of the first electrodes E1.

The second main electrode part EM2 may be disposed on each of insulating pattern parts IP1 and IP2 between the openings OP of the first insulating layer PAS1 in the emission area EMA. A first insulating pattern part IP1 may be disposed between the first opening OP1 and the second opening OP2 of the first insulating layer PAS1. The first insulating pattern part IP1 may be disposed on the first main electrode part EM1 of the first sub-electrode SE1. In any one of the second electrodes E2, the second main electrode part EM2 may be disposed on the first insulating pattern part IP1 to overlap the first main electrode part EM1 of the first sub-electrode SE1 in the thickness direction.

A second insulating pattern part IP2 may be disposed between the first opening OP1 and the third opening OP3 of the first insulating layer PAS1. The second insulating pattern part IP2 may be disposed on the first main electrode part EM1 of the second sub-electrode SE2. In the other one of the second electrodes E2, the second main electrode part EM2 may be disposed on the second insulating pattern part IP2 to overlap the first main electrode part EM1 of the second sub-electrode SE2 in the thickness direction.

In an embodiment, the second main electrode parts EM2 of the second electrodes E2 may be smaller than the first main electrode parts EM1 of the first electrodes E1 in a plan view. The second main electrode parts EM2 of the second electrodes E2 may be spaced apart from each other in the second direction DR2, as the first main electrode parts EM1 of the first electrodes E1 are spaced apart from each other in the second direction DR2. Since the second main electrode parts EM2 overlap the first main electrode parts EM1 in the thickness direction but are smaller than the first main electrode parts EM1, a distance between the first main electrode parts EM1 of the first electrodes E1 may be smaller than a distance between the second main electrode parts EM2 of the second electrodes E2. In an embodiment in which the first electrodes E1 and the second electrodes E2 are respectively spaced apart from each other in the second direction DR2, the distance between the first main electrode parts EM1 in the second direction DR2 may be smaller than the distance between the second main electrode parts EM2 in the second direction DR2. The first and second main electrode parts EM1 and EM2 may be disposed such that their centers overlap each other in the thickness direction. Accordingly, even in an embodiment in which the shapes and arrangement of the electrodes E1 and E2 are different, the distance between the first main electrode parts EM1 may be smaller than the distance between the second main electrode parts EM2.

The second electrode connection part EC2 of each second electrode E2 may extend from the second main electrode part EM2 to beyond the bank layer BNL. The second electrode connection part EC2 may be disposed outside of the emission area EMA of a corresponding pixel PX. Like the first electrode connection part EC1, the second electrode connection part EC2 may be separated from a conductive pattern (not illustrated) disposed outside of the emission area EMA. The conductive pattern may be electrically connected to any one of the conductive layers under the via layer VIA. Each second electrode E2 may be formed to be electrically connected to the conductive pattern in the second electrode connection part EC2 and may be separated from the conductive pattern in the manufacturing process of the display device 10. In the manufacturing process of the display device 10, each second electrode E2 may be electrically connected to the conductive layer thereunder through the second electrode connection part EC2 and the conductive pattern and may receive an electrical signal for aligning the light emitting elements ED.

The electrodes E1 and E2 may include a conductive material having high reflectivity. For example, each of the electrodes E1 and E2 may include a metal such as silver (Ag), copper (Cu) or aluminum (Al), may be an alloy including aluminum (Al), nickel (Ni) or lanthanum (La), or may have a structure in which a metal layer such as titanium (Ti) or molybdenum (Mo) and the above alloy are stacked each other. In some embodiments, each of the electrodes E1 and E2 may be a double layer or a multilayer in which an alloy including aluminum (Al) and at least one metal layer made of titanium (Ti) or molybdenum (Mo) are stacked each other.

However, the disclosure is not limited thereto, and each electrode E1 or E2 may include a transparent conductive material. For example, each electrode E1 or E2 may include a material such as ITO, IZO or ITZO. In some embodiments, each electrode E1 or E2 may have a structure in which a transparent conductive material and a metal layer having high reflectivity are stacked each other in one or more layers or may be formed as a single layer including them. For example, each electrode E1 or E2 may have a stacked structure of ITO/Ag/ITO, ITO/Ag/IZO, or ITO/Ag/ITZO/IZO.

The bank layer BNL may be disposed on the first insulating layer PAS1. The bank layer BNL may include parts extending in the first direction DR1 and the second direction DR2 and may be disposed at the boundary of each pixel PX to surround the emission area EMA. The bank layer BNL may surround the outermost periphery of the display area DPA to separate the display area DPA and the non-display area NDA. The bank layer BNL may be disposed in the entire display area DPA to form a grid pattern, and each area exposed by the bank layer BNL in the display area DPA may be the emission area EMA.

The bank layer BNL may have a height on the first insulating layer PAS1. In some embodiments, the bank layer BNL may prevent ink from overflowing to adjacent pixels PX in an inkjet printing process during the manufacturing process of the display device 10. The bank layer BNL may include an organic insulating material such as polyimide.

The light emitting elements ED may be disposed on the first electrodes E1 in the openings OP. The light emitting elements ED may extend in a direction and may be disposed upright in the openings OP. For example, each of the light emitting elements ED may be disposed such that one end in the longitudinal direction faces the first substrate SUB, and at least some of the light emitting elements ED may be disposed perpendicularly to an upper surface of the first substrate SUB. Each of the light emitting elements ED may include multiple semiconductor layers disposed along the longitudinal direction, and the semiconductor layers may be sequentially disposed along a direction perpendicular to the upper surface of the first substrate SUB.

In the manufacturing process of the display device 10, in case that an electrical signal is transmitted to the electrodes E1 and E2 disposed on different layers, an electric field may be generated between them. The light emitting elements ED may be provided to an area surrounded by the bank layer BNL in a state that are dispersed in ink, and their orientation directions and positions may be changed by the force of the electric field. Since the first and second electrodes E1 and E2 overlap each other with the first insulating layer PAS1 interposed between them, the electric field may be generated in the direction perpendicular to the upper surface of the first substrate SUB. Accordingly, the light emitting elements ED may be disposed such that their longitudinal direction is substantially perpendicular to the upper surface of the first substrate SUB.

The light emitting elements ED may be spaced apart from each other on the first electrodes E1 and may be disposed adjacent to sidewalls of the openings OP and the second electrodes E2. For example, side surfaces of the light emitting elements ED disposed perpendicularly to the upper surface of the first substrate SUB may be in contact with the sidewalls of the openings OP or side surfaces of the insulating pattern parts IP1 and IP2 of the first insulating layer PAS1. The light emitting elements ED may be disposed adjacent to sides that are in contact with the openings OP among the sides of the second main electrode parts EM2 of the second electrodes E2 disposed on the insulating pattern parts IP1 and IP2. In an embodiment in which each second electrode E2 is disposed between the openings OP so that both sides of the second electrode E2 in the second direction DR2 are in contact with the openings OP, the light emitting elements ED may be disposed adjacent to both sides of the second electrode E2 in the second direction DR2. The light emitting elements ED may be spaced apart from each other to correspond to the shapes of the openings OP or the second main electrode parts EM2 of the second electrodes E2. For example, since the openings OP and the second main electrode parts EM2 of the second electrodes E2 extend in the first direction DR1, the light emitting elements ED disposed adjacent to any one second electrode E2 in the same opening OP may be spaced apart from each other in the first direction DR1. However, the disclosure is not limited thereto. In an embodiment in which the openings OP of the first insulating layer PAS1 surround the insulating pattern parts IP1 and IP2, the light emitting elements ED may surround the sides of the insulating pattern parts IP1 and IP2 and the second electrodes E2 in a plan view.

A length of each of the light emitting elements ED may be smaller than a thickness of the first insulating layer PAS1. The light emitting elements ED may have first ends disposed on the first electrodes E1 and second ends located at a height lower than the second electrodes E2 and an upper surface of the first insulating layer PAS1. The first ends and the second ends of the light emitting elements ED may be electrically connected to a conductive layer under the via layer VIA through the connection electrodes CNE to be described later, and the light emitting elements ED may receive a power supply voltage and emit light.

The light emitting elements ED may emit light toward both ends in the longitudinal direction. Since the light output direction of the light emitting elements ED in each pixel PX is perpendicular to the upper surface of the first substrate SUB, the light output efficiency of the display device 10 may be improved. In the display device 10, the light emitting elements ED extending in a direction may be disposed in large numbers per unit area, and the luminance of each pixel PX may be improved.

Each pixel PX may include multiple emission groups EMG (EMG1 and EMG2), each including a pair of the electrodes E1 and E2 overlapping each other in the thickness direction with the first insulating layer PAS1 interposed therebetween and multiple light emitting elements ED disposed adjacent to or on the pair of the electrodes E1 and E2. For example, the emission groups EMG may include a first emission group EMG1 and a second emission group EMG2 distinguished based on the sub-electrodes SE1 and SE2 of the first electrodes E1. The first emission group EMG1 may include the first sub-electrode SE1, the second electrode E2 disposed on the first sub-electrode SE1, and multiple first light emitting elements ED1 disposed in the first opening OP1 and the second opening OP2 and adjacent to the side surfaces of the first insulating pattern part IP1. The second emission group EMG2 may include the second sub-electrode SE2, the second electrode E2 disposed on the second sub-electrode SE2, and multiple second light emitting elements ED2 disposed in the first opening OP1 and the third opening OP3 and adjacent to the side surfaces of the second insulating pattern part IP2. In each pixel PX, the second electrodes E2 may be disposed to respectively correspond to the first electrodes E1 disposed in the emission area EMA, and the openings OP may be formed to correspond to the arrangement of the first electrodes E1. Therefore, the number of the emission groups EMG disposed in each pixel PX may be related to the number of the first electrodes E1. As illustrated in FIGS. 2 through 4, in an embodiment in which two first electrodes E1 are disposed in one pixel PX, two emission groups EMG, each including a pair of the electrodes E1 and E2 and multiple light emitting elements ED, may be disposed in each pixel PX.

In the first emission group EMG1 and the second emission group EMG2, the first light emitting elements ED1 and the second light emitting elements ED2 may be classified as different light emitting elements ED based on the openings OP in which they are disposed. Some of the first light emitting elements ED1 may be disposed on the first sub-electrode SE1 in the first opening OP1, and the others may be disposed on the first sub-electrode SE1 in the second opening OP2. Some of the second light emitting elements ED2 may be disposed on the second sub-electrode SE2 in the first opening OP1, and the others may be disposed on the second sub-electrode SE2 in the third opening OP3. However, the light emitting elements ED may be electrically connected to each other through the connection electrodes CNE to be described later, and the light emitting elements ED1 or ED2 arranged in the same emission group EMG may be electrically connected to the same electrodes E1 and E2 or the same connection electrodes CNE. This will be described later together with the arrangement of the connection electrodes CNE.

The connection electrodes CNE (CNE1 and CNE2) may include multiple first connection electrodes CNE1 in contact with the first ends of the light emitting elements ED and multiple second connection electrodes CNE2 in contact with the second ends of the light emitting elements ED. A first connection electrode CNE1 may contact the first electrode E1 and the first ends of the light emitting elements ED in each opening OP, and a second connection electrode CNE2 may be disposed on the second electrode E2 and the second insulating layer PAS2 which will be described later and may contact the second ends of the light emitting elements ED. The first connection electrodes CNE1 and the second connection electrodes CNE2 may be electrically connected to the light emitting elements ED, and some of them may be electrically connected to a conductive layer under the via layer VIA.

The first connection electrodes CNE1 may include multiple electrode parts CN1 through CN3, and each of the electrode parts CN1 through CN3 may have a shape corresponding to the arrangement of the light emitting elements ED in each opening OP. For example, the first connection electrodes CNE1 may include a first electrode part CN1 and a second electrode part CN2 disposed in the first opening OP1 and multiple third electrode parts CN3 disposed in the second opening OP2 and the third opening OP3. In an embodiment in which the light emitting elements ED in each opening OP are spaced apart from each other in the first direction DR1, each of the first through third electrode parts CN1 through CN3 may have a width and may extend in the first direction DR1.

The first electrode part CN1 may be disposed on the first sub-electrode SE1 in the first opening OP1. The first electrode part CN1 may contact the first ends of the first light emitting elements ED1 and the first sub-electrode SE1 disposed in the first opening OP1. A part of the second electrode part CN2 may be disposed on the second sub-electrode SE2 in the first opening OP1. The second electrode part CN2 may contact the first ends of the second light emitting elements ED2 and the second sub-electrode SE2 disposed in the first opening OP1. The first electrode part CN1 and the second electrode part CN2 may be disposed in the same opening OP, for example, the first opening OP1 but may be spaced apart from each other in the second direction DR2 without directly contacting each other.

Each of the third electrode parts CN3 may be disposed on the first electrode E1 in the second opening OP2 or the third opening OP3. One of the third electrode parts CN3 may be disposed on the first sub-electrode SE1 in the second opening OP2 and may contact the first light emitting elements ED1 and the first sub-electrode SE1 in the second opening OP2. Another one of the third electrode parts CN3 may be disposed on the second sub-electrode SE2 in the third opening OP3 and may contact the second light emitting elements ED2 and the second sub-electrode SE2 in the third opening OP3. Each of the third electrode parts CN3 may be spaced apart from the first electrode part CN1 or the second electrode part CN2 with the insulating pattern part IP1 or IP2 interposed between them. For example, the third electrode part CN3 disposed in the second opening OP2 may be spaced apart from the first electrode part CN1 in the second direction DR2 with the first insulating pattern part IP1 interposed between them, and the third electrode part CN3 disposed in the third opening OP3 may be spaced apart from the second electrode part CN2 in the second direction DR2 with the second insulating pattern part IP2 interposed between them. Each of the electrode parts CN1 through CN3 may extend in the first direction DR1 and may contact the first ends of the light emitting elements ED arranged in the first direction DR1. The first electrode part CN1 and any one of the third electrode parts CN3 may contact the first electrode E1 and the first light emitting elements ED1 of the first emission group EMG1, and the second electrode part CN2 and the other one of the third electrode parts CN3 may contact the first electrode E1 and the second light emitting elements ED2 of the second emission group EMG2. Since each of the electrode parts CN1 through CN3 of the first connection electrodes CNE1 is formed after the light emitting elements ED are disposed, a part thereof may contact side surfaces of the light emitting elements ED. For example, each of the electrode parts CN1 through CN3 may at least partially contact side surfaces of the first ends of the light emitting elements ED disposed on the first electrode E1.

Each of the light emitting elements ED may be electrically connected to a first electrode E1 through a first connection electrode CNE1. Since the first electrode connection part EC1 of the first sub-electrode SE1 is electrically connected to a conductive layer under the via layer VIA through the first contact hole CTD, the first light emitting elements ED1 may be electrically connected to the conductive layer under the via layer VIA through the first electrode part CN1 and any one of the third electrode parts CN3. The first ends of the first light emitting elements ED1 may be electrically connected to the first transistor T1 through the first electrode part CN1 or the third electrode part CN3 and the first sub-electrode SE1.

According to an embodiment, a width of the second electrode part CN2 measured in the second direction DR2 may be different from the widths of the first electrode part CN1 and the third electrode parts CN3. A first width W1 of each of the first electrode part CN1 and the third electrode parts CN3 measured in the second direction DR2 may be smaller than a second width W2 of the second electrode part CN2 measured in the second direction DR2. A part of the second electrode part CN2 may be disposed between the first sub-electrode SE1 and the second sub-electrode SE2. Each of the first electrode part CN1 and the third electrode parts CN3 may be disposed on the first electrode E1 while contacting the light emitting elements ED. On the other hand, the second electrode part CN2 having a relatively large width may be disposed on the second sub-electrode SE2 and the via layer VIA and may contact any one of the second connection electrodes CNE2.

The second insulating layer PAS2 may be disposed in each opening OP to cover the light emitting elements ED. The second insulating layer PAS2 may be disposed in each of the first opening OP1, the second opening OP2, and the third opening OP3 to fill the opening OP. The light emitting elements ED disposed on the side surfaces of the insulating pattern parts IP1 and IP2 of the first insulating layer PAS1 may be fixed upright by the second insulating layer PAS2. The second insulating layer PAS2 may have a pattern shape similar to the shape of the openings OP in a plan view. In an embodiment in which each opening OP having a width extends in the first direction DR1, the second insulating layer PAS2 disposed in each opening OP may also extend in the direction.

In an embodiment, a thickness of the second insulating layer PAS2 may be smaller than the thickness of the first insulating layer PAS1 and the length of each light emitting element ED. In the openings OP, the second insulating layer PAS2 may cover the first connection electrodes CNE1 and a part of each first electrode E1 and may partially cover the side surfaces of the light emitting elements ED but may expose the second ends of the light emitting elements ED. End surfaces of the second ends of the light emitting elements ED or upper surfaces of the light emitting elements ED may be exposed together with side surfaces of the second ends of the light emitting elements ED. The second insulating layer PAS2 may have a thickness sufficient to expose some of the semiconductor layers of each light emitting element ED to be described later, and the second connection electrodes CNE2 may be disposed on the second insulating layer PAS2 to contact (e. g. directly contact) the second ends of the light emitting elements ED.

Like the first insulating layer PAS1, the second insulating layer PAS2 may include, but is not limited to, an inorganic insulating material or an organic insulating material.

The second connection electrodes CNE2 may include multiple electrode parts CN4 and CN5, and each of the electrode parts CN4 and CN5 may be disposed on the second insulating layer PAS2 and the second electrode E2. Each of the electrode parts C4 and CN5 may have a shape corresponding to the planar shape of the second electrode E2 and the arrangement of the light emitting elements ED. For example, the second connection electrodes CNE2 may include a fourth electrode part CN4 disposed on the second electrode E2 of the first emission group EMG1 and a fifth electrode part CN5 disposed on the second electrode E2 of the second emission group EMG2. Each of the fourth electrode part CN4 and the fifth electrode part CN5 may be shaped to cover the light emitting elements ED and the second electrode E2 arranged in an emission group EMG.

The fourth electrode part CN4 may be disposed on the second electrode E2 of the first emission group EMG1 to cover the first light emitting elements ED1. The fourth electrode part CN4 may overlap the first sub-electrode SE1 and one of the second electrodes E2 in the thickness direction and may contact the second ends of the first light emitting elements ED1 disposed in the first opening OP1 and the second opening OP2 and the second electrode E2. Since the thickness of the second insulating layer PAS2 is smaller than the length of each of the light emitting elements ED as described above, the second ends of the light emitting elements ED may be exposed above the second insulating layer PAS2, and the fourth electrode part CN4 may contact the exposed second ends of the first light emitting elements ED1. For example, the fourth electrode part CN4 may contact upper and side surfaces of the second ends of the first light emitting elements ED1. The fourth electrode part CN4 may have a rectangular shape in a plan view by including sides extending in the first direction DR1 and the second direction DR2, but the disclosure is not limited thereto. The shape of the fourth electrode part CN4 may vary according to the arrangement shape of the second electrode E2 and the first light emitting elements ED1. Since the fourth electrode part CN4 is wider than the second electrode E2 in the second direction DR2, a part of the fourth electrode part CN4 may be directly disposed on the second insulating layer PAS2.

The fifth electrode part CN5 may be disposed on the second electrode E2 of the second emission group EMG2 to cover the second light emitting elements ED2. The fifth electrode part CN5 may overlap the second sub-electrode SE2 and one of the second electrodes E2 in the thickness direction and may contact the second ends of the second light emitting elements ED2 disposed in the first opening OP1 and the third opening OP3 and the second electrode E2. For example, the fifth electrode part CN5 may contact upper and side surfaces of the second ends of the second light emitting elements ED2. The fifth electrode part CN5 may have a rectangular shape in a plan view by including sides extending in the first direction DR1 and the second direction DR2, but the disclosure is not limited thereto. The shape of the fifth electrode part CN5 may vary according to the arrangement shape of the second electrode E2 and the second light emitting elements ED2. Since the fifth electrode part CN5 is wider than the second electrode E2 in the second direction DR2, a part of the fifth electrode part CN5 may be directly disposed on the second insulating layer PAS2.

According to an embodiment, a third width W3 of the fourth electrode part CN4 measured in the second direction DR2 may be greater than a fourth width W4 of the fifth electrode part CN5 measured in the second direction DR2, and the fourth electrode part CN4 may overlap the second electrode part CN2 under the second insulating layer PAS2 in the thickness direction. The second insulating layer PAS2 may include a second contact hole CTE exposing an upper surface of a part of the second electrode part CN2 which is disposed on the via layer VIA, and the fourth contact part CN4 may contact (e. g. directly contact) the second electrode part CN2 through the second contact hole CTE. The first light emitting elements ED1 may be electrically connected to the first transistor T1 through the first electrode part CN1 and the third electrode part CN3 and may be electrically connected to the second light emitting elements ED2 through the fourth electrode part CN4 and the second electrode part CN2. Since the fourth electrode part CN4 and the second electrode part CN2 contact each other, the light emitting elements ED arranged in different emission groups EMG may be electrically connected to each other. The second contact hole CTE may be formed in the second insulating layer PAS2 disposed in an opening OP in which the light emitting elements ED arranged in different emission groups EMG are disposed.

In the embodiment of FIGS. 2 through 4, some of the first light emitting elements ED1 of the first emission group EMG1 and some of the second light emitting elements ED2 of the second emission group EMG2 may be disposed together in the first opening OP1 and may be spaced apart from each other in the second direction DR2 so that they are disposed on different sub-electrodes SE1 and SE2. The second contact hole CTE may be formed in the second insulating layer PAS2 disposed in the first opening OP1, and the second connection electrode CNE2 (e.g., the fourth electrode part CN4) electrically connected to the light emitting elements ED of the first emission group EMG1 may be electrically connected to the first connection electrode CNE1 (e.g., the second electrode part CN2) electrically connected to the light emitting elements ED of the second emission group EMG2.

According to an embodiment, the fifth electrode part CN5 may include an electrode extension part CNP protruding in a direction from any one of its sides and extending to outside of the bank layer BNL. The electrode extension part CNP may extend in the first direction DR1 from the middle of a lower side of the fifth electrode part CN5. The electrode extension part CNP may be disposed on the via layer VIA outside of the bank layer BNL and may be electrically connected to the second voltage line VL2 through the third contact hole CTS penetrating the via layer VIA and the first passivation layer PV1 to expose a part of an upper surface of the second voltage line VL2. The second light emitting elements ED2 may be electrically connected to the second voltage line VL2 through the fifth electrode part CN5.

The first light emitting elements ED1 of the first emission group EMG1 may be electrically connected to the first transistor T1 through first connection electrodes CNE1, and the second light emitting elements ED2 of the second emission group EMG2 may be electrically connected to the second voltage line VL2 through a second connection electrode CNE2. The first light emitting elements ED1 and the second light emitting elements ED2 may be electrically connected to each other through a second connection electrode CNE2 (e.g., the fourth electrode part CN4) electrically connected to the first light emitting elements ED1 of the first emission group EMG1 and a first connection electrode CNE1 (e.g., the second electrode part CN2) electrically connected to the second light emitting elements ED2 of the second emission group EMG2. In the display device 10, multiple emission groups EMG may be disposed in each pixel PX, and the light emitting elements ED of different emission groups EMG may be electrically connected to each other through a first connection electrode CNE1 and a second connection electrode CNE2.

In particular, the first connection electrode CNE1 electrically connected to the light emitting elements ED of any one emission group EMG and the second connection electrode CNE2 electrically connected to the light emitting elements ED of the other emission group EMG may be electrically connected to each other through the second contact hole CTE penetrating the second insulating layer PAS2. The second contact hole CTE may be designed to be located in an opening OP of the second insulating layer PAS2 in which the light emitting elements ED of different emission groups EMG are simultaneously disposed, and a series of connection may be formed between the light emitting elements ED through the first connection electrode CNE1 and the second connection electrode CNE2. In the display device 10 according to the embodiment, the light emitting elements ED of each emission group EMG disposed in each pixel PX may be disposed upright on the upper surface of the first substrate SUB and may be electrically connected in series to provide high luminance per unit area.

The first connection electrodes CNE1 and the second connection electrodes CNE2 described above may be distinguished based on their position with respect to the first insulating layer PAS1, and the electrode parts CN1 through CN5 may also be distinguished according to their position and the light emitting elements ED to which they are connected. The arrangement and number of the electrode parts CN1 through CN5 included in the connection electrodes CNE1 and CNE2 may vary according to the number and arrangement of the emission groups EMG disposed in each pixel PX. This will be described with reference to other embodiments.

Figure 7:
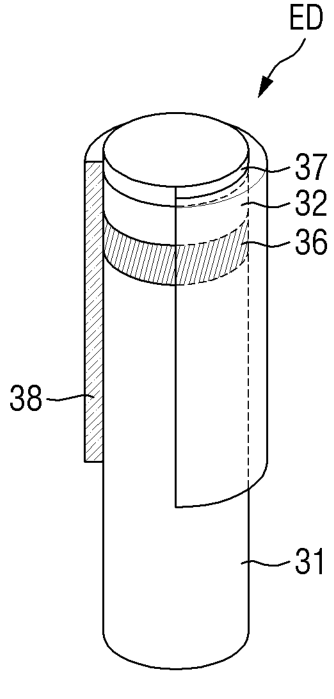
FIG. 7 is a schematic view of a light emitting element according to an embodiment.
Figure 8:
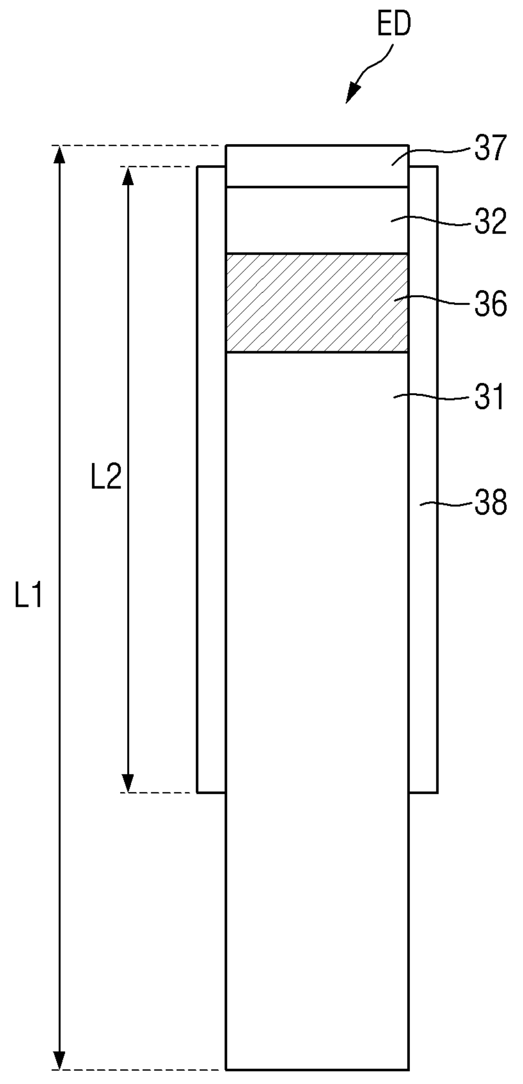
FIG. 8 is a schematic cross-sectional view of the light emitting element of FIG. 7.

FIG. 7 is a schematic view of a light emitting element ED according to an embodiment. FIG. 8 is a schematic cross-sectional view of the light emitting element ED of FIG. 7. FIG. 8 illustrates a cross section of the light emitting element ED of FIG. 7 taken in a longitudinal direction.

Referring to FIGS. 7 and 8, the light emitting element ED may be a light emitting diode. Specifically, the light emitting element ED may be an inorganic light emitting diode having a size of nanometers to micrometers and may be made of an inorganic material. In case that an electric field is formed in a specific direction between two electrodes facing each other, the light emitting element ED may be aligned between the two electrodes in which polarities are formed.

The light emitting element ED according to the embodiment may extend in one direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped and a hexagonal prism, and a shape extending in a direction and having a partially inclined outer surface.

The light emitting element ED may include a semiconductor layer doped with impurities of any conductivity type (e.g., a p type or an n type). The semiconductor layer may receive an electrical signal from an external power source and may emit light in a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may be any one or more of AlGaInN, GaN, AlGaN, InGaN, AlN, and InN doped with an n-type dopant. The n-type dopant used to dope the first semiconductor layer 31 may be Si, Ge, Sn, or the like.

The second semiconductor layer 32 may be disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be any one or more of AlGaInN, GaN, AlGaN, InGaN, AlN, and InN doped with a p-type dopant. The p-type dopant used to dope the second semiconductor layer 32 may be Mg, Zn, Ca, Se, Ba, or the like.

Although each of the first semiconductor layer 31 and the second semiconductor layer 32 is composed of one layer in the drawings, the disclosure is not limited thereto. Each of the first semiconductor layer 31 and the second semiconductor layer 32 may also include multiple layers, for example, may also include a clad layer or a tensile strain barrier reducing (TSBR) layer depending on the material of the light emitting layer 36.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, it may have a structure in which multiple well layers and multiple barrier layers are alternately stacked. The light emitting layer 36 may emit light by combination of electron-hole pairs according to an electrical signal received from the first semiconductor layer 31 and the second semiconductor layer 32. The light emitting layer 36 may include a material such as AlGaN, AlGaInN, or InGaN. In particular, in case that the light emitting layer 36 has a multiple quantum well structure in which a well layer and a barrier layer are alternately stacked, the well layer may include a material such as GaN, InGaN or AlInN, and the barrier layer may include a material such as AlGaN or AlGaInN.

The light emitting layer 36 may also have a structure in which a semiconductor material having a large band gap energy and a semiconductor material having a small band gap energy are alternately stacked or may include different group 3 to 5 semiconductor materials depending on the wavelength band of light that it emits. Light emitted from the light emitting layer 36 is not limited to light in a blue wavelength band. In some cases, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

In case that the light emitting element ED is electrically connected to an electrode or a connection electrode, the electrode layer 37 may reduce the resistance between the light emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 may surround outer surfaces of the semiconductor layers and the electrode layer described above. For example, the insulating film 38 may surround an outer surface of at least the light emitting layer 36 but may expose both ends of the light emitting element ED in the longitudinal direction. An upper surface of the insulating film 38 may also be rounded in cross section in an area adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). Although the insulating film 38 is illustrated as a single layer in the drawings, the disclosure is not limited thereto. In some embodiments, the insulating film 38 may be formed in a multilayer structure in which multiple layers are stacked each other.

The insulating film 38 may protect the above layers. The insulating film 38 may prevent an electrical short circuit that may occur in the light emitting layer 36 in case that the light emitting layer 36 contacts (e. g. directly contact) an electrode through which an electrical signal is transmitted to the light emitting element E1). The insulating film 38 may prevent a reduction in luminous efficiency of the light emitting element ED.

An outer surface of the insulating film 38 may be treated. The light emitting element ED may be sprayed onto electrodes in a state where it is dispersed in an ink and then may be aligned. Here, the surface of the insulating film 38 may be hydrophobic or hydrophilic-treated so that the light emitting element ED remains separate from other adjacent light emitting elements ED in the ink without agglomerating.

According to an embodiment, in the light emitting element ED, the insulating film 38 may be formed to partially expose side surfaces of the semiconductor layer or the electrode layer 37 at both ends of the light emitting element ED. The insulating film 38 may surround side surfaces of at least the light emitting layer 36 but may expose the side surfaces of the electrode layer 37 located at a first end of the light emitting element ED and the side surfaces of the first semiconductor layer 31 located at a second end of the light emitting element ED. A length L1 of the light emitting element ED may be greater than a length L2 of the insulating film 38. Each of the ends of the light emitting element ED disposed in the display device 10 may contact one of a first connection electrode CNE1 and a second connection electrode CNE2. The light emitting element ED may be electrically connected to the connection electrodes CNE because the semiconductor layer or the electrode layer 37 surrounded by the insulating film 38 contact the connection electrodes CNE. In case that the insulating film 38 completely surrounds the side surfaces of the semiconductor layers 31 and 32 and the electrode layer 37, the light emitting element ED and the connection electrodes CNE disposed adjacent to a side surface of the insulating pattern part IP1 or IP2 of the display device 10 may not perfectly contact each other. However, in the light emitting element ED according to the embodiment, since the insulating film 38 partially exposes the side surfaces of the semiconductor layer or the electrode layer 37, the connection electrodes CNE may contact the exposed side surfaces of the semiconductor layer or the electrode layer 37 in addition to both end surfaces of the light emitting element ED. Therefore, the connection electrodes CNE and the light emitting element ED may perfectly contact each other.

Figure 9:
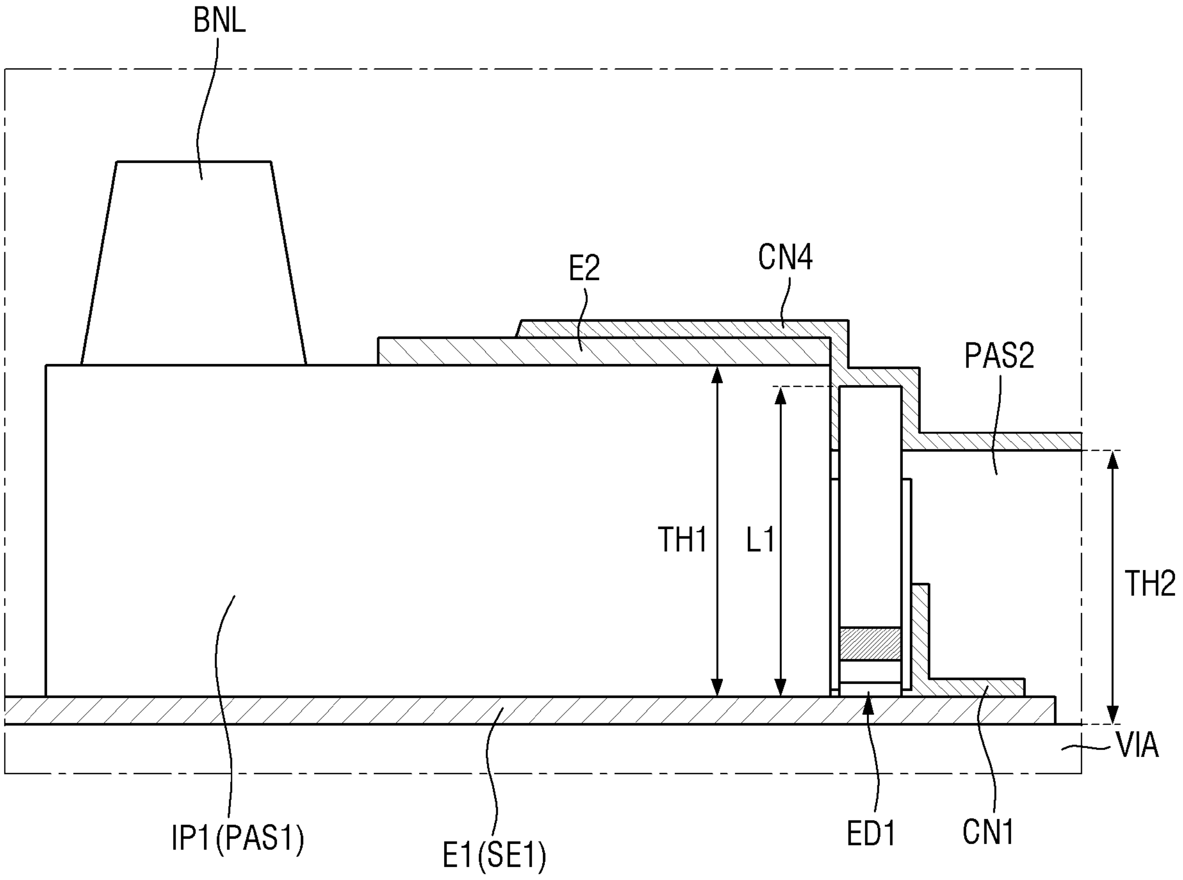
FIG. 9 is a schematic view illustrating the light emitting element of FIG. 8 disposed in an opening.

FIG. 9 is a schematic view illustrating the light emitting element ED of FIG. 8 disposed in an opening OP.

Referring to FIG. 9, the light emitting element ED may include a first end where the second semiconductor layer 32 or the electrode layer 37 is located and a second end where the first semiconductor layer 31 is located. The first end of the light emitting element ED may be disposed on a first electrode E1 and may contact a first connection electrode CNE1, and the second end may be exposed above the second insulating layer PAS2 to contact a second connection electrode CNE2. As described above, the length L1 of the light emitting element ED may be smaller than a thickness TH1 of each of the insulating pattern parts IP1 and IP2 of the first insulating layer PAS1 and may be greater than a thickness TH2 of the second insulating layer PAS2. In case that the first end of the light emitting element ED is disposed on the first electrode E1, the second end may be exposed above the second insulating layer PAS2.

In the manufacturing process of the display device 10, the first connection electrodes CNE1 may be formed after the light emitting elements ED are disposed and before the second insulating layer PAS2 is disposed. In case that each of the light emitting elements ED is disposed vertically on a first electrode E1, an end surface of the first end or an upper surface of the electrode layer 37 may contact the first electrode E1. In case that each of the light emitting elements ED is disposed completely vertically, it may be electrically connected to a first connection electrode CNE1 and the first electrode E1 because the first electrode E1 contacts (e. g. directly contact) the end surface of the first end of the light emitting element ED. However, in case that each of the light emitting elements ED is not disposed completely vertically unlike in the drawing, the first end of the light emitting element ED may be electrically connected to the first electrode E1 through the first connection electrode CNE1. Here, the insulating film 38 of each light emitting element ED may be formed to partially expose the side surfaces of the electrode layer 37 or the second semiconductor layer 32 so that the electrode layer 37 or the second semiconductor layer 32 is electrically connected to the first connection electrode CNE1 at the first end of the light emitting element ED.

Similarly, the second connection electrodes CNE2 may be formed after the second insulating layer PAS2 is disposed. The second connection electrodes CNE2 may cover the second ends of the light emitting elements ED protruding above an upper surface of the second insulating layer PAS2. The insulating film 38 of each light emitting element ED may be formed to partially expose the side surfaces of the first semiconductor layer 31 so that a second connection electrode CNE2 is electrically connected to the second end of the light emitting element ED. According to an embodiment, since the insulating film 38 of each light emitting element ED is formed to partially expose the side surfaces of the semiconductor layer or the electrode layer 37, the connection electrodes CNE may be electrically connected to the light emitting element ED by contacting the side surfaces of the ends of the light emitting element ED even if they do not contact the end surfaces of the light emitting element ED.

A process of manufacturing the display device 10 according to an embodiment will now be described with reference to other drawings.

FIGS. 10 through 16 are schematic cross-sectional views illustrating a process of manufacturing a display device according to an embodiment.

FIGS. 10 through 16 are schematic cross-sectional views respectively illustrating structures according to the formation order of each layer in one pixel PX of the display device 10. FIGS. 10 through 16 illustrate an example formation order of electrodes E1 and E2, light emitting elements ED, and connection electrodes CNE disposed in an emission area EMA, which may correspond to the structure illustrated in FIG. 5. A process of forming each layer may be performed by a general patterning process. The formation method of each process will be briefly described below, and the formation order will be described.

Figure 10:
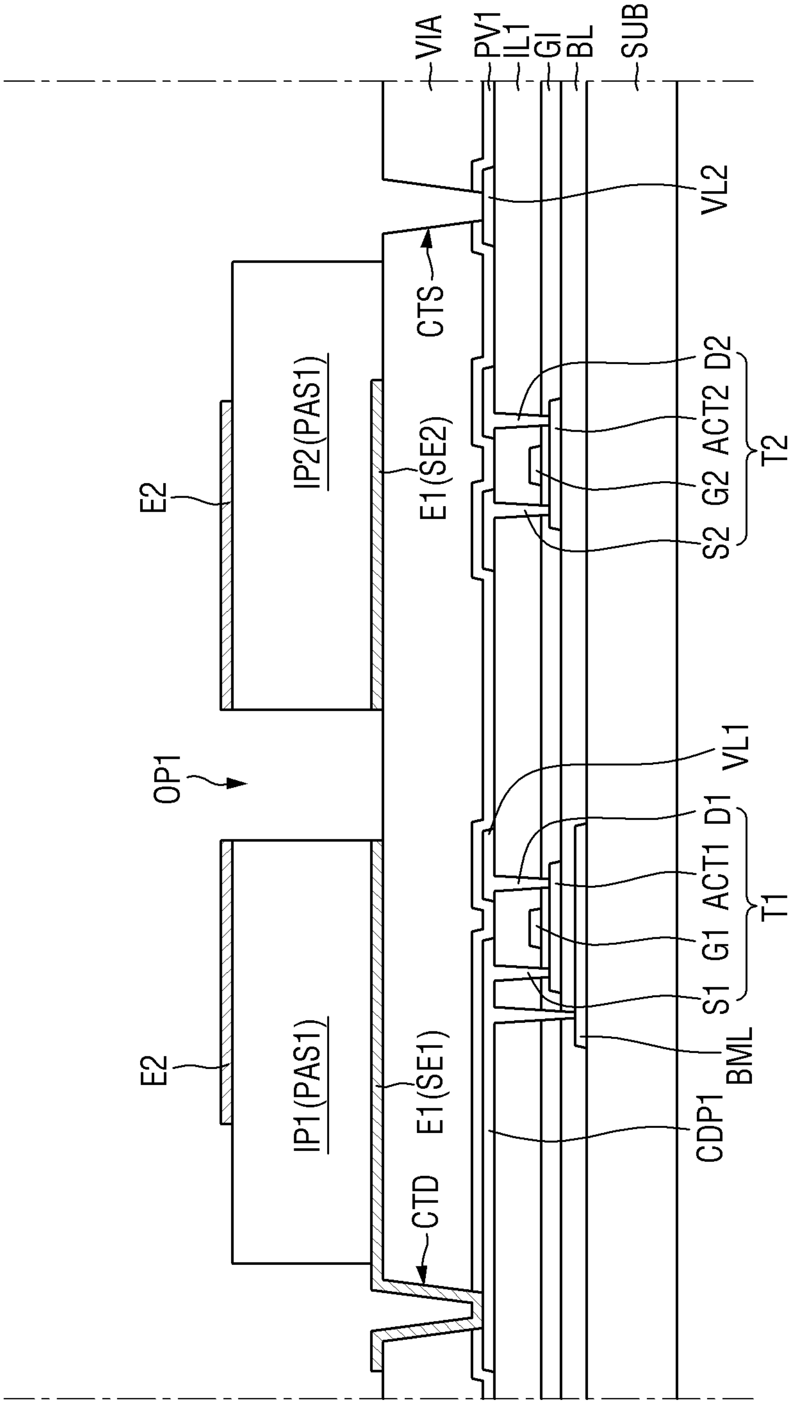
FIGS. 10 through 16 are schematic cross-sectional views illustrating a process of manufacturing a display device according to an embodiment.

First, referring to FIG. 10, a first substrate SUB may be prepared, and first through third conductive layers, a buffer layer BL, a first gate insulating layer GI, a first interlayer insulating layer IL1, a first passivation layer PV1 and a via layer VIA are formed on the first substrate SUB. First electrodes E1, a first insulating layer PAS1, and second electrodes E2 may be formed on the via layer VIA. The first through third conductive layers disposed on the first substrate SUB may be formed by depositing a material that forms each layer, for example, a metal material and patterning the material using a mask. The buffer layer BL, the first gate insulating layer GI, the first interlayer insulating layer IL1, the first passivation layer PV1 and the via layer VIA disposed on the first substrate SUB may be formed by applying a material that forms each layer, for example, an insulating material or patterning the material using a mask if necessary. The first electrodes E1, the first insulating layer PAS1, and the second electrodes E2 may also be formed in a similar manner.

A first contact hole CTD and a third contact hole CTS may be formed in the via layer VIA and the first passivation layer PV1 to penetrate them. The first contact hole CTD and the third contact hole CTS may be partially patterned in the process of forming the first passivation layer PV1 and the via layer VIA and may partially expose upper surfaces of a first conductive pattern CDP1 and a second voltage line VL2, respectively.

The first electrodes E1 may be spaced apart from each other on the via layer VIA, and the first insulating layer PAS1 may be disposed to completely cover the first electrodes E1 in the emission area EMA. The first insulating layer PAS1 may be disposed in the first opening OP1, but may be partially etched in a subsequent process to increase a width of the first opening OP1 and to partially expose the first electrodes E1. Similarly, the second electrodes E2 may be disposed on the first insulating layer PAS1 and may be spaced apart from each other by the same distance as the distance by which the first electrodes E1 are spaced apart from each other. As the second electrodes E2 and the first insulating layer PAS1 are partially etched in a subsequent process, the distance between the first electrodes E1 may become different from the distance between the second electrodes E2.

Figure 11:
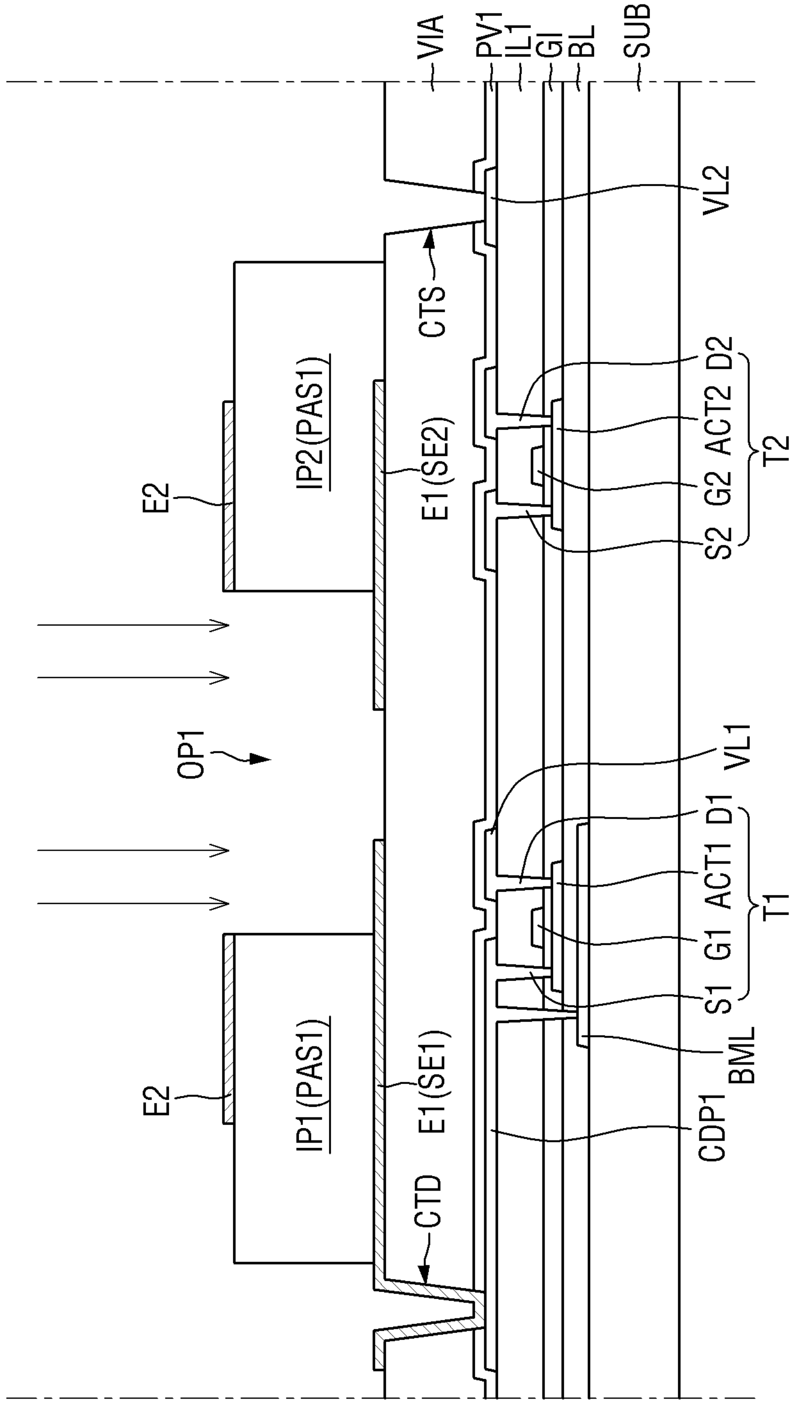

Referring to FIG. 11, a part of the first insulating layer PAS1 and the second electrodes E2 disposed adjacent to a space between the first electrodes E1 may be etched to partially expose upper surfaces of the first electrodes E1. Accordingly, the first opening OP1 of the first insulating layer PAS1 may become wider than its initial width, and sides of parts of the first electrodes E1 which are spaced apart from each other may be partially exposed. Sides of the second electrodes E2 which are spaced apart to face each other may be recessed from the sides of the first electrodes E1, and the distance between the second electrodes E2 may become greater than the distance between the first electrodes E1.

Figure 12:
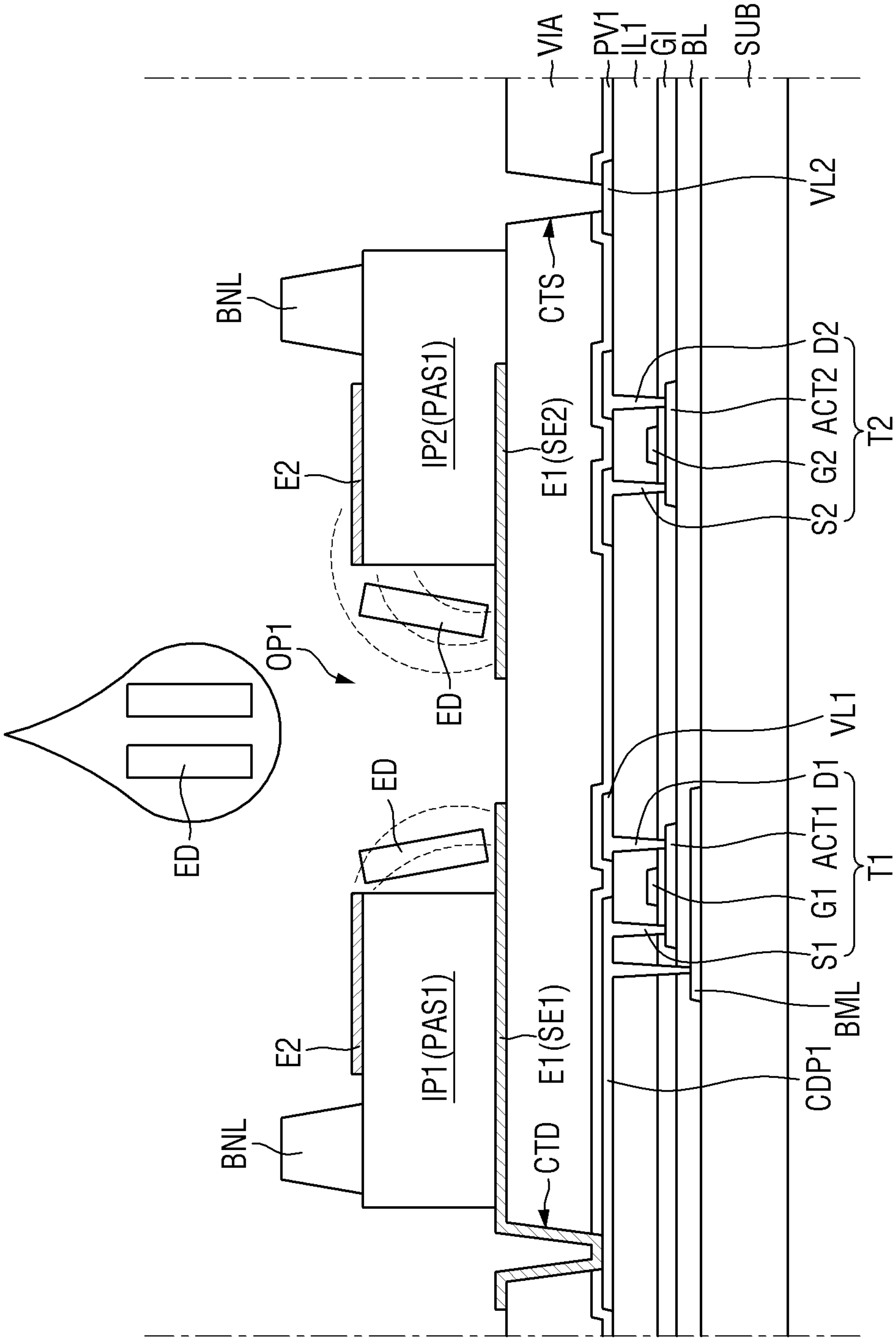
Figure 13:
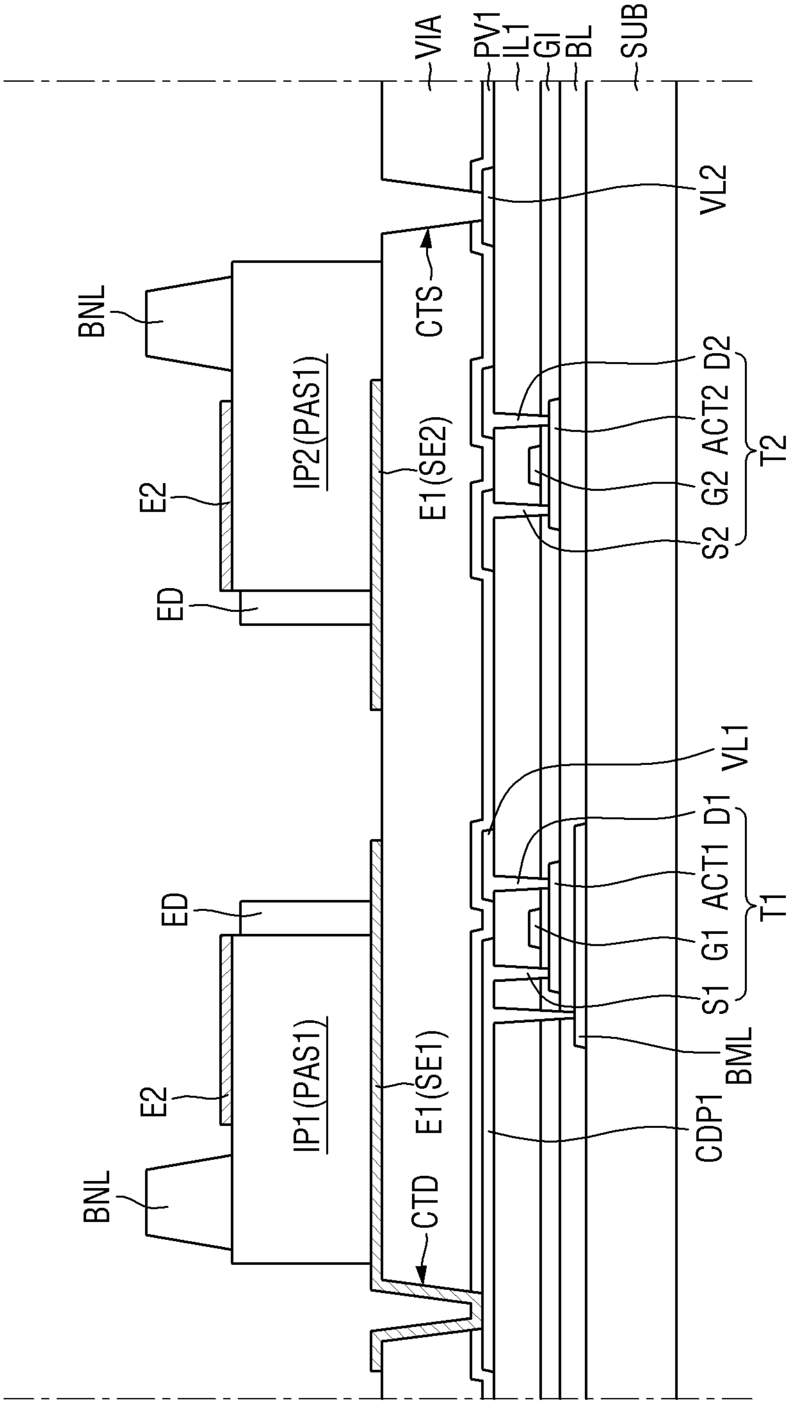

Referring to FIGS. 12 and 13, a bank layer BNL may be formed on the first insulating layer PAS1, and light emitting elements ED may be disposed in the opening OP.

The bank layer BNL may be formed through deposition or coating and patterning processes. The bank layer BNL may be disposed on the first insulating layer PAS1 to surround the emission area EMA and may also surround multiple openings OP not illustrated in the drawings.

In an embodiment, multiple light emitting elements ED may be disposed on the electrodes E1 and E2 by an inkjet printing process. In case that an electrical signal is transmitted to the electrodes E1 and E2 after ink in which the light emitting elements ED are dispersed is sprayed into the opening OP, the light emitting elements ED in the ink may be disposed in the opening OP as their positions and orientation directions change. Although not illustrated in the drawings, each of the electrodes E1 and E2 may be electrically connected to another wiring through an electrode connection part EC1 or EC2 and may receive an electrical signal for aligning the light emitting elements ED from the wiring as described above.

In case that an electrical signal is transmitted to each of the first and second electrodes E1 and E2 disposed in the thickness direction with the first insulating layer PAS1 interposed therebetween, an electrical field perpendicular to the first substrate SUB may be generated between them. The light emitting elements ED may be erected by the force of the electric field so that one end of each of the light emitting elements ED in a longitudinal direction faces an upper surface of the first substrate SUB. In case that the light emitting elements ED are perfectly disposed, first ends of the light emitting elements ED may be disposed on the first electrodes E1, and side surfaces of the light emitting elements ED may contact side surfaces of insulating pattern parts IP1 and IP2 of the first insulating layer PAS1.

Figure 14:
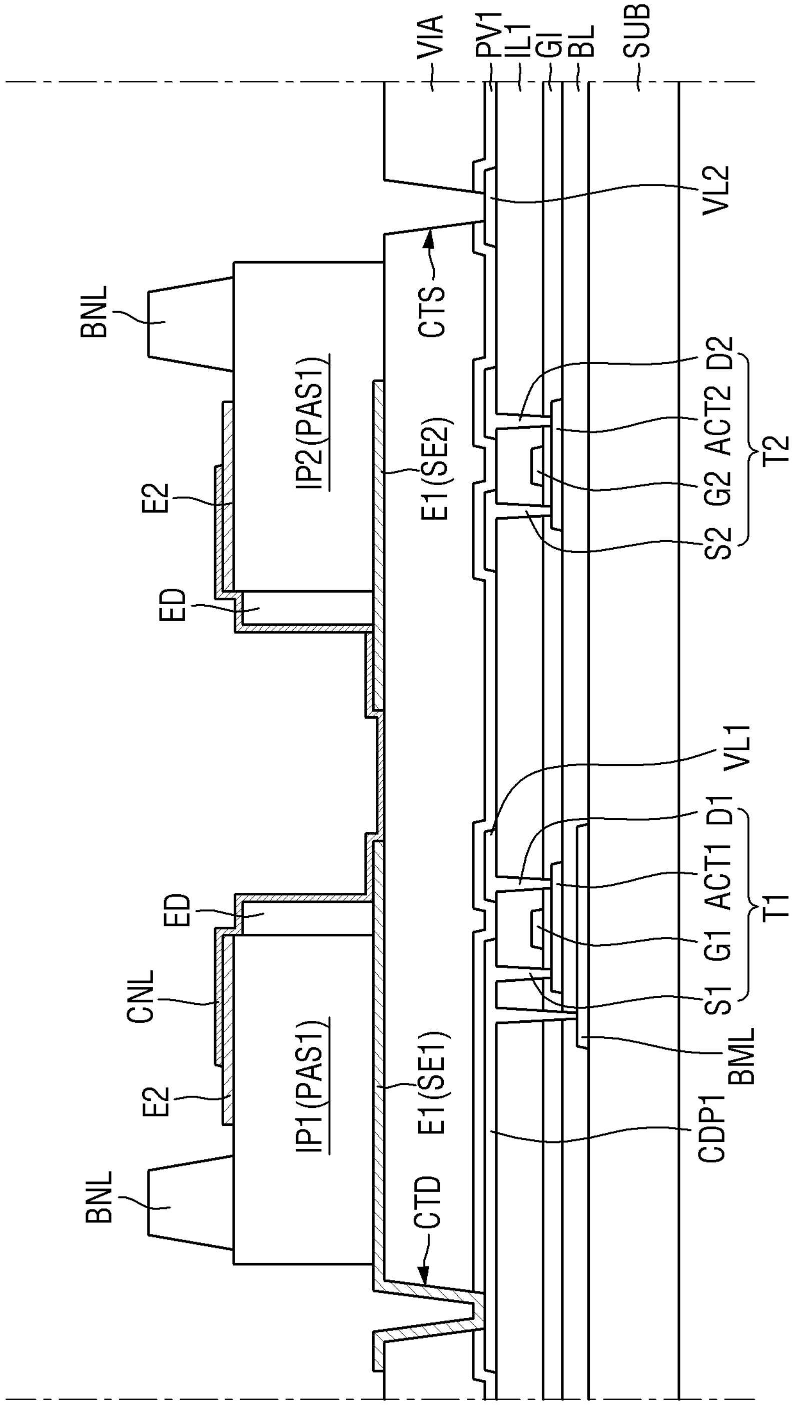
Figure 15:
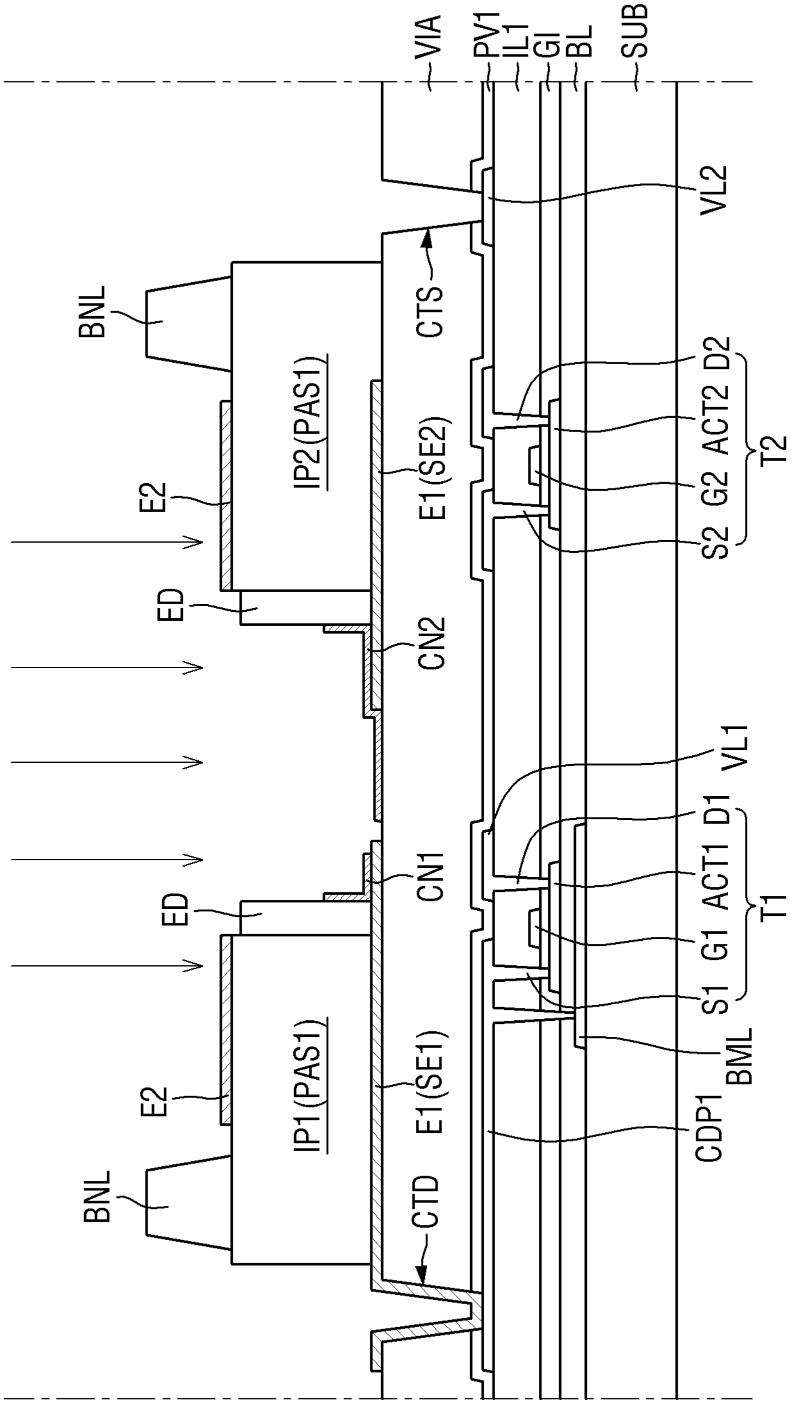

Referring to FIGS. 14 and 15, first connection electrodes CNE1 may be formed to contact the light emitting elements ED and the first electrodes E1 in the opening OP. In the process of forming the first connection electrodes CNE1, a connection electrode layer CNL may be formed to cover the light emitting elements ED as well as the first electrodes E1 and the via layer VIA in the opening OP, and then may be partially patterned into multiple electrode parts CN1 and CN2. In the drawings, only the light emitting elements ED (ED1 and E2) disposed in the first opening OP1, a first electrode part CN1, and a second electrode part CN2 of the first connection electrodes CNE1 are illustrated.

The connection electrode layer CNL may be formed to cover the side surfaces and second ends of the light emitting elements ED disposed in the first opening OP1 and a part of each of the first and second electrodes E1 and E2. The connection electrode layer CNL may be patterned to remove parts disposed on the second ends of the light emitting elements ED, and the second electrodes E2, the via layer VIA, and the first electrodes E1 in the first opening OP1. Accordingly, the connection electrode layer CNL may be separated into separate electrode parts CN1 and CN2.

Figure 16:
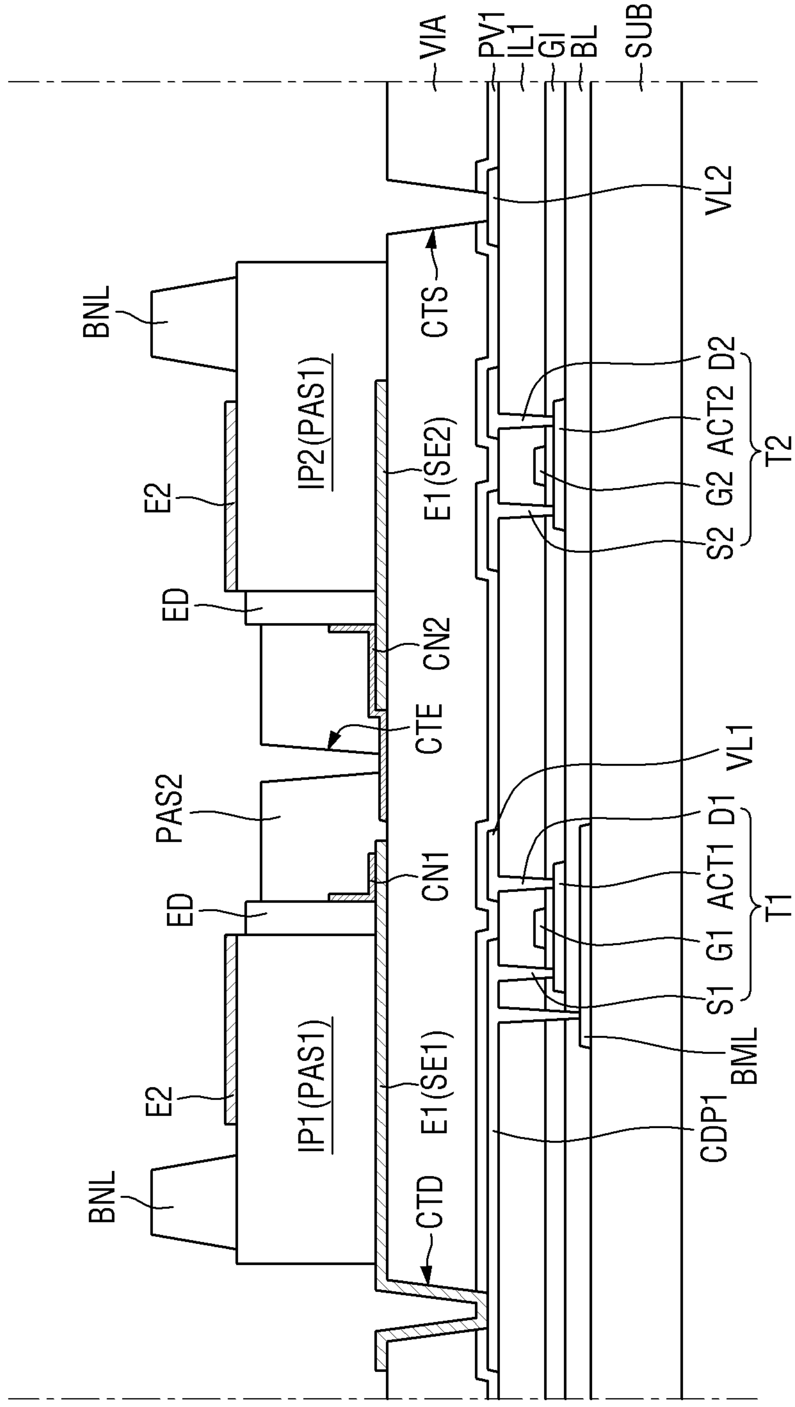

Referring to FIG. 16, a second insulating layer PAS2 may be formed in the opening OP. The second insulating layer PAS2 may be formed by depositing or applying a material that forms the second insulating layer PAS2 and partially patterning the material. Although not illustrated in the drawing, the second insulating layer PAS2 may be formed to completely cover the first insulating layer PAS1, the second electrodes E2 and the opening OP and then may be partially removed to expose the first insulating layer PAS1, the second electrodes E2, and the second ends of the light emitting elements ED. At the same time, a second contact hole CTE penetrating the second insulating layer PAS2 may be formed in an opening, for example, the first opening OP1 in which the light emitting elements ED of different emission groups EMG are disposed together.

Finally, although not illustrated in the drawings, second connection electrodes CNE2 may be formed on the second insulating layer PAS2 and the second electrodes E2 to manufacture the display device 10. The method of forming the second connection electrodes CNE2 may be substantially the same as the method of forming the first connection electrodes CNE1. In the process, a fourth electrode part CN4 among the second connection electrodes CNE2 may contact the second electrode part CN2 of the first connection electrodes CNE1 through the second contact hole CTE of the second insulating layer PAS2, and the light emitting elements ED of different emission groups EMG may be electrically connected to each other.

Various embodiments of the display device 10 will now be described with further reference to other drawings.

Figure 17:
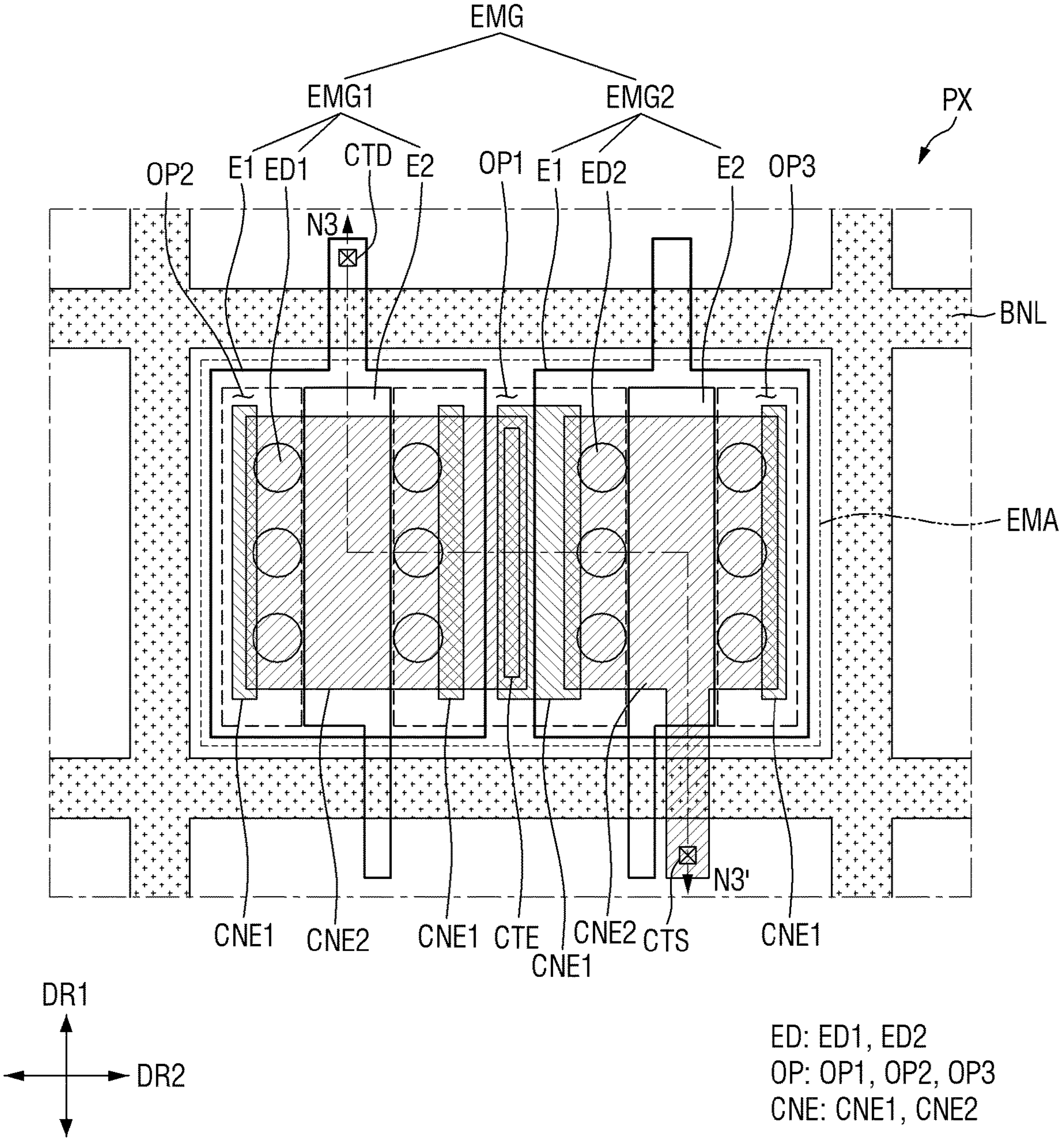
FIG. 17 is a plan view of a pixel of a display device according to an embodiment.
Figure 18:
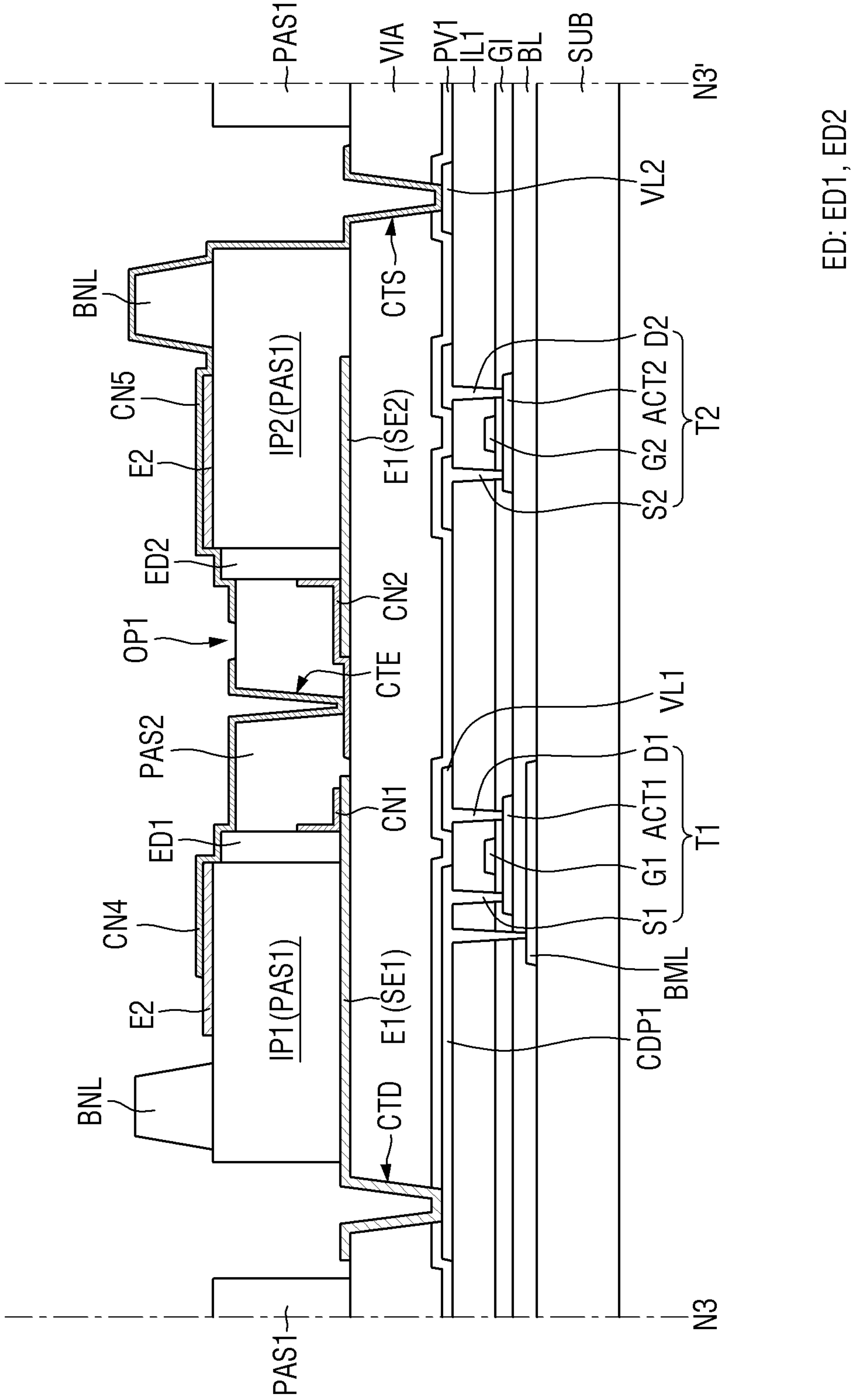
FIG. 18 is a schematic cross-sectional view taken along line N3-N3' of FIG. 17.

FIG. 17 is a plan view of a pixel PX of a display device 10 according to an embodiment. FIG. 18 is a schematic cross-sectional view taken along line N3-N3' of FIG. 17. FIG. 18 illustrates a cross section across a first contact hole CTD, a second contact hole CTE, and a third contact hole CTS of FIG. 17, and across some of light emitting elements ED1 and ED2 of different emission groups EMG.

Referring to FIGS. 17 and 18, in the display device 10 according to the embodiment, a first insulating layer PAS1 may be disposed over the entire display area DPA instead of being disposed to correspond to each pixel PX. The first insulating layer PAS1 may be disposed in the entire display area DPA but may not be disposed in parts corresponding to multiple openings OP1 through OP3 disposed in each emission area EMA, the first contact hole CTD, and the third contact hole CTS. The embodiment is different from the embodiment of FIGS. 2 and 5 in the disposition of the first insulating layer PAS1.

In the embodiment of FIGS. 2 and 5, the first insulating layer PAS1 may be disposed in each pixel PX in the shape of a pattern including sides extending in the first direction DR1 and the second direction DR2. However, in the embodiment, the first insulating layer PAS1 may be disposed in the entire display area DPA and may include multiple openings OP1 through OP3 partially exposing the display area DPA. The first insulating layer PAS1 may be entirely disposed regardless of positions and boundaries of the pixels PX. The first insulating layer PAS1 may include multiple openings OP1 through OP3 formed in the emission area EMA of each pixel PX. The first insulating layer PAS1 may expose the first contact hole CTD and the third contact hole CTS. Although not illustrated in FIG. 17, the first insulating layer PAS1 may be disposed over multiple pixels PX and may include through holes exposing the first contact hole CTD and the third contact hole CTS.

Figure 19:
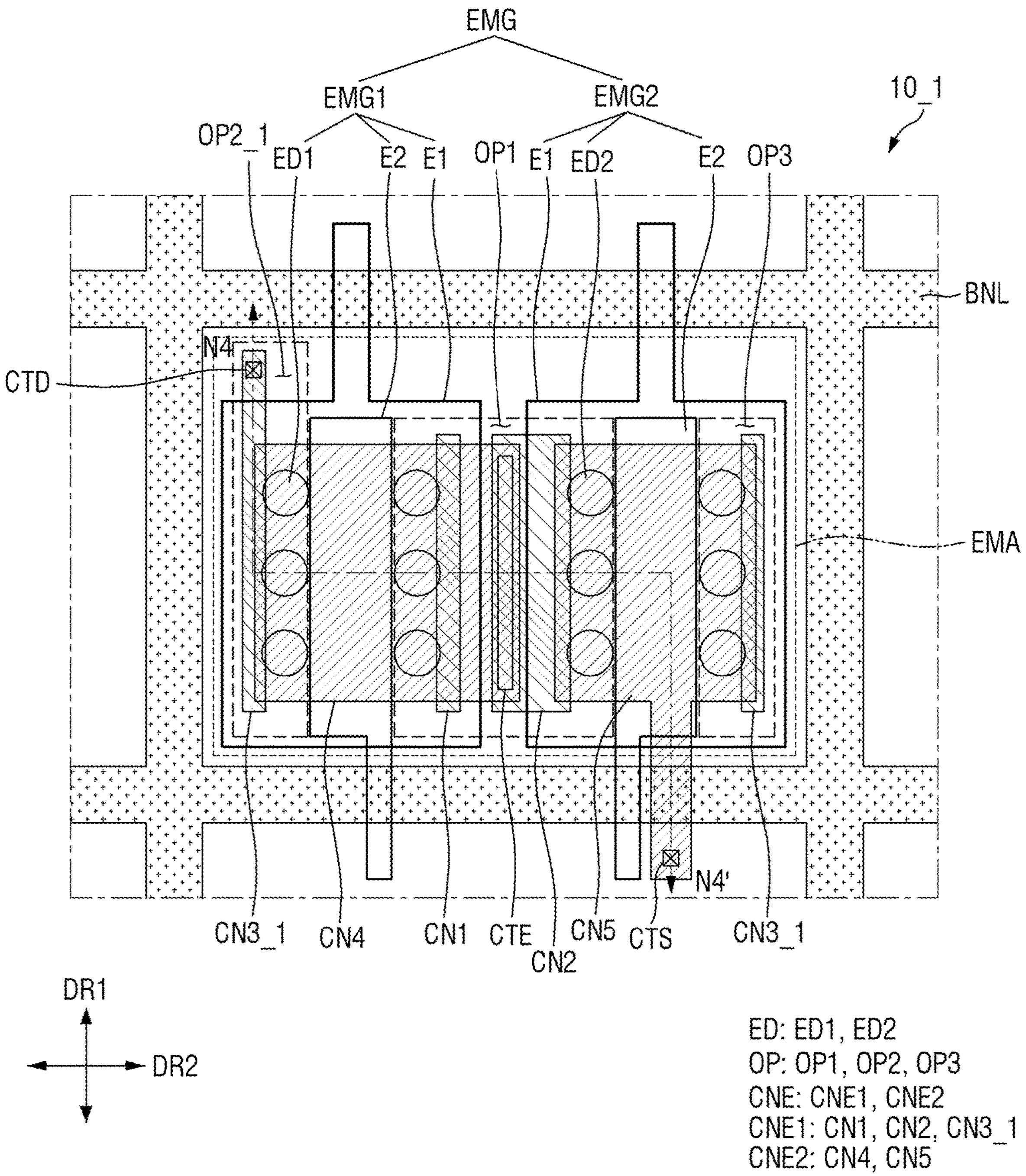
FIG. 19 is a plan view of a pixel of a display device according to an embodiment.
Figure 20:
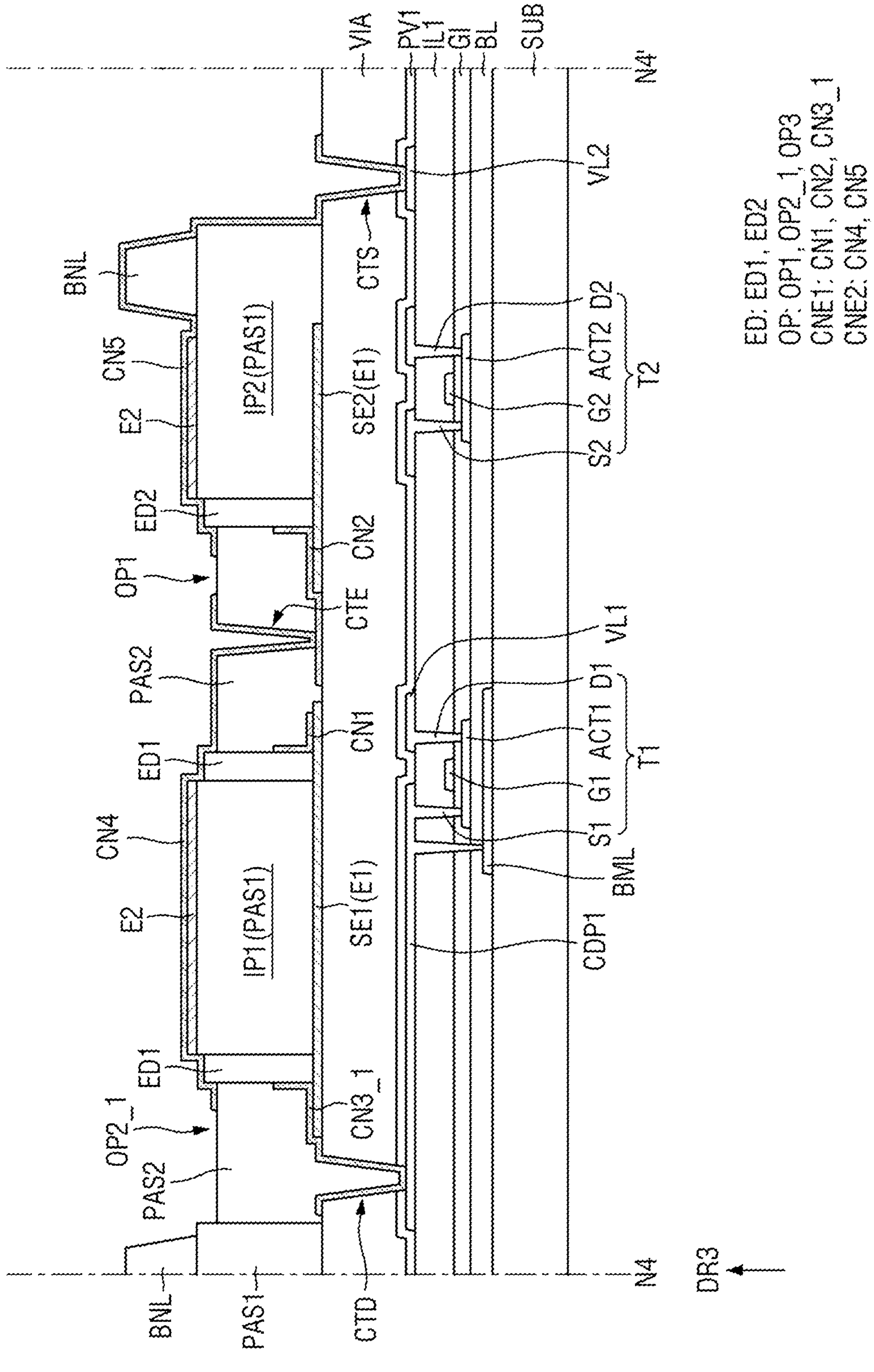
FIG. 20 is a schematic cross-sectional view taken along line N4-N4' of FIG. 19.

FIG. 19 is a plan view of a pixel PX of a display device 10_1 according to an embodiment. FIG. 20 is a schematic cross-sectional view taken along line N4-N4' of FIG. 19. FIG. 20 illustrates a cross section across a first contact hole CTD, a second contact hole CTE, and a third contact hole CTS of FIG. 19, and across some of light emitting elements ED1 and ED2 of different emission groups EMG.

Referring to FIGS. 19 and 20, in the display device 10_1 according to the embodiment, any one of first connection electrodes CNE1 may contact (e. g. directly contact) a conductive layer under a via layer VIA. Among the first connection electrodes CNE1, an electrode part contacting first light emitting elements ED1 of a first emission group EMG1, for example, a third electrode part CN3_1 disposed in a second opening OP2_1 may contact (e. g. directly contact) a first conductive pattern CDP1 of a third conductive layer through the first contact hole CTD disposed in an emission area EMA and penetrating the via layer VIA. The third electrode part CN3_1 disposed in the second opening OP2_1 may be connected (e. g. directly connected) to a first transistor T1, and a first electrode part CN1 disposed in a first opening OP1 may be electrically connected to the third electrode part CN3_1 and the first transistor T1 through a first sub-electrode SE1.

In an embodiment in which two or more emission groups EMG are disposed in each pixel PX, one of the third electrode part CN3_1 among the first connection electrodes CNE1 may contact (e. g. directly contact) the third conductive layer through the first contact hole CTD, and the other third electrode parts CN3_1 may not directly contact the third conductive layer. First electrodes E1 may not be directly connected to the third conductive layer regardless of the emission group EMG they belong to. Each of the first electrodes E1 may be electrically connected to a wiring in a manufacturing process of the display device 10_1 and may be electrically disconnected from the wiring after the light emitting elements ED are disposed.

The embodiment is different from the embodiment of FIGS. 2 through 4 in that the first conductive pattern CDP1 of the third conductive layer is connected (e. g. directly connected) to one of the first connection electrodes CNE1 so that the first transistor T1 may be electrically connected to the first light emitting elements ED of the first emission group EMG1. In order to secure a space for forming the first contact hole CTD which is a connection path between the third electrode part CN3_1 and the third conductive layer, the second opening OP2_1 among the openings OP of the first insulating layer PAS1 may extend longer than other openings in the first direction DR1. However, the disclosure is not limited thereto. In case that the first contact hole CTD is disposed outside of a bank layer BNL as in the embodiment of FIG. 2, any one of the third electrode parts CN3_1 of the first connection electrodes CNE1 may extend beyond the bank layer BNL to outside of the bank layer BNL, and a part of the third electrode part CN3_1 may be disposed on the first insulating layer PAS1 and the bank layer BNL.

Since each of the electrodes E1 and E2 includes a particular metal, contact resistance at a contact part between the connection electrodes CNE and the electrodes E1 and E2 may increase. In the display device 10_1 of the embodiment, any one of the first connection electrodes CNE1 may contact (e. g. directly contact) the third conductive layer. Therefore, even if the contact resistance at the contact part between the electrodes E1 and E2 and the first connection electrodes CNE1 increases, at least some of the first light emitting elements ED1 may emit light, and the light emitting elements ED of the other emission group EMG may be electrically connected to the first transistor T1.

Figure 21:
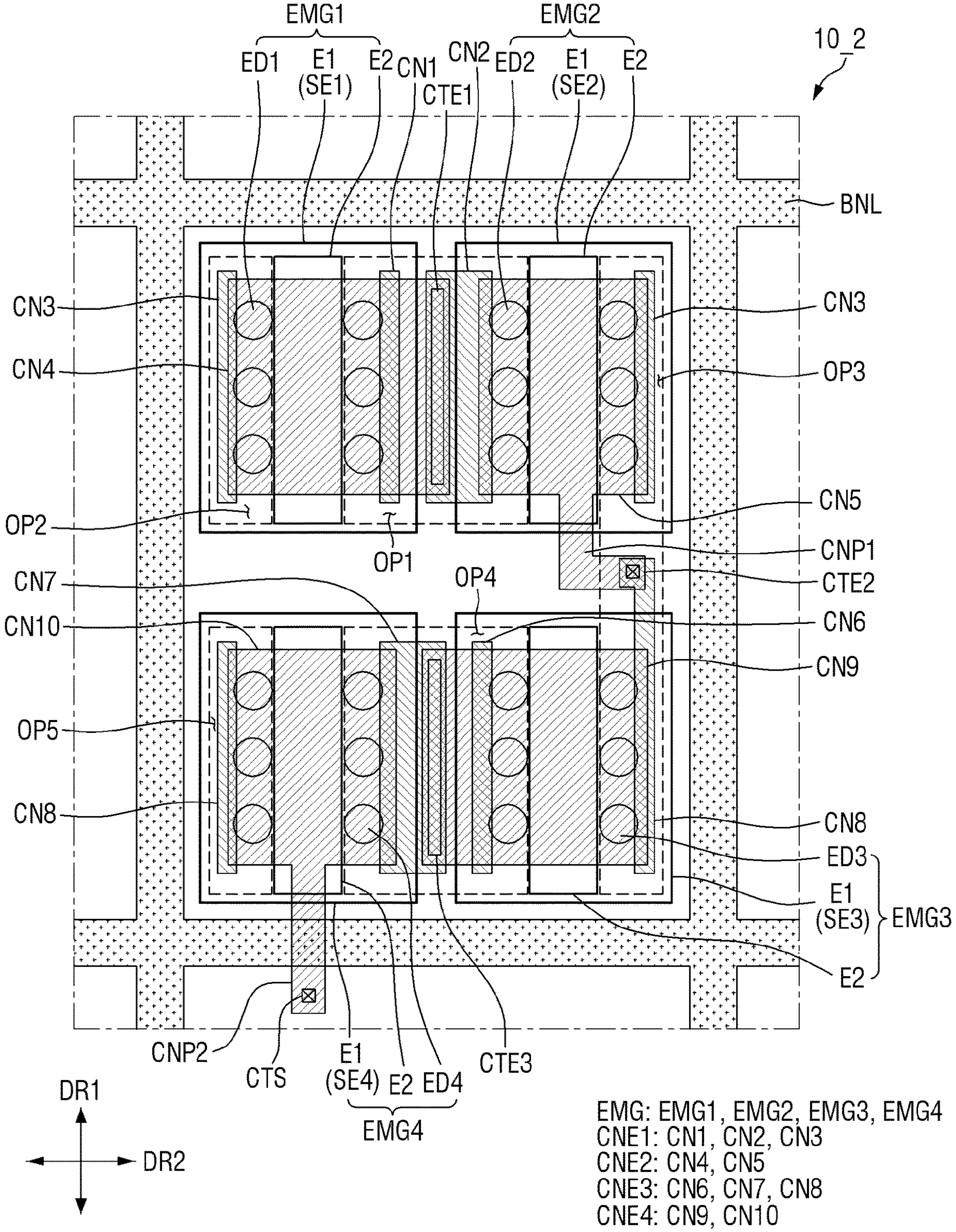
FIGS. 21 and 22 are plan views of pixels of display devices according to embodiments.
Figure 22:
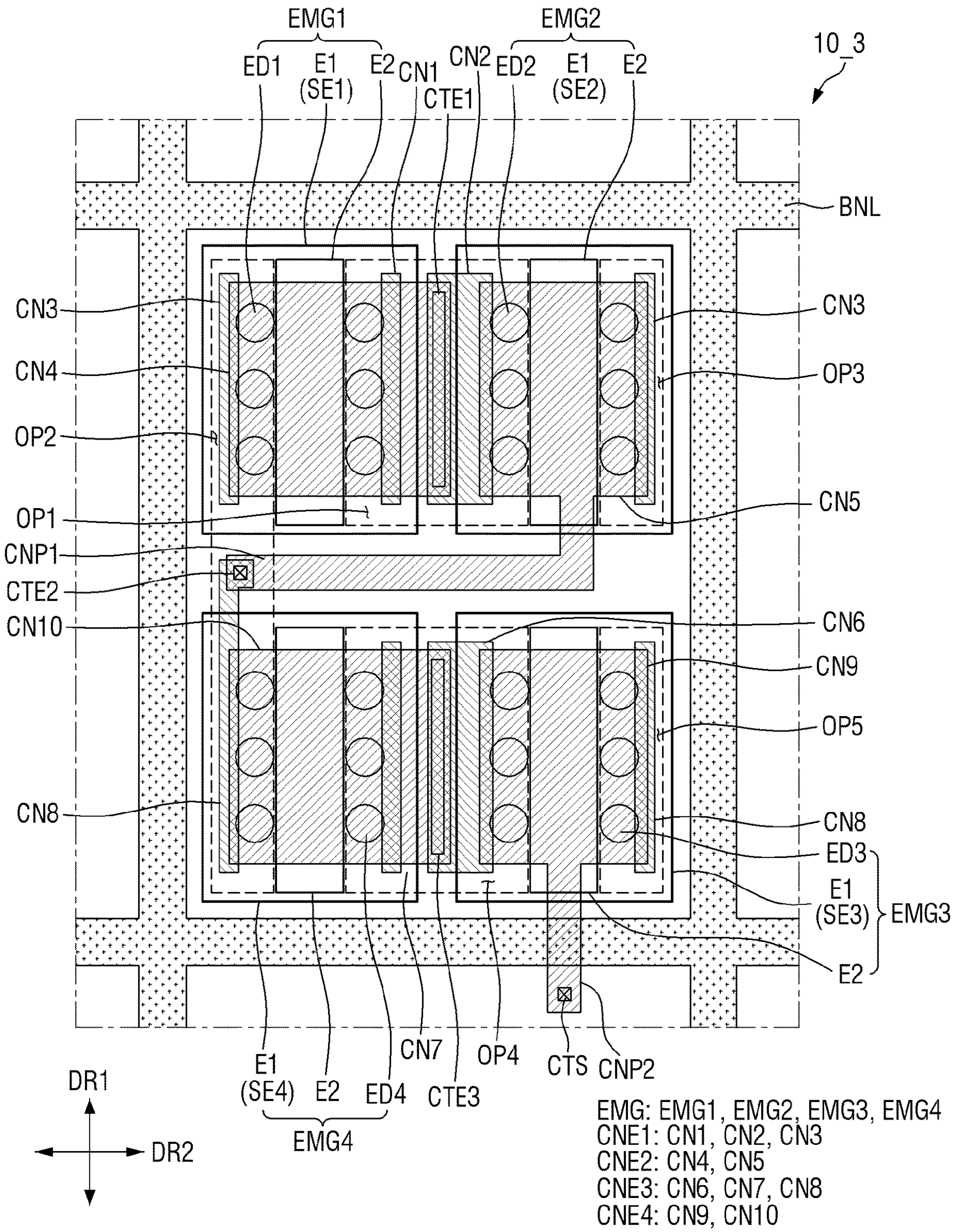

FIGS. 21 and 22 are plan views of pixels PX of display devices 10_2 and 10_3 according to embodiments. FIGS. 21 and 22 illustrate the planar arrangement of multiple emission groups EMG (EMG1 through EMG4) disposed in one pixel PX. For ease of description, only main electrode parts EM1 and EM2 of electrodes E1 and E2 of each emission group EMG are illustrated.

Referring to FIGS. 21 and 22, in each of the display devices 10_2 and 10_3 according to the embodiments, a greater number of emission groups EMG (EMG1 through EMG4) may be disposed in each pixel PX. Accordingly, a greater number of light emitting elements ED (ED1 through ED4), first electrodes E1 and second electrodes E2, and connection electrodes CNE1 through CNE4 may be disposed. Since a greater number of the emission groups EMG are disposed in each pixel PX, luminous efficiency and luminance per unit area of each of the display devices 10_2 and 10_3 may be improved. The arrangement structure of the electrodes E1 and E2 and the connection electrodes CNE1 through CNE4 disposed in each pixel PX may be designed to form an electrical connection between the light emitting elements ED of the emission groups EMG.

In each of the display devices 10_2 and 10_3, four emission groups EMG, for example, a first emission group EMG1, a second emission group EMG2, a third emission group EMG3, and a fourth emission group EMG4, may be disposed in each pixel PX. Accordingly, a greater number of the first electrodes E1 and the second electrodes E2 may be disposed in each pixel PX. The first electrodes E1 may include multiple sub-electrodes SE1 through SE4, for example, a first sub-electrode SE1 of the first emission group EMG1, a second sub-electrode SE2 of the second emission group EMG2, a third sub-electrode SE3 of the third emission group EMG3, and a fourth sub-electrode SE4 of the fourth emission group EMG4. The sub-electrodes SE1 through SE4 may be spaced apart from each other in the first direction DR1 and the second direction DR2. For example, the first sub-electrode SE1 may be disposed on an upper left side of an emission area EMA of each pixel PX, and the second sub-electrode SE2 may be spaced apart from the first sub-electrode SE1 and disposed on a right side of the first sub-electrode SE1, which is the second side in the second direction DR2. The third sub-electrode SE3 may be spaced apart from the second sub-electrode SE2 and disposed on a lower side of the second sub-electrode SE2, which is a second side in the first direction DR1. The fourth sub-electrode SE4 may be spaced apart from the third sub-electrode SE3 and disposed on a left side of the third sub-electrode SE3, which is the first side in the second direction DR1. Although only the main electrode parts of the sub-electrodes SE1 through SE4 are illustrated in the drawings, each of the sub-electrodes SE1 through SE4 may also include an electrode connection part protruding from one side of the main electrode part.

The second electrodes E2 may respectively overlap the sub-electrodes SE1 through SE4 of the first electrodes E1 in the thickness direction with a first insulating layer PAS1 interposed between them. The second electrodes E2 may belong to different emission groups EMG, respectively. The second electrodes E2 may be spaced apart from each other in the first direction DR1 and the second direction DR2, and an insulating pattern part of the first insulating layer PAS1 may be located between the first and second electrodes E1 and E2. Although only the main electrode parts of the second electrodes E2 are illustrated in the drawings, each of the second electrodes E2 may also include an electrode connection part protruding from one side of the main electrode part.

The first insulating layer PAS1 may be disposed to correspond to each pixel PX and may include multiple openings OP (OP1 through OP5). A first opening OP1 may overlap a part of first sub-electrode SE1 and the second sub-electrode SE2 and an area between the first sub-electrode SE1 and the second sub-electrode SE2, and a second opening OP2 and a third opening OP3 may be spaced apart from the first opening OP1 in the second direction DR2. The second opening OP2 may be in contact with the second electrode E2 of the first emission group EMG1, and the third opening OP3 may be in contact with the second electrode E2 of the second emission group EMG2.

A fourth opening OP4 may be spaced apart from the first opening OP1 in the first direction DR1 and may overlap a part of the third sub-electrode SE3 and the fourth sub-electrode SE4 and an area between the third sub-electrode SE3 and the fourth sub-electrode SE4. A fifth opening OP5 may be spaced apart from the fourth opening OP4 in the second direction DR2. Like the first opening OP1 having a greater width than the second opening OP2 and the third opening OP3, the fourth opening OP4 may have the same width as the first opening OP1 and have a greater width than the fifth opening OP5.

The light emitting elements ED may be divided into light emitting elements ED (ED1 through ED4) arranged in different emission groups EMG. First light emitting elements ED1 may be included in the first emission group EMG1 and may be disposed on the first sub-electrode SE1. The first light emitting elements ED1 may be disposed adjacent to sides of the second electrode E2 overlapping the first sub-electrode SE1 in the thickness direction. Second light emitting elements ED2 may be included in the second emission group EMG2 and may be disposed on the second sub-electrode SE2. The second light emitting elements ED2 may be disposed adjacent to sides of the second electrode E2 overlapping the second sub-electrode SE2 in the thickness direction. Third light emitting element ED3 may be included in the third emission group EMG3 and may be disposed on the third sub-electrode SE3. The third light emitting elements ED3 may be disposed adjacent to sides of the second electrode E2 overlapping the third sub-electrode SE3 in the thickness direction. Fourth light emitting element ED4 may be included in the fourth emission group EMG4 and may be disposed on the fourth sub-electrode SE4. The fourth light emitting elements ED4 may be disposed adjacent to sides of the second electrode E2 overlapping the fourth sub-electrode SE4 in the thickness direction.

The positions and the shapes of the second opening OP2, the third opening OP3, and the fifth opening OP5 among the openings OP may vary based on the connection of different emission groups EMG. As described above, different emission groups EMG may be electrically connected to each other through a first connection electrode CNE1 electrically connected to first ends of the light emitting elements ED arranged in any one emission group EMG and a second connection electrode CNE2 electrically connected to second ends of the light emitting elements ED arranged in the other emission group EMG. As described above in FIGS. 2 through 4, in the emission groups EMG neighboring each other in the second direction DR2, a first connection electrode CNE1 and a second connection electrode CNE2 may be electrically connected to each other through a second contact hole CTE disposed in an opening overlapping multiple first electrodes E1. Since each pixel PX includes a greater number of the emission groups EMG, a greater number of the connection electrodes CNE and the second contact holes CTE may be disposed, and their arrangement and the connection relationship may vary based on the electrical connection structure of the emission groups EMG.

For example, in the display device 10_2 of FIG. 21, the first emission group EMG1 and the second emission group EMG2 may be electrically connected, the third emission group EMG3 and the fourth emission group EMG4 may be electrically connected, and the second emission group EMG2 and the third emission group EMG3 may be electrically connected. The third opening OP3 partially overlapping the second sub-electrode SE2 of the second emission group EMG2 may extend longer than the first opening OP1 in the first direction DR1 and may partially overlap the third sub-electrode SE3 of the third emission group EMG3. The fifth opening OP5 may be spaced apart from the fourth opening OP4 and disposed on a left side of the fourth opening OP4, which is the first side in the second direction DR2, and may be in contact with the second electrode E2 of the fourth emission group EMG4.

The connection electrodes CNE may include the first connection electrodes CNE1 electrically connected to the first ends of the light emitting elements ED arranged in the first emission group EMG1 and the second emission group EMG2 and the second connection electrodes CNE2 electrically connected to the second ends of the light emitting elements ED. The connection electrodes CNE may also include third connection electrodes CNE3 electrically connected to the first ends of the light emitting elements ED arranged in the third emission group EMG3 and the fourth emission group EMG4 and fourth connection electrodes CNE4 electrically connected to the second ends of the light emitting elements ED.

The first connection electrodes CNE1 may include a first electrode part CN1, a second electrode part CN2, and multiple third electrode parts CN3. The second connection electrodes CNE2 may include a fourth electrode part CN4 and a fifth electrode part CN5. Their arrangement and the connection relationship with the light emitting elements ED are the same as those described above, and thus a detailed description thereof will be omitted.

Like the first connection electrodes CNE1, the third connection electrodes CNE3 may be disposed under a second insulating layer PAS2. The third connection electrodes CNE3 may include a sixth electrode part CN6, a seventh electrode part CN7, and multiple eighth electrode parts CN8. The sixth electrode part CN6 may be disposed in the fourth opening OP4 to contact first ends of the third light emitting elements ED3 and the third sub-electrode SE3. The seventh electrode part CN7 may be disposed in the fourth opening OP4 to contact first ends of the fourth light emitting elements ED4 and the fourth sub-electrode SE4. Like the first electrode part CN1 and the second electrode part CN2, the sixth electrode part CN6 and the seventh electrode part CN7 may be spaced apart from each other in the second direction DR2, and the seventh electrode part CN7 may have a greater width than the sixth electrode part CN6.

The eighth electrode parts CN8 may be disposed in the third opening OP3 and the fifth opening OP5, respectively. One of the eighth electrode parts CN8 may contact the third light emitting elements ED3 and the third sub-electrode SE3 in the third opening OP3, and the other eighth electrode parts CN8 may contact the fourth light emitting elements ED4 and the fourth sub-electrode SE4 in the fifth opening OP5.

Like the second connection electrodes CNE2, the fourth connection electrodes CNE4 may be disposed on the second insulating layer PAS2. The fourth connection electrodes CNE4 may include a ninth electrode part CN9 and a tenth electrode part CN10. The ninth electrode part CN9 may be disposed on the second electrode E2 arranged in the third emission group EMG3 and may contact second ends of the third light emitting elements ED3 and the second electrode E2. The ninth electrode part CN9 may be large enough to cover the second electrode E2 and the second ends of the third light emitting elements ED3. The tenth electrode part CN10 may be disposed on the second electrode E2 arranged in the fourth emission group EMG4 and may contact second ends of the fourth light emitting elements ED4 and the second electrode E2. The tenth electrode part CN10 may be large enough to cover the second electrode E2 and the second ends of the fourth light emitting elements ED4.

The light emitting elements ED arranged in different emission groups EMG may be electrically connected because any one of the first connection electrodes CNE1 and any one of the second connection electrodes CNE2 may contact each other through the second contact hole CTE (CTE1, CTE2 or CTE3). Since each pixel PX includes a greater number of the emission groups EMG, the number of the second contact holes CTE may be increased.

For example, the first light emitting elements ED1 and the second light emitting elements ED2 may be electrically connected to each other because the fourth electrode part CN4 and the second electrode part CN2 contact each other. A part of the fourth electrode part CN4 may overlap the second electrode part CN2 in the thickness direction, and the fourth electrode part CN4 and the second electrode part CN2 may be electrically connected to each other through a first sub-contact hole CTE1 formed in the first opening OP1.

The second light emitting elements ED2 and the third light emitting elements ED3 may be electrically connected to each other because the fifth electrode part CN5 and any one of the eighth electrode parts CN8 contact each other. The fifth electrode part CN5 may include a first electrode extension part CNP1 protruding from a lower side thereof. The first electrode extension part CNP1 may protrude in the first direction DR1 and then may be bent in the second direction DR2 to overlap the eighth electrode part CN8 in the third opening OP3. The eighth electrode part CN8 disposed in the third opening OP3 may extend longer than the other eighth electrode part CN8 or the sixth electrode part CN6 in the first direction DR1 and may overlap the first electrode extension part CNP1 in the thickness direction. The first electrode extension part CNP1 and the eighth electrode part CN8 may be electrically connected to each other through a second sub-contact hole CTE2 formed in the third opening OP3, and the fifth electrode part CN5 and the eighth electrode part CN8 disposed in the third opening OP3 may be electrically connected to each other.

The third light emitting elements ED3 and the fourth light emitting elements ED4 may be electrically connected to each other because the ninth electrode part CN9 and the seventh electrode part CN7 contact each other. A part of the ninth electrode part CN9 may overlap the seventh electrode part CN7 in the thickness direction, and the ninth electrode part CN9 and the seventh electrode part CN7 may be electrically connected to each other through a third sub-contact hole CTE3 formed in the fourth opening OP4.

The tenth electrode part CN10 may include a second electrode extension part CNP2 protruding from a lower side thereof, and the second electrode extension part CNP2 may protrude in the first direction DR1 to extend beyond a bank layer BNL. The second electrode extension part CNP2 may be electrically connected to a second voltage line VL2 through a third contact hole CTS outside of the bank layer BNL.

In the display device 10_2 of FIG. 21, the second light emitting elements ED2 may be electrically connected to the third light emitting elements ED3, and the second sub-contact hole CTE2 through which electrode parts electrically connecting the second and third light emitting elements ED2 and ED3, for example, the fifth electrode part CN5 and the eighth electrode part CN8 are electrically connected may be formed in the third opening OP3. As in the first opening OP1 and the fourth opening OP4, in the third opening OP3, the light emitting elements ED arranged in different emission groups EMG may be disposed, and a second contact hole CTE may be formed.

In the display device 10_3 of FIG. 22, the second light emitting elements ED2 may be electrically connected to the fourth light emitting elements ED4. The second opening OP2 partially overlapping the first sub-electrode SE1 of the first emission group EMG1 may extend longer than the first opening OP1 in the first direction DR1 and may partially overlap the fourth sub-electrode SE4 of the fourth emission group EMG4. The fifth opening OP5 may be spaced apart from the fourth opening OP4 and disposed on a right side of the fourth opening OP4 which is the second side in the second direction DR2 and may be in contact with the second electrode E2 of the third emission group EMG3. The embodiment of FIG. 22 is different from the embodiment of FIG. 21 in the shapes of the connection electrodes CNE and the openings OP because the second light emitting elements ED2 are electrically connected to the fourth light emitting elements ED4. Differences from the embodiment of FIG. 21 will be described below, and any redundant description will be omitted.

The third connection electrodes CNE3 may include a sixth electrode part CN6, a seventh electrode part CN7, and multiple eighth electrode parts CN8. The sixth electrode part CN6 may be disposed in the fourth opening OP4 to contact the first ends of the third light emitting elements ED3 and the third sub-electrode SE3. The seventh electrode part CN7 may be disposed in the fourth opening OP4 to contact the first ends of the fourth light emitting elements ED4 and the fourth sub-electrode SE4. Like the first electrode part CN1 and the second electrode part CN2, the sixth electrode part CN6 and the seventh electrode part CN7 may be spaced apart from each other in the second direction DR2, and the sixth electrode part CN6 may have a greater width than the seventh electrode part CN7.

The eighth electrode parts CN8 may be disposed in the third opening OP3 and the fifth opening OP5, respectively. One of the eighth electrode parts CN8 may contact the third light emitting elements ED3 and the third sub-electrode SE3 in the third opening OP3, and the other eighth electrode parts CN8 may contact the fourth light emitting elements ED4 and the fourth sub-electrode SE4 in the fifth opening OP5.

The fourth connection electrodes CNE4 may include a ninth electrode part CN9 and a tenth electrode part CN10. The ninth electrode part CN9 may be disposed on the second electrode E2 arranged in the third emission group EMG3 and may contact the second ends of the third light emitting elements ED3 and the second electrode E2. The tenth electrode part CN10 may be disposed on the second electrode E2 arranged in the fourth emission group EMG4 and may contact the second ends of the fourth light emitting elements ED4 and the second electrode E2.

The second light emitting elements ED2 and the fourth light emitting elements ED4 may be electrically connected to each other because the fifth electrode part CN5 and any one of the eighth electrode parts CN8 contact each other. The fifth electrode part CN5 may include a first electrode extension part CNP1 protruding from a lower side thereof. The first electrode extension part CNP1 may protrude in the first direction DR1 and then may be bent in the second direction DR2 to overlap the eighth electrode part CN8 in the second opening OP2. The eighth electrode part CN8 disposed in the second opening OP2 may extend longer than the other eighth electrode part CN8 or the sixth electrode part CN6 in the first direction DR1 and may overlap the first electrode extension part CNP1 in the thickness direction. The first electrode extension part CNP1 and the eighth electrode part CN8 may be electrically connected to each other through a second sub-contact hole CTE2 formed in the second opening OP2, and the fifth electrode part CN5 and the eighth electrode part CN8 disposed in the second opening OP2 may be electrically connected to each other.

The third light emitting elements ED3 and the fourth light emitting elements ED4 may be electrically connected to each other because the tenth electrode part CN10 and the sixth electrode part CN6 contact each other. A part of the tenth electrode part CN10 may overlap the sixth electrode part CN6 in the thickness direction, and the tenth electrode part CN10 and the sixth electrode part CN6 may be electrically connected to each other through a third sub-contact hole CTE3 formed in the fourth opening OP4.

The ninth electrode part CN9 may include a second electrode extension part CNP2 protruding from a lower side thereof, and the second electrode extension part CNP2 may protrude in the first direction DR1 to extend beyond a bank layer BNL. The second electrode extension part CNP2 may be electrically connected to a second voltage line VL2 through a third contact hole CTS outside of the bank layer BNL.

In the display device 10_3 of FIG. 22, the second light emitting elements ED2 may be electrically connected to the fourth light emitting elements ED4, and the second sub-contact hole CTE2 through which electrode parts electrically connecting the second and fourth light emitting elements ED2 and ED4, for example, the fifth electrode part CN5 and the eighth electrode part CN8 are electrically connected may be formed in the second opening OP2. As in the first opening OP1 and the fourth opening OP4, in the second opening OP2, the light emitting elements ED arranged in different emission groups EMG may be disposed, and a second contact hole CTE may be formed.

In each of the display devices 10_2 and 10_3 of FIGS. 21 and 22, four emission groups EMG may be disposed in each pixel PX, and the light emitting elements ED of the emission groups EMG may be electrically connected to each other through different connection electrodes CNE. Since the light emitting elements ED disposed in each pixel PX are disposed upright in the openings of the first passivation layer PAS1, it may be relatively free to place a greater number of the light emitting elements ED per unit area by differently designing the arrangement structure of the electrodes E1 and E2 in the area surrounded by the bank layer BNL. The light emitting elements ED may be electrically connected in series by designing the arrangement of the openings OP of the first insulating layer PAS1 and the connection electrodes CNE to correspond to the arrangement structure of the electrodes E1 and E2. In each of the display devices 10_2 and 10_3 according to the embodiments, light output efficiency and luminance per unit area can be further improved.

In the above-described embodiments, the first electrodes E1 and the second electrodes E2 may be spaced apart in the first direction DR1 or the second direction DR2, and each side of the first and second electrodes E1 and E2 may extend in the first direction DR1 or the second direction DR2. Accordingly, the light emitting elements ED arranged in the same emission group EMG may be spaced apart from each other in the first direction DR1 or the second direction DR2. However, the shape and the arrangement of the emission groups EMG in each pixel PX of the display device 10 are not limited thereto. The shape and the arrangement of the emission groups EMG can be variously changed as long as a greater number of the light emitting elements ED may be disposed per unit area.

Figure 23:
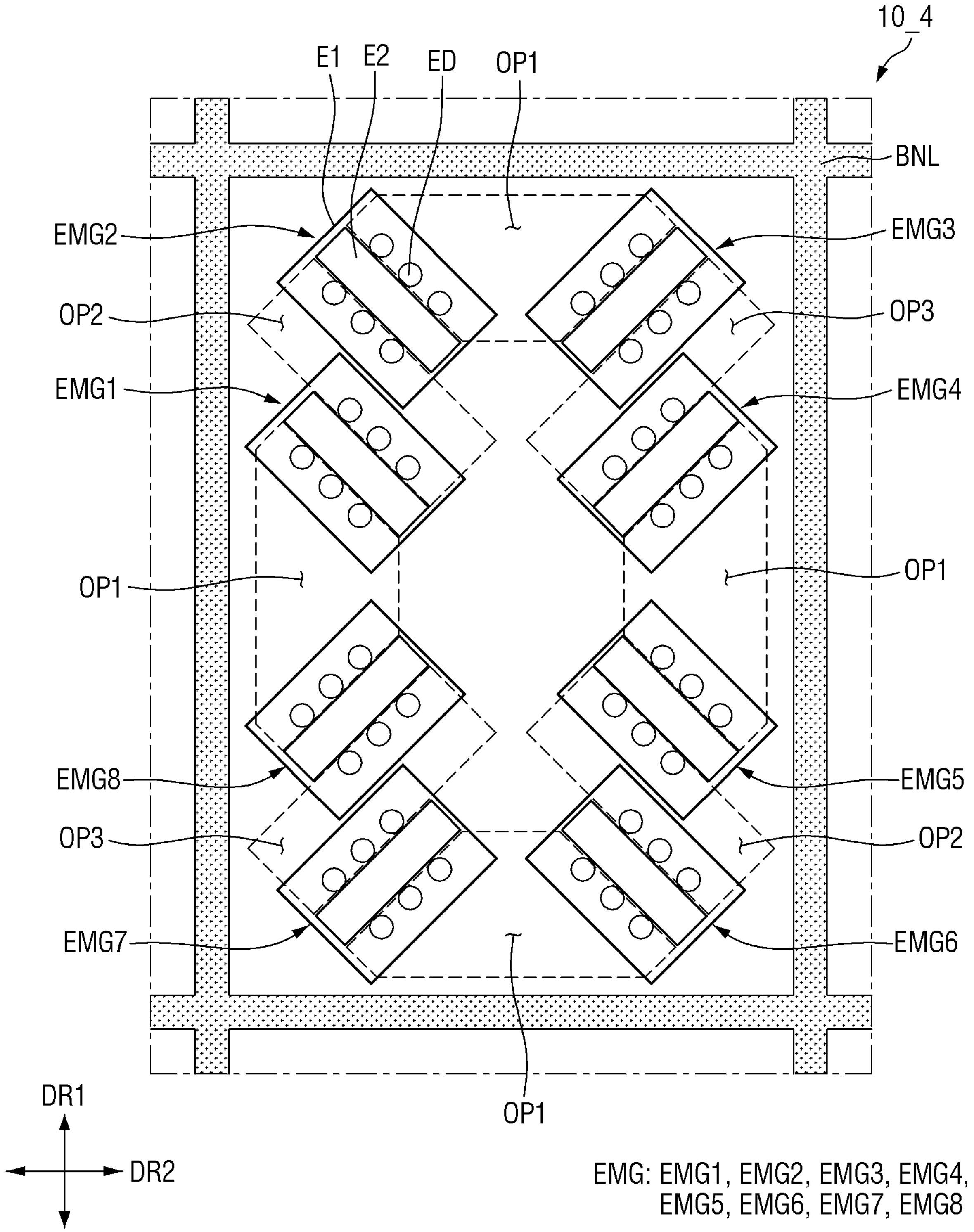
FIG. 23 is a plan view illustrating the relative arrangement of electrodes, openings, and light emitting elements in a pixel of a display device according to an embodiment.
Figure 24:
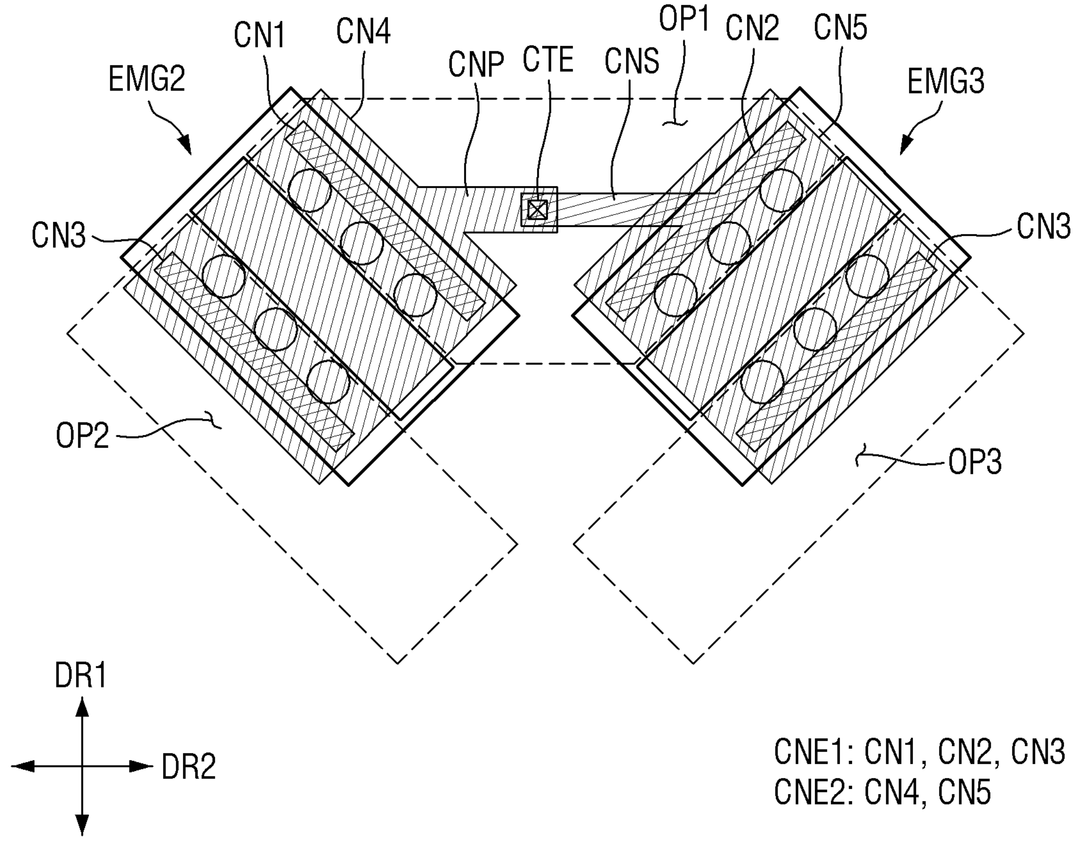
FIG. 24 is a plan view illustrating the relative arrangement of some emission groups and connection electrodes in the display device of FIG. 23.

FIG. 23 is a plan view illustrating the relative arrangement of electrodes E1 and E2, openings OP, and light emitting elements ED in a pixel PX of a display device 10_4 according to an embodiment. FIG. 24 is a plan view illustrating the relative arrangement of some emission groups EMG and connection electrodes CNE in the display device 10_4 of FIG. 23. FIG. 23 illustrates the planar arrangement of multiple emission groups EMG (EMG1 through EMG8) disposed in one pixel PX. FIG. 24 illustrates part of connection electrodes CNE electrically connecting the light emitting elements ED of different emission groups EMG adjacent to each other. For ease of description, FIG. 23 illustrates only shapes of main electrode parts of the electrodes E1 and E2 and the light emitting elements ED in each emission group EMG and shapes of the openings OP of a first insulating layer PAS1, and FIG. 24 illustrates the arrangement of the connection electrodes CNE disposed between the light emitting elements ED of different emission groups EMG.

Referring to FIGS. 23 and 24, in the display device 10_4 according to the embodiment, multiple first electrodes E1 and multiple second electrodes E2 may extend in a diagonal direction between the first direction DR1 and the second direction DR2, and the light emitting elements ED arranged in the same emission group EMG may be arranged and spaced apart from each other in the diagonal direction. Multiple emission groups EMG may be disposed in each pixel PX, and their light emitting elements ED may be arranged in the same direction. The emission groups EMG adjacent to each other may form one pair. A second opening OP2 or a third opening OP3 extending in the diagonal direction may be disposed between the second electrodes SE2 of one pair of the emission groups EMG, and a first opening OP1 having a trapezoidal shape in a plan view may be disposed between the second electrodes E2 of different pairs of the emission groups EMG. Since the shapes of the electrodes E1 and E2 included in each emission group EMG and the arrangement of the light emitting elements ED are substantially the same as those described above, the following description will focus on differences.

First through eighth emission groups EMG1 through EMG8 may be disposed in each pixel PX. The first emission group EMG1 and the second emission group EMG2 may be disposed as a pair on an upper left side of each pixel PX. The first electrodes E1 of the first emission group EMG1 and the second emission group EMG2 may partially overlap the second opening OP2. The second electrodes E2 of the first emission group EMG1 and the second emission group EMG2 may extend in a first diagonal direction sloping from the first direction DR1 to the left side, which is the first side in the second direction DR2. The light emitting elements ED of the first emission group EMG1 and the second emission group EMG2 may be arranged in the first diagonal direction.

The third emission group EMG3 and the fourth emission group EMG4 may be spaced apart from the first emission group EMG1 and the second emission group EMG2 in the second direction DR2 and may be disposed as a pair on an upper right side of each pixel PX. The first electrodes E1 of the first emission group EMG1 and the second emission group EMG2 may partially overlap the third opening OP3. The second electrodes E2 of the third emission group EMG3 and the fourth emission group EMG4 may extend in a second diagonal direction sloping from the first direction DR1 to the right side, which is the second side in the second direction DR2. The light emitting elements ED of the third emission group EMG3 and the fourth emission group EMG4 may be arranged in the second diagonal direction.

Similarly, the fifth emission group EMG5 and the sixth emission group EMG6 may be spaced apart from the third emission group EMG3 and the fourth emission group EMG4 in the first direction DR1 and may be disposed as a pair on a lower right side of each pixel PX. The first electrodes E1 of the fifth emission group EMG5 and the sixth emission group EMG6 may partially overlap the second opening OP2. The second electrodes E2 of the fifth emission group EMG5 and the sixth emission group EMG6 may extend in the first diagonal direction. The light emitting elements ED of the fifth emission group EMG5 and the sixth emission group EMG6 may be arranged in the first diagonal direction.

The seventh emission group EMG7 and the eighth emission group EMG8 may be spaced apart from the fifth emission group EMG5 and the sixth emission group EMG6 in the second direction DR2 and may be disposed as a pair on a lower left side of each pixel PX. The first electrodes E1 of the seventh emission group EMG7 and the eighth emission group EMG8 may partially overlap the third opening OP3. The second electrodes E2 of the seventh emission group EMG7 and the eighth emission group EMG8 may extend in the second diagonal direction. The light emitting elements ED of the seventh emission group EMG7 and the eighth emission group EMG8 may be arranged in the second diagonal direction.

Different light emitting elements ED located in a pair of the emission groups EMG may be electrically connected to each other through a second connection electrode CNE2 electrically connected to one emission group EMG and a first connection electrode CNE1 electrically connected to the other emission group EMG. Different light emitting elements ED located in different pairs of the emission groups EMG may also be electrically connected to each other because a first connection electrode CNE1 and a second connection electrode CNE2 contact each other through a second contact hole CTE located in the first opening OP1.

For example, the light emitting elements ED of the second emission group EMG2 may have first ends in contact with a first electrode part CN1 or a third electrode part CN3 and second ends in contact with a fourth electrode part CN4. The light emitting elements ED of the third emission group EMG3 may have first ends in contact with a second electrode part CN2 or a third electrode part CN3 and second ends in contact with a fifth electrode part CN5. The first electrodes E1 of the second emission group EMG2 and the third emission group EMG3 may overlap the first opening OP1 having a trapezoidal shape, and the second contact hole CTE may be formed in the first opening OP1. The fourth electrode part CN4 may include an electrode extension part CNP extending in the second direction DR2 in the first opening OP1, and the second electrode part CN2 may include an electrode protrusion part CNS extending in the second direction DR2 in the first opening OP1. The electrode extension part CNP of the fourth electrode part CN4 may contact the electrode protrusion part CNS of the second electrode part CN2 through the second contact hole CTE, and the light emitting elements ED of the second emission group EMG2 may be electrically connected to the light emitting elements ED of the third emission group EMG3. Although not illustrated in the drawings, the electrical connection between the light emitting elements ED of different emission groups EMG is the same as that described above with reference to other drawings and FIG. 24, and thus a detailed description thereof will be omitted.

Figure 25:
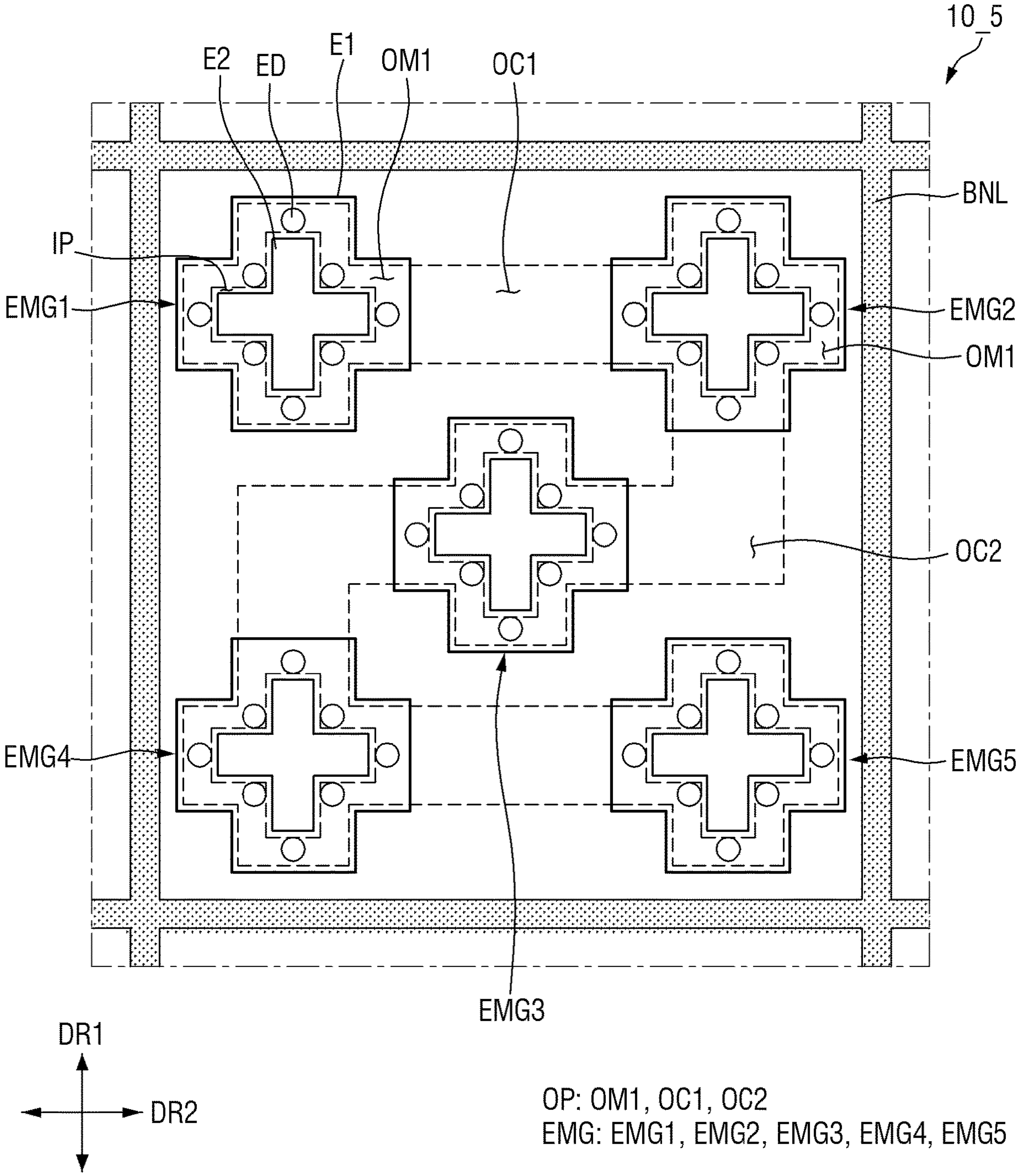
FIG. 25 is a plan view illustrating the relative arrangement of electrodes, an opening, and light emitting elements in a pixel of a display device according to an embodiment.
Figure 26:
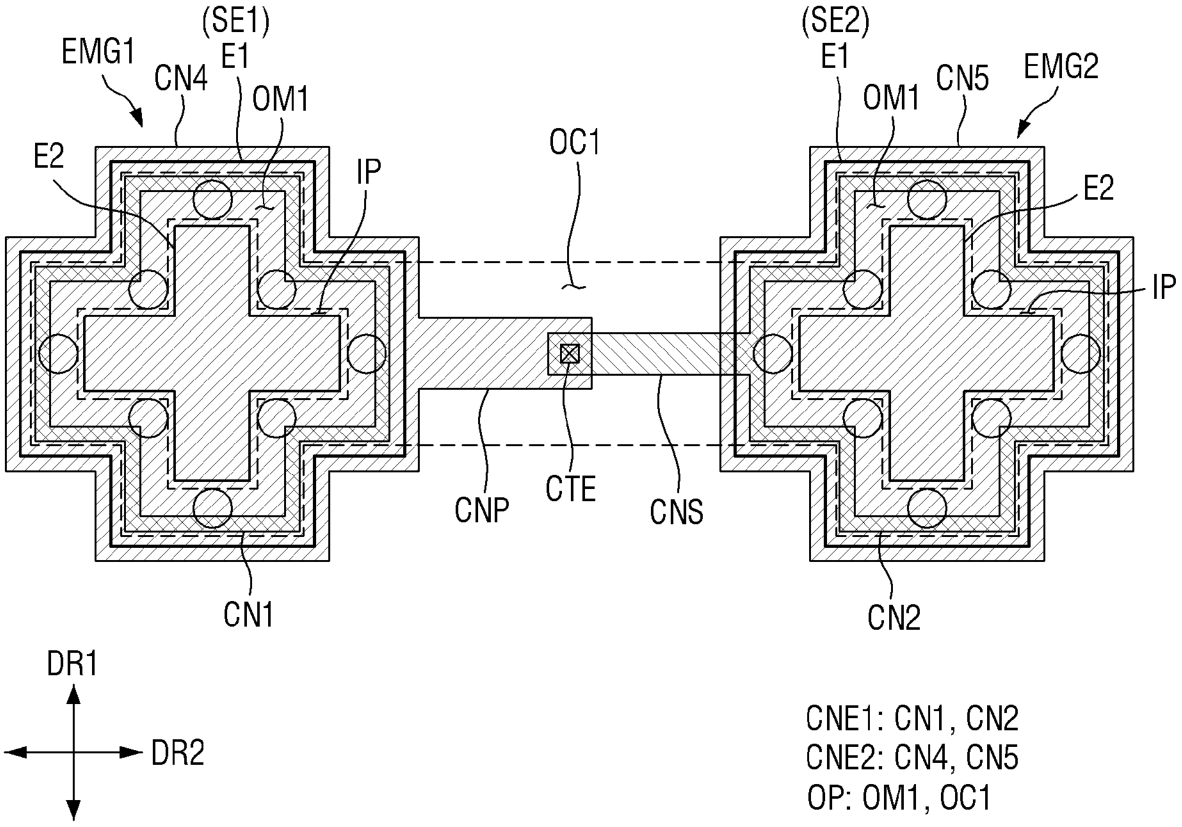
FIG. 26 is a plan view illustrating the relative arrangement of some emission groups and connection electrodes in the display device of FIG. 25.

FIG. 25 is a plan view illustrating the relative arrangement of electrodes E1 and E2, an opening OP, and light emitting elements ED in a pixel PX of a display device 10_5 according to an embodiment. FIG. 26 is a plan view illustrating the relative arrangement of some emission groups EMG and connection electrodes CNE in the display device 10_5 of FIG. 25. Like FIG. 23, FIG. 25 illustrates planar shapes of the electrodes E1 and E2 and the light emitting elements ED of each emission group EMG and a planar shape of the opening OP. Like FIG. 24, FIG. 26 illustrates the arrangement of the connection electrodes CNE disposed between the light emitting elements ED of different emission groups EMG.

Referring to FIGS. 25 and 26, in the display device 10_5 according to the embodiment, each of the electrodes E1 and E2 may protrude from the center to both sides in the first direction DR1 and the second direction DR2. Each of the electrodes E1 and E2 may have a cross (+) shape in a plan view, and the light emitting elements ED of each emission group EMG may surround the outside of a second electrode E2 and may be disposed on a first electrode E1. One first electrode E1, one second electrode E2, and multiple light emitting elements ED may form one emission group EMG, and multiple emission groups EMG including the cross-shaped electrodes E1 and E2 may be disposed in each pixel PX. In the embodiment of FIG. 23, five emission groups EMG are disposed.

A first emission group EMG1 may be disposed on an upper left side of each pixel PX, and a second emission group EMG2 may be spaced apart from the first emission group EMG1 in the second direction DR2 and may be disposed on an upper right side of each pixel PX. A third emission group EMG3 may be disposed at the center of each pixel PX, and a fourth emission group EMG4 and a fifth emission group EMG5 may be spaced apart from the first emission group EMG1 and the second emission group EMG2 in the first direction DR1, respectively. In the display device 10_5 according to the embodiment, since the first and second electrodes E1 and E2 have a cross shape, the arrangement of the opening OP of a first insulating layer PAS1 and the connection electrodes CNE may be designed such that the light emitting elements ED surround sides of each second electrode E2.

For example, the first insulating layer PAS1 may include the opening OP exposing a part of an upper surface of each first electrode E1 and an area between the first electrodes E1 spaced apart from each other. The opening OP may include multiple first main holes OM1, each surrounding outer sides of the second electrode E2 and having a cross shape to expose a part of the upper surface of the first electrode E1, and multiple hole connection parts OC1 and OC2 electrically connecting different first main holes OM1. The first main holes OM1 and the hole connection parts OC1 and OC2 electrically connecting them may be substantially integrated with each other to form one opening OP.

The first main holes OM1 may surround the outer sides of the second electrodes E2 to correspond to the shapes of the first electrodes E1 and the second electrodes E2. The first main holes OM1 may overlap the first electrodes E1, respectively, and may be spaced apart from each other. The first insulating layer PAS1 may include an insulating pattern part IP located in a part surrounded by each of the first main holes OM1, and each insulating pattern part IP may be disposed between the first and second electrodes E1 and E2. Like the second electrodes E2, the insulating pattern parts IP may have a cross shape in a plan view. The light emitting elements ED may be disposed in each of the first main holes OM1 to surround the sides of the second electrode E2 and may be in contact with sidewalls of the insulating pattern part IP.

First hole connection parts OC1 may electrically connect the first main holes OM1 spaced apart from each other in the second direction DR2. Any one first hole connection part OC1 may electrically connect the first main holes OM1 disposed on the first electrodes E1 of the first emission group EMG1 and the second emission group EMG2, and the other first hole connection part OC1 may electrically connect the first main holes OM1 disposed on the first electrodes E1 of the fourth emission group EMG4 and the fifth emission group EMG5. The first hole connection parts OC1 may extend in the second direction DR2.

Second hole connection parts OC2 may electrically connect a first main hole OM1 located at the center of each pixel PX and some of the other first main holes OM1. Any one second hole connection part OC2 may electrically connect the first main holes OM1 disposed on the first electrodes E1 of the second emission group EMG2 and the third emission group EMG3, and the other second hole connection part OC2 may electrically connect the first main holes OM1 disposed on the first electrodes E1 of the third emission group EMG3 and the fourth emission group EMG4. The second hole connection parts OC2 may extend in the second direction DR2 and then may be bent in the first direction DR1.

The light emitting elements ED of the emission groups EMG spaced apart from each other may be electrically connected to each other because a first connection electrode CNE1 and a second connection electrode CNE2 contact each other. The first connection electrode CNE1 and the second connection electrode CNE2 electrically connected to different emission groups EMG may contact each other through a second contact hole CTE formed in a hole connection part OC1 or OC2.

For example, the light emitting elements ED of the first emission group EMG1 may have first ends in contact with a first electrode part CN1 and second ends in contact with a fourth electrode part CN4. The first electrode part CN1 may have a width and may extend along outer sides of the first electrode E1. For example, the first electrode part CN1 may surround the outer sides of the second electrode E2 and may have a shape similar to that of the first main hole OM1 in a plan view. The fourth electrode part CN4 may have a cross shape similar to that of the first electrode E1 in a plan view and may be shaped to cover the second electrode E2 and the light emitting elements ED.

The light emitting elements ED of the second emission group EMG2 may have first ends in contact with a second electrode part CN2 and second ends in contact with a fifth electrode part CN5. The second electrode part CN2 may have a shape similar to that of the first electrode part CN1, and the fifth electrode part CN5 may have a shape similar to that of the fourth electrode part CN4.

The first electrodes E1 of the first emission group EMG1 and the second emission group EMG2 may partially overlap a first hole connection part OC1 of the opening OP, and the second contact hole CTE may be formed in the first hole connection part OC1. The fourth electrode part CN4 may include an electrode extension part CNP extending in the second direction DR2 in the first hole connection part OC1, and the second electrode part CN2 may include an electrode protrusion part CNS extending in the second direction DR2 in the first hole connection part OC1. The electrode extension part CNP of the fourth electrode part CN4 may contact the electrode protrusion part CNS of the second electrode part CN2 through the second contact hole CTE, and the light emitting elements ED of the first emission group EMG1 may be electrically connected to the light emitting elements ED of the second emission group EMG2. Although not illustrated in the drawings, the electrical connection between the light emitting elements ED of different emission groups EMG is the same as that described above with reference to other drawings and FIG. 26, and thus a detailed description thereof will be omitted.

Figure 27:
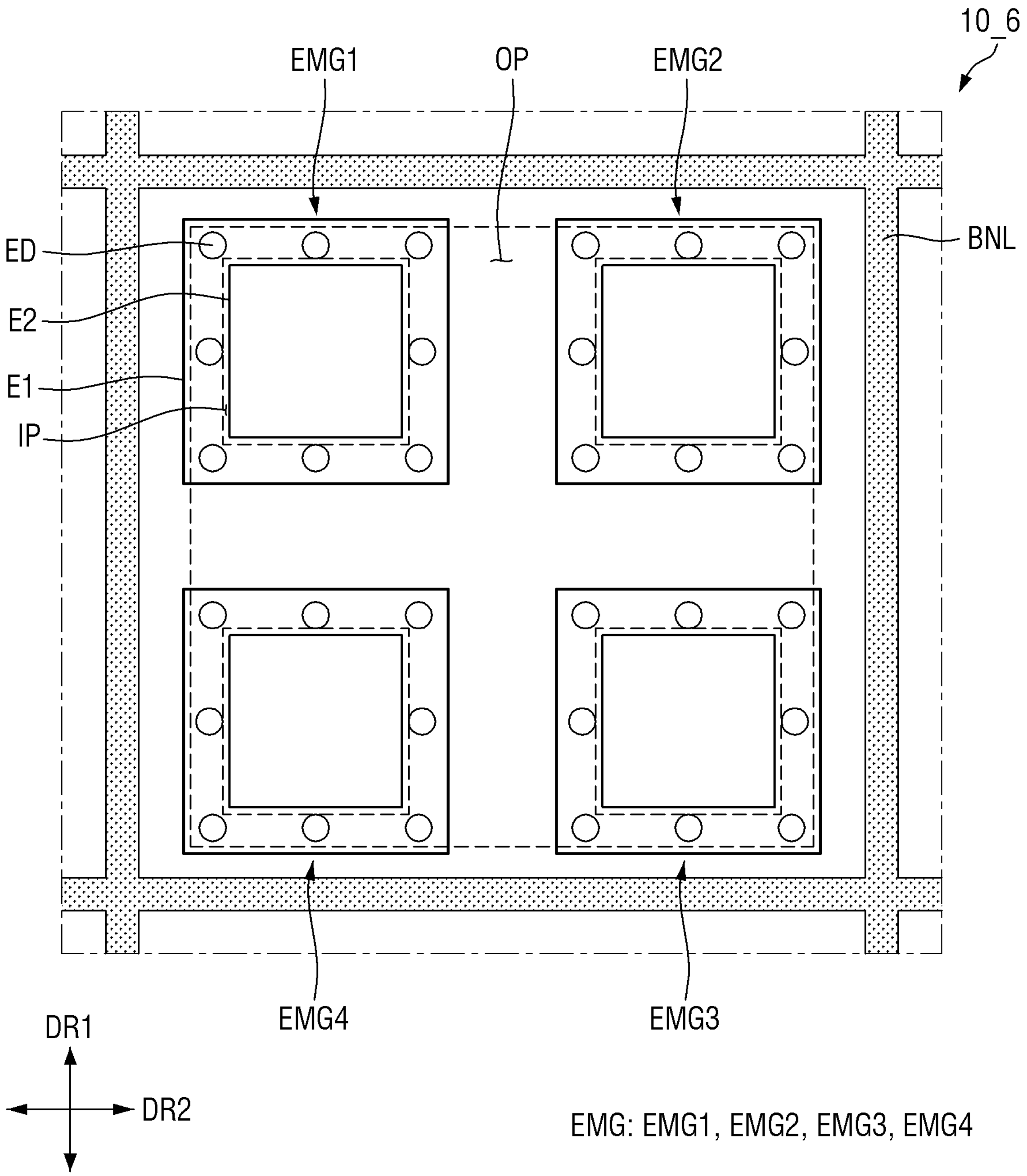
FIG. 27 is a plan view illustrating the relative arrangement of electrodes, an opening, and light emitting elements in a pixel of a display device according to an embodiment.
Figure 28:
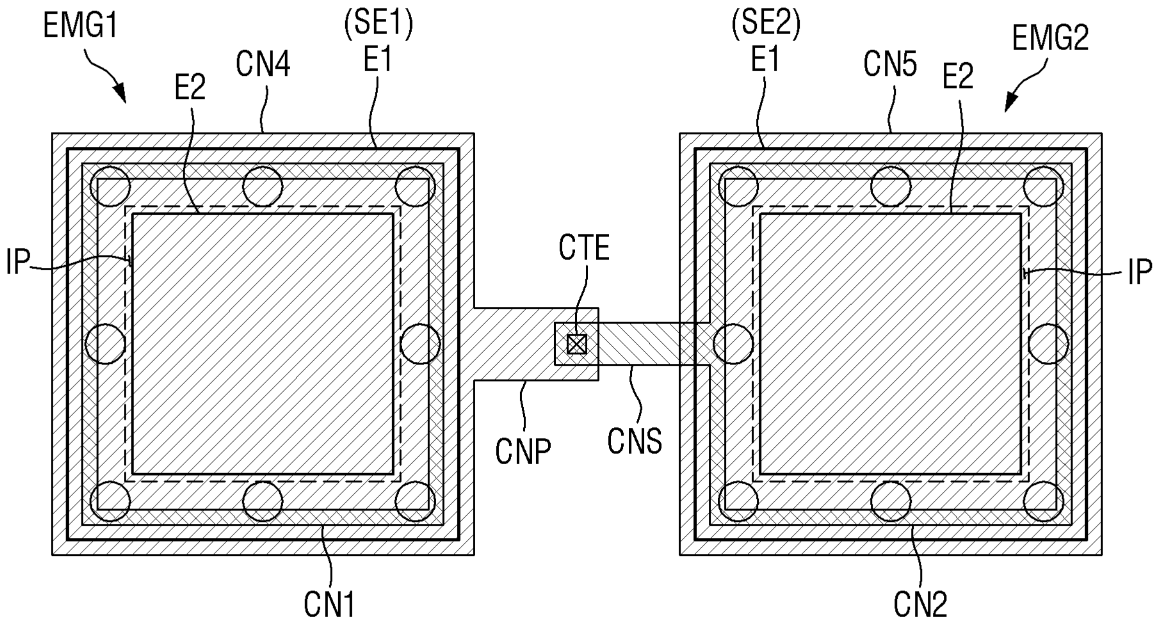
FIG. 28 is a plan view illustrating the relative arrangement of some emission groups and connection electrodes in the display device of FIG. 27.
Figure 28:
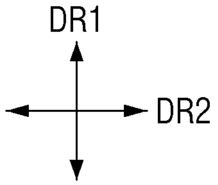

FIG. 27 is a plan view illustrating the relative arrangement of electrodes E1 and E2, an opening OP, and light emitting elements ED in a pixel PX of a display device 10_6 according to an embodiment. FIG. 28 is a plan view illustrating the relative arrangement of some emission groups EMG and connection electrodes CNE in the display device 10_6 of FIG. 27. Like FIG. 23, FIG. 27 illustrates planar shapes of the electrodes E1 and E2 and the light emitting elements ED of each emission group EMG and a planar shape of the opening OP. Like FIG. 24, FIG. 28 illustrates the arrangement of the connection electrodes CNE disposed between the light emitting elements ED of different emission groups EMG.

Referring to FIGS. 27 and 28, in the display device 10_6 according to the embodiment, each of the electrodes E1 and E2 may have a quadrangular shape including sides extending in the first direction DR1 and the second direction DR2. The light emitting elements ED of each emission group EMG may surround the outside of a second electrode E2 and may be disposed on a first electrode E1. One first electrode E1, one second electrode E2, and multiple light emitting elements ED may form one emission group EMG, and multiple emission groups EMG including the quadrangular electrodes E1 and E2 may be disposed in each pixel PX. The current embodiment is substantially similar to the embodiment of FIG. 2 in the shapes of the electrodes E1 and E2 but is different in the shape of the opening OP so that the light emitting elements ED can surround each second electrode E2. In the embodiment of FIG. 25, four emission groups EMG are disposed.

A first emission group EMG1 may be disposed on an upper left side of each pixel PX, and a second emission group EMG2 may be spaced apart from the first emission group EMG1 in the second direction DR2 and may be disposed on an upper right side of each pixel PX. A third emission group EMG3 and a fourth emission group EMG4 may be spaced apart from the second emission group EMG2 and the first emission group EMG1 in the first direction DR1, respectively. In the display device 10_6 according to the embodiment, the opening OP may be formed to surround sides of each second electrode E2 as in the embodiment of FIG. 25, and each insulating pattern part IP may be disposed between the first and second electrodes E1 and E2. The arrangement of the opening OP of a first insulating layer PAS1 and the connection electrodes CNE may be designed such that the light emitting elements ED surround the sides of each second electrode E2.

For example, the first insulating layer PAS1 may include the opening OP exposing a part of an upper surface of each first electrode E1 and an area between the first electrodes E1 spaced apart from each other. The opening OP may be formed to surround outer sides of each second electrode E2, and the first insulating layer PAS1 may include the insulating pattern parts IP, each being surrounded by the opening OP and disposed between the first and second electrodes E1 and E2. Like the second electrodes E2, the insulating pattern parts IP may have a quadrangular shape in a plan view and may be spaced apart from each other. The light emitting elements ED may be disposed in the opening OP to surround the sides of each second electrode E2 and may be in contact with sidewalls of each insulating pattern part IP.

The light emitting elements ED of the emission groups EMG spaced apart from each other may be electrically connected to each other because a first connection electrode CNE1 and a second connection electrode CNE2 contact each other. The first connection electrode CNE1 and the second connection electrode CNE2 electrically connected to different emission groups EMG may contact each other through a second contact hole CTE formed in the opening OP.

For example, the light emitting elements ED of the first emission group EMG1 may have first ends in contact with a first electrode part CN1 and second ends in contact with a fourth electrode part CN4. The first electrode part CN1 may have a width and may extend along outer sides of the first electrode E1. For example, the first electrode part CN1 may surround the outer sides of the second electrode E2 and may be shaped like an angled closed curve in a plan view. The fourth electrode part CN4 may have a quadrangular shape similar to that of the first electrode E1 in a plan view and may be shaped to cover the second electrode E2 and the light emitting elements ED.

The light emitting elements ED of the second emission group EMG2 may have first ends in contact with a second electrode part CN2 and second ends in contact with a fifth electrode part CN5. The second electrode part CN2 may have a shape similar to that of the first electrode part CN1, and the fifth electrode part CN5 may have a shape similar to that of the fourth electrode part CN4.

The second contact hole CTE may be formed in the opening OP between the first emission group EMG1 and the second emission group EMG2. The fourth electrode part CN4 may include an electrode extension part CNP extending in the second direction DR2, and the second electrode part CN2 may include an electrode protrusion part CNS extending in the second direction DR2. The electrode extension part CNP of the fourth electrode part CN4 may contact the electrode protrusion part CNS of the second electrode part CN2 through the second contact hole CTE, and the light emitting elements ED of the first emission group EMG1 may be electrically connected to the light emitting elements ED of the second emission group EMG2. Although not illustrated in the drawings, the electrical connection between the light emitting elements ED of different emission groups EMG is the same as that described above with reference to other drawings, and thus a detailed description thereof will be omitted.

In a display device according to an embodiment, since light emitting elements extending in a direction are disposed upright in each pixel, a large number of light emitting elements may be disposed per unit area. In the display device, the light output direction of the light emitting elements may be perpendicular to an upper surface of the substrate. Therefore, light output efficiency may be improved, and the luminance of each pixel can be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:

a plurality of first electrodes comprising a first sub-electrode and a second sub-electrode spaced apart from each other on a substrate;

a first insulating layer disposed on the substrate and comprising openings partially exposing upper surfaces of the plurality of first electrodes;

a plurality of second electrodes disposed on the first insulating layer and overlapping the plurality of first electrodes in a plan view;

a plurality of light emitting elements disposed on the plurality of first electrodes in the openings, and comprising first light emitting elements and second light emitting elements;

a plurality of first connection electrodes disposed in the openings to contact first ends of the plurality of light emitting elements and the plurality of first electrodes;

a second insulating layer disposed in the openings to surround the plurality of light emitting elements; and a plurality of second connection electrodes disposed on the plurality of second electrodes and the second insulating layer to contact the plurality of second electrodes and second ends of the plurality of light emitting elements, wherein the plurality of first connection electrodes comprise:

a first electrode part contacting the first light emitting elements disposed on the first sub-electrode; and a second electrode part contacting the second light emitting elements disposed on the second sub-electrode, and the plurality of second connection electrodes comprise:

a third electrode part contacting the first light emitting elements and the second electrode part through a first contact hole penetrating the second insulating layer; and a fourth electrode part contacting the second light emitting elements.

2. The display device of claim 1, wherein the openings comprise a first opening partially overlapping the first sub-electrode and the second sub-electrode in a plan view, and the first contact hole is disposed in the first opening.

3. The display device of claim 2, wherein the openings further comprise:

a second opening spaced apart from the first opening and partially overlapping the first sub-electrode in a plan view; and a third opening spaced apart from the first opening and partially overlapping the second sub-electrode in a plan view, wherein part of the first light emitting elements are disposed in the first opening and other part of the first light emitting elements are disposed in the second opening, and part of the second light emitting elements are disposed in the first opening and other part of the second light emitting elements are disposed in the third opening.

4. The display device of claim 3, wherein the plurality of first connection electrodes further comprise a plurality of fifth electrode parts, and part of the plurality of fifth electrode parts are disposed in the second opening and other part of the plurality of fifth electrode parts are disposed in the third opening to contact the first ends of the plurality of light emitting elements.

5. The display device of claim 2, wherein the first electrode part is disposed on the first sub-electrode in the first opening, the second electrode part is disposed on the second sub-electrode in the first opening, a width of the second electrode part is greater than a width of the first electrode part, and a part of the second electrode part is disposed in an area between the first sub-electrode and the second sub-electrode.

6. The display device of claim 2, wherein the plurality of first electrode part and the plurality of second electrode are spaced apart from each other under the second insulating layer, and the third electrode part and the fourth electrode part are spaced part from each other on the second insulating layer.

7. The display device of claim 3, wherein the first insulating layer is located between the first opening and the second opening and between the first opening and the third opening, the first insulating layer comprises a plurality of insulating pattern parts, and the plurality of insulating pattern parts are disposed between the plurality of first electrodes and the plurality of second electrodes.

8. The display device of claim 7, wherein the plurality of light emitting elements extend in one direction, and side surfaces of the plurality of light emitting elements are in contact with side surfaces of the plurality of insulating pattern parts.

9. The display device of claim 8, wherein each of the plurality of light emitting elements comprises:

a first semiconductor layer;

a second semiconductor layer disposed on the first semiconductor layer;

a light emitting layer disposed between the first semiconductor layer and the second semiconductor layer; and an insulating film surrounding an outer surface of at least the light emitting layer, and a length of each of the plurality of light emitting elements is greater than a length of the insulating film.

10. The display device of claim 8, wherein a length of each of the plurality of light emitting elements is smaller than a thickness of the first insulating layer, and the length of each of the plurality of light emitting elements is greater than a thickness of the second insulating layer.

11. The display device of claim 1, further comprising:

a via layer disposed between the substrate and the plurality of first electrodes;

a conductive pattern; and a voltage line, wherein the conductive pattern and the voltage line are disposed between the via layer and the substrate, the first sub-electrode contacts the conductive pattern through a second contact hole penetrating the via layer, and the fourth electrode part contacts the voltage line through a third contact hole penetrating the via layer.

12. The display device of claim 11, further comprising:

a bank layer disposed on the first insulating layer and surrounding the plurality of light emitting elements, wherein the second contact hole and the third contact hole are disposed outside of the bank layer.

13. The display device of claim 12, wherein a part of the fourth electrode part is disposed on the bank layer.

14. A display device comprising:

a plurality of pixels arranged in a first direction and a second direction intersecting the first direction;

a plurality of first electrodes comprising a plurality of sub-electrodes spaced apart from each other in each of the plurality of pixels;

a first insulating layer comprising a plurality of openings partially overlapping the plurality of first electrodes in a plan view;

a plurality of second electrodes disposed on the first insulating layer to overlap the plurality of first electrodes in a plan view;

a plurality of light emitting elements disposed in the plurality of openings and disposed along at least one side of each of the plurality of second electrodes, and comprising first light emitting elements and second light emitting elements;

a plurality of first connection electrodes, each of the plurality of first connection electrodes being partially disposed on each of the plurality of first electrodes in each of the plurality of openings and contacting each of the plurality of light emitting elements; and a plurality of second connection electrodes disposed on the plurality of second electrodes and covering some of the plurality of light emitting elements, wherein the plurality of openings comprise a first opening partially overlapping the plurality of first electrodes in a plan view, the plurality of first connection electrodes comprise:

a first electrode part disposed on a first sub-electrode in the first opening; and a second electrode part disposed on a second sub-electrode in the first opening, the second connection electrodes comprise:

a third electrode part covering the plurality of second electrode disposed on the first sub-electrode and the first light emitting elements; and a fourth electrode part covering the plurality of second electrode disposed on the second sub-electrode and the second light emitting elements, and the third electrode part and the second electrode part contact each other in the first opening.

15. The display device of claim 14, wherein the plurality of openings further comprise:

a second opening spaced apart from the first opening, the plurality of second electrode being disposed between the first opening and the second opening; and a third opening spaced apart from the first opening, the plurality of second electrode being disposed between the first opening and the third opening, wherein the first light emitting elements are disposed in the first opening and the second opening, and the second light emitting elements are disposed in the first opening and the third opening.

16. The display device of claim 15, wherein the first opening, the second opening, and the third opening extend in the first direction, a width of the first opening measured in the second direction is greater than a width of the second opening in the second direction and a width of the third opening in the second direction, the first light emitting elements are disposed adjacent to a side of the plurality of second electrode, and the second light emitting elements are disposed adjacent to another side of the plurality of second electrodes.

17. The display device of claim 16, wherein a distance between the plurality of first electrodes is smaller than a distance between the plurality of second electrodes.

18. The display device of claim 14, wherein each of the plurality of first electrodes and the plurality of second electrodes extends in a diagonal direction between the first direction and the second direction, and the plurality of light emitting elements are arranged in the diagonal direction.

19. The display device of claim 14, wherein each of the plurality of first electrodes and the plurality of second electrodes protrudes from a center to both sides in the first direction and to both sides in the second direction, the plurality of openings comprise main holes surrounding the plurality of second electrodes and hole connection parts connecting the main holes, and the third electrode part and the second electrode part partially overlap each other in a plan view in the hole connection parts.

20. The display device of claim 14, wherein each of the plurality of first electrodes and the plurality of second electrodes comprises sides extending in the first direction and the second direction, the plurality of openings surround the plurality of second electrodes, and the plurality of light emitting elements surround the sides of each of the plurality of second electrodes.

* * * * *